US012387873B2

(12) United States Patent
Tanaka et al.

(10) Patent No.: US 12,387,873 B2
(45) Date of Patent: Aug. 12, 2025

(54) ELECTRONIC COMPONENT AND ELECTRONIC COMPONENT MODULE

(71) Applicant: ROHM CO., LTD., Kyoto (JP)

(72) Inventors: Taketoshi Tanaka, Kyoto (JP); Kosei Osada, Kyoto (JP); Masahiko Arimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/419,624

(22) Filed: Jan. 23, 2024

(65) Prior Publication Data

US 2024/0161972 A1    May 16, 2024

Related U.S. Application Data

(63) Continuation of application No. 18/062,407, filed on Dec. 6, 2022, now Pat. No. 11,923,128, which is a
(Continued)

(30) Foreign Application Priority Data

Oct. 13, 2017   (JP) ................. 2017-199877

(51) Int. Cl.
*H01F 27/28*   (2006.01)
*H01F 27/29*   (2006.01)
(Continued)

(52) U.S. Cl.
CPC ......... *H01F 27/40* (2013.01); *H01F 27/2804* (2013.01); *H01F 27/29* (2013.01);
(Continued)

(58) Field of Classification Search
CPC ..... H01F 2027/2809; H01F 2027/2819; H01F 27/2804; H01F 27/2885; H01F 27/29;
(Continued)

(56) References Cited

U.S. PATENT DOCUMENTS

| 11,557,422 B2 | 1/2023 | Osada |
| 2006/0263727 A1 | 11/2006 | Lee et al. |

(Continued)

FOREIGN PATENT DOCUMENTS

| CN | 1866518 A | 11/2006 |
| CN | 103137600 A | 6/2013 |

(Continued)

OTHER PUBLICATIONS

Notice of reasons for refusal mailed Apr. 18, 2024, in Japanese Application No. 2023-013538, 9 pages. (with English Translation).
(Continued)

*Primary Examiner* — Timothy J Thompson
*Assistant Examiner* — Guillermo J Egoavil
(74) *Attorney, Agent, or Firm* — XSENSUS LLP

(57) ABSTRACT

An electronic component includes an insulating layer, a low voltage conductor pattern formed inside the insulating layer, a high voltage conductor pattern formed inside the insulating layer such as to face the low voltage conductor pattern in an up/down direction, and a withstand voltage enhancement structure of conductive property formed inside the insulating layer and along the high voltage conductor pattern such as to protrude further outside than the low voltage conductor pattern in plan view.

10 Claims, 33 Drawing Sheets

Related U.S. Application Data continuation of application No. 16/755,053, filed as application No. PCT/JP2018/038365 on Oct. 15, 2018, now Pat. No. 11,545,299.

(51) Int. Cl.
   *H01F 27/40* (2006.01)
   *H01G 4/005* (2006.01)
   *H01G 4/30* (2006.01)

(52) U.S. Cl.
   CPC ............ *H01G 4/005* (2013.01); *H01G 4/30* (2013.01); *H01F 2027/2809* (2013.01)

(58) Field of Classification Search
   CPC ........ H01F 27/40; H01F 27/28; H01F 27/288; H01G 4/005; H01G 4/30; H01G 4/33; H01G 4/40; H01L 27/0617; H01L 2224/04042; H01L 2224/05554; H01L 2224/05567; H01L 2224/06135; H01L 2224/48137; H01L 2224/48195; H01L 2224/48247; H01L 2224/49113; H01L 2224/49175; H01L 23/3107; H01L 23/49575; H01L 23/5225; H01L 23/5227; H01L 23/585; H01L 23/645; H01L 2924/10253; H01L 2924/10272; H01L 2924/13091; H01L 2924/14; H01L 2924/19041; H01L 2924/19042; H01L 2924/19104
   USPC .......................................... 361/270; 257/531
   See application file for complete search history.

(56) References Cited

U.S. PATENT DOCUMENTS

| | | |
|---|---|---|
| 2011/0095392 A1 | 4/2011 | Wahl et al. |
| 2013/0075861 A1 | 3/2013 | Kerber et al. |
| 2013/0135076 A1 | 5/2013 | Nagase |
| 2014/0061643 A1 | 3/2014 | Kaeriyama |
| 2015/0137314 A1* | 5/2015 | Osada ................ H01L 23/5225 257/531 |
| 2015/0255551 A1 | 9/2015 | Kerber et al. |
| 2017/0117084 A1 | 4/2017 | Murphy et al. |
| 2017/0278811 A1 | 9/2017 | Suga et al. |
| 2017/0287624 A1 | 10/2017 | Osada et al. |
| 2018/0130587 A1 | 5/2018 | Tanaka et al. |
| 2018/0138272 A1 | 5/2018 | Ebihara et al. |

FOREIGN PATENT DOCUMENTS

| | | |
|---|---|---|
| CN | 104253102 A | 12/2014 |
| CN | 104603940 A | 5/2015 |
| CN | 106716622 A | 5/2017 |
| JP | S54-110424 A | 8/1979 |
| JP | 2013-115131 A | 6/2013 |
| JP | 2013-149940 A | 8/2013 |
| JP | 2016-028407 A | 2/2016 |
| JP | 5889501 B1 | 3/2016 |
| JP | 2017-073475 A | 4/2017 |
| WO | 2016/080034 A1 | 5/2016 |

OTHER PUBLICATIONS

International Search Report and Written Opinion issued for International Patent Application No. PCT/JP2018/038365, Date of mailing: Jan. 8, 2019, 9 pages.

International Preliminary Report on Patentability issued for International Patent Application No. PCT/JP2018/038365, Date of mailing: Apr. 23, 2020, 18 pages.

Office Action issued for Japanese Patent Application No. 2019-547554, Dispatch Date: Dec. 10, 2020, 23 pages.

Office Action issued for Chinese Patent Application No. 201880066828.3, dated Apr. 6, 2021, 19 pages.

Second Office Action issued for Chinese Patent Application No. 201880066828.3, dated Nov. 10, 2021, 27 pages.

Notice of Reasons for Refusal issued for Japanese Patent Application No. 2021-087737, Dispatch Date: Aug. 18, 2022, 7 pages.

Decision of Refusal issued for Chinese Patent Application No. 201880066828.3, dated Sep. 22, 2022, 12 pages.

Fourth Office Action issued for Chinese Patent Application No. 201880066828.3, dated Feb. 15, 2023, 6 pages.

Office Action mailed Apr. 29, 2024, in respect of the corresponding German patent application No. 112018004478.5, 27 pages. (With English Translation).

First Office Action dated Nov. 29, 2024 in corresponding Chinese divisional patent application No. 202310022211.4 (16 pages; with English machine translation).

\* cited by examiner

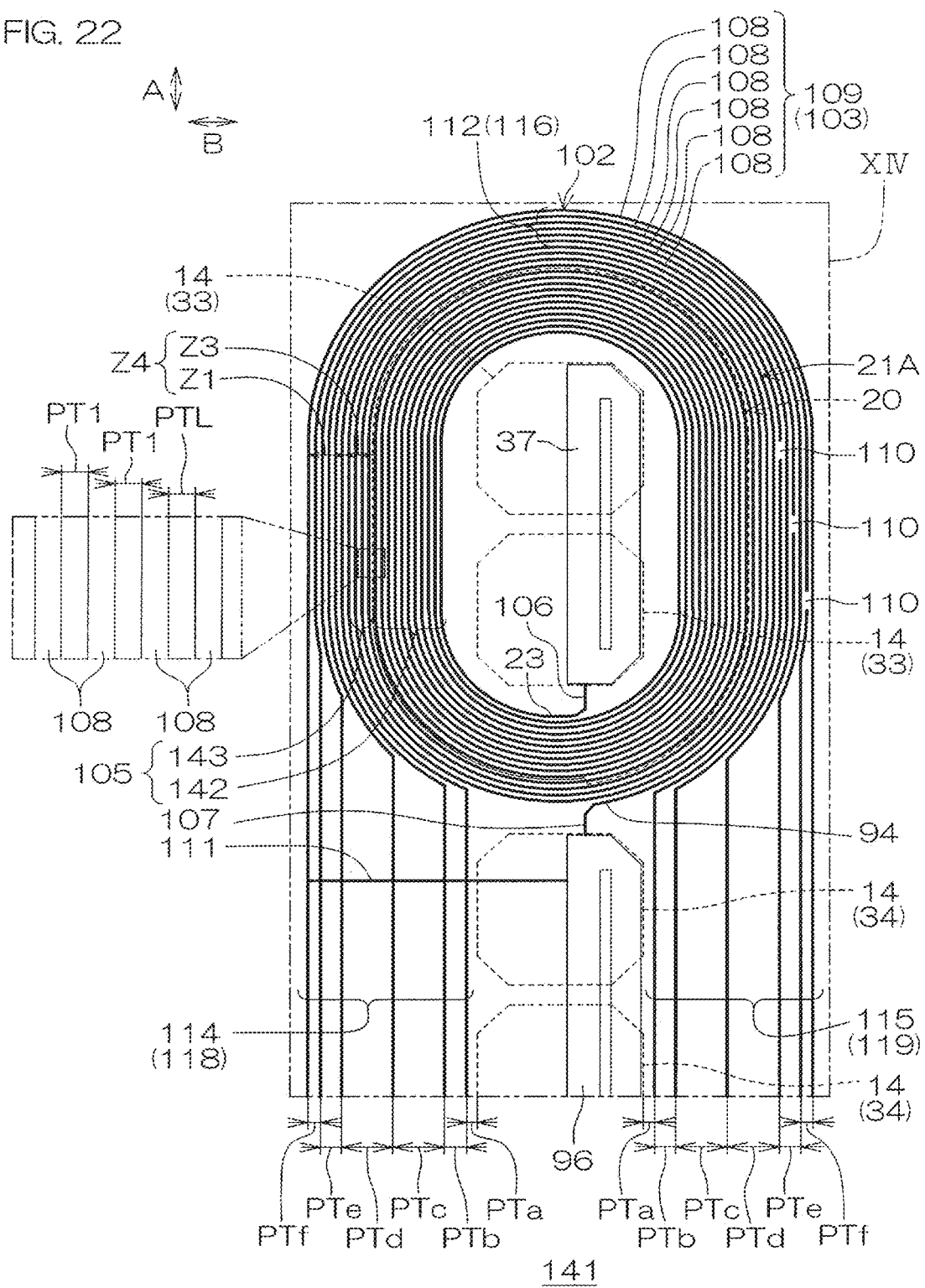

FIG. 23  Number of turns of lower coil : 13
Number of turns of upper coil : 15(=13+2)
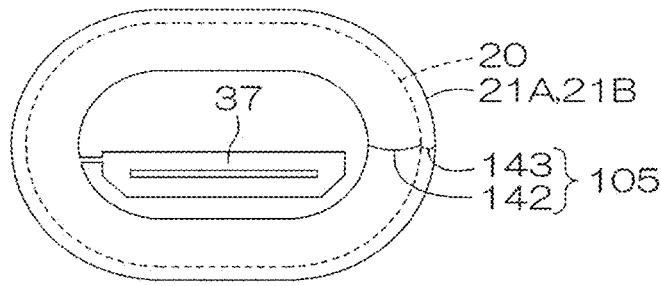
FIG. 24  Number of turns of lower coil : 10
Number of turns of upper coil : 15(=10+5)
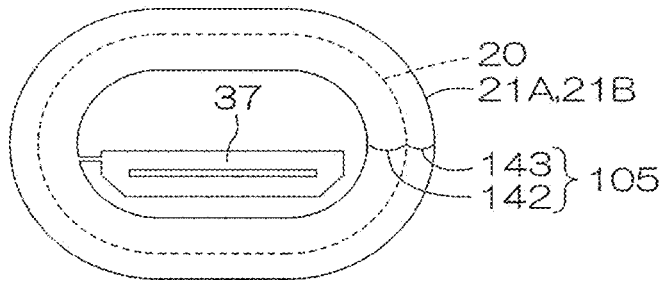
FIG. 25  Number of turns of lower coil : 7
Number of turns of upper coil : 15(=7+8)
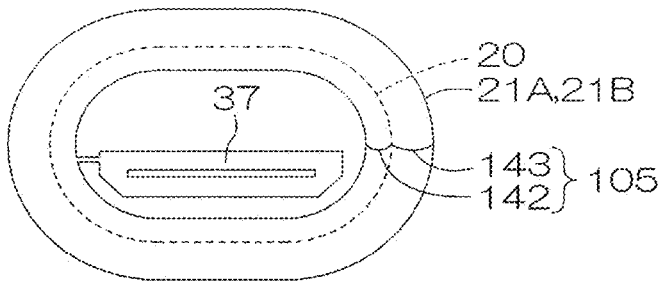

ELECTRONIC COMPONENT AND ELECTRONIC COMPONENT MODULE

CROSS-REFERENCE TO RELATED APPLICATIONS

The present application is a continuation of U.S. patent application Ser. No. 18/062,407, filed Dec. 6, 2022, which is a continuation of U.S. patent application Ser. No. 16/755,053, filed Apr. 9, 2020 (now U.S. Pat. No. 11,545,299), which is based on PCT filing PCT/JP2018/038365, filed Oct. 15, 2018, which claims priority to JP 2017-199877, filed Oct. 13, 2017, the entire contents of each are incorporated herein by reference.

TECHNICAL FIELD

The present invention relates to an electronic component and an electronic component module.

BACKGROUND ART

For example, in the field of power electronics, development of transformers having a pair of coils that are arranged to face each other is progressing. Patent Literature 1 discloses a transformer having a pair of inductors. One of the inductors is arranged to face the other inductor upon being rotated by 180° with a central axis as a rotational axis.

CITATION LIST

Patent Literature

Patent Literature 1: Japanese Patent Application Publication No. 2013-115131

SUMMARY OF INVENTION

Technical Problem

With an electronic component that includes a low voltage conductor pattern and a high voltage conductor pattern that face each other across an insulating layer, an electric field is formed in a region between the low voltage conductor pattern and the high voltage conductor pattern. The electric field tends to concentrate at the high voltage conductor pattern side. Occurrence of such concentration of electric field can be a detriment in terms of improving withstand voltage.

A preferred embodiment of the present invention thus provides an electronic component and an electronic component module with which concentration of electric field on a high voltage conductor pattern is relaxed to enable improvement of withstand voltage.

Solution to Problem

A preferred embodiment of the present invention provides an electronic component that includes an insulating layer, a low voltage conductor pattern formed inside the insulating layer, a high voltage conductor pattern formed inside the insulating layer such as to face the low voltage conductor pattern in an up/down direction, and a withstand voltage enhancement structure of conductive property formed inside the insulating layer and along the high voltage conductor pattern such as to protrude further outside than the low voltage conductor pattern in plan view.

According to the present electronic component, concentration of electric field on the high voltage conductor pattern can be relaxed by the withstand voltage enhancement structure of conductive property. An electronic component that enables improvement of withstand voltage can thereby be provided.

A preferred embodiment of the present invention provides an electronic component that includes an insulating layer, a low voltage conductor pattern formed inside the insulating layer, a high voltage conductor pattern formed inside the insulating layer such as to face the low voltage conductor pattern in an up/down direction, a low voltage pad formed on the insulating layer and electrically connected to the low voltage conductor pattern, a high voltage pad formed on the insulating layer at an interval from the low voltage pad in plan view and electrically connected to the high voltage conductor pattern, and a pad side withstand voltage enhancement structure of conductive property formed inside the insulating layer along a peripheral edge of the high voltage pad in plan view.

According to the present electronic component, concentration of electric field on the high voltage pad can be relaxed by the pad side withstand voltage enhancement structure of conductive property. An electronic component that enables improvement of withstand voltage can thereby be provided.

A preferred embodiment of the present invention provides an electronic component that includes a first insulating layer having a first dielectric breakdown strength, a low voltage conductor pattern formed inside the first insulating layer, a high voltage conductor pattern formed inside the first insulating layer such as to face the low voltage conductor pattern in an up/down direction, a low voltage wiring formed inside the first insulating layer at an interval from the high voltage conductor pattern in a direction along a front surface of the first insulating layer, electrically connected to the low voltage conductor pattern, and forming an electric field having a first value not more than the first dielectric breakdown strength between the high voltage conductor pattern and the low voltage wiring, an electric field enhancement structure of conductive property interposed in a region between the high voltage conductor pattern and the low voltage wiring inside the first insulating layer, and forming an electric field having a second value not more than the first dielectric breakdown strength and not less than the first value between the low voltage wiring and the electric field enhancement structure, and a second insulating layer formed on the first insulating layer and having a second dielectric breakdown strength not more than the first dielectric breakdown strength.

A case where the electric field enhancement structure is not formed shall now be considered. In this case, the high voltage conductor pattern is formed at a position close to the second insulating layer with respect to the low voltage conductor pattern. Therefore, an electric field concentrating on the high voltage conductor pattern is also a load for the second insulating layer. There is thus a possibility of dielectric breakdown occurring at the second insulating layer when an electric field strength at the high voltage conductor pattern exceeds the second dielectric breakdown strength of the second insulating layer.

On the other hand, with the present electronic component, the electric field enhancement structure of conductive property is formed in the region inside the first insulating layer between the high voltage conductor pattern and the low voltage wiring. Thereby, an electric field between the high voltage conductor pattern and the low voltage wiring is practically determined by a distance between the electric field enhancement structure and the low voltage wiring.

The concentration of electric field on the high voltage conductor pattern can thereby be relaxed. Moreover, an electric field that is formed between the low voltage conductor pattern and the high voltage conductor pattern can also be shielded by the electric field enhancement structure of conductive property.

Therefore, while an electric field strength at the first insulating layer having the first dielectric breakdown strength that exceeds the second dielectric breakdown strength can be increased, an electric field strength at the second insulating layer having the second dielectric breakdown strength not more than the first dielectric breakdown strength can be decreased. That is, with the electronic component, the electric field strength at the second insulating layer side of low dielectric breakdown strength can be decreased by intentionally increasing the electric field strength at the first insulating layer side of high dielectric breakdown strength.

Dielectric breakdown due to the concentration of electric field on the high voltage conductor pattern can thus be suppressed at the second insulating layer. An electronic component that enables improvement of withstand voltage can thus be provided.

The aforementioned as well as yet other objects, features, and effects of the present invention will be made clear by the following description of the preferred embodiments, with reference to the accompanying drawings.

BRIEF DESCRIPTION OF DRAWINGS

FIG. 22 is a diagram of a portion corresponding to FIG. 14 and is a diagram for describing the planar structure at a first upper coil side of an electronic component according to a fourth preferred embodiment of the present invention.

FIG. 23 is a plan view of an upper coil of a sample of the electronic component shown in FIG. 22.

FIG. 24 is a plan view of an upper coil of a sample of the electronic component shown in FIG. 22.

FIG. 25 is a plan view of an upper coil of a sample of the electronic component shown in FIG. 22.

DESCRIPTION OF EMBODIMENTS

Figure 1:
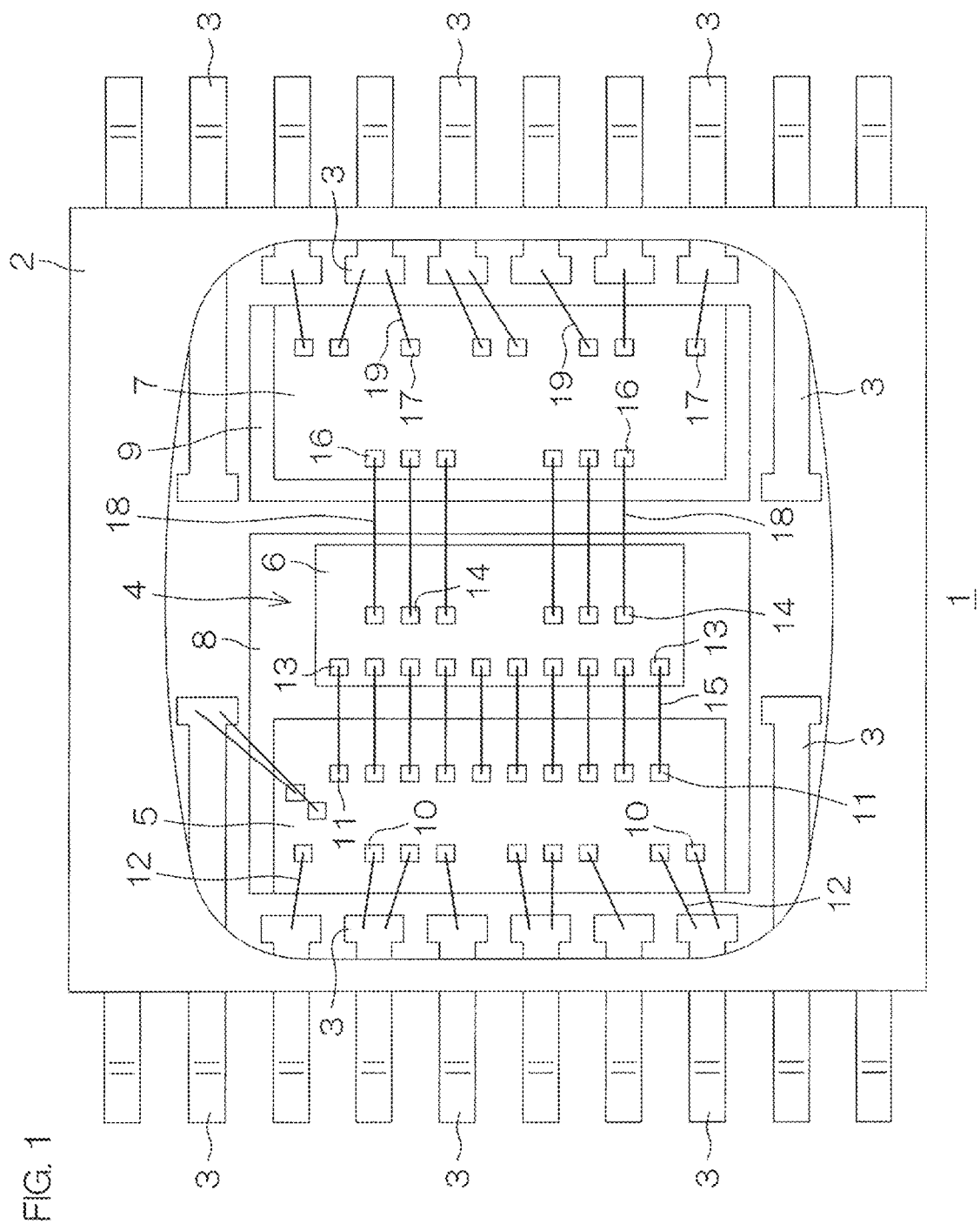
FIG. 1 is a plan view of an electronic component module in which an electronic component according to a first preferred embodiment of the present invention is incorporated.

FIG. 1 is a plan view of an electronic component module 1 in which an electronic component according to a first preferred embodiment of the present invention is incorporated. In FIG. 1, a central portion of the electronic component module 1 is shown transparently for clarification of the internal structure.

There are cases where a high voltage pad electrically connected to a high voltage coil and a low voltage pad electrically connected to a low voltage coil are arranged apart in a lateral direction on a front surface of an electronic component.

Ordinarily, a distance between the low voltage pad and the high voltage pad is set to not less than several tens of times of a distance between the high voltage coil and the low voltage coil of a transformer from a standpoint of securing a sufficient withstand voltage. Therefore, sufficient examination has not been made up to now in regard to improving the withstand voltage by using a region between the low voltage pad and the high voltage pad.

Thus, with this embodiment, an electronic component and an electronic component module that enables improvement of the withstand voltage is provided upon making note of the region between the low voltage pad and the high voltage pad.

A package type of the electronic component module 1 is SOP (small outline package). The package type of the electronic component module 1 is not restricted to SOP and any of various types, such as QFP (quad flat package), SOJ (small outline J-lead package), etc., can be adopted as the package type of the electronic component module 1.

The electronic component module 1 is a power module in which a plurality of chips are packaged in one package, and includes a resin package 2, a plurality of leads 3, and a plurality of chips 4.

The resin package 2 is formed, for example, to a quadrilateral (square) plate shape using an epoxy resin. In this embodiment, the plurality of leads 3 are provided across an interior and an exterior of the resin package 2 via a pair of mutually facing end surfaces of the resin package 2.

The plurality of chips 4 include a controller chip (controller IC) as an example of a low voltage device, an electronic component 6, and a driver chip 7 (driver IC) as an example of a high voltage device. In this embodiment, the electronic component 6 is a transformer chip that includes transformers. Each of the chips 5 to 7 is formed to a quadrilateral (rectangular) plate shape.

The size of the controller chip 5 and the size of the driver chip 7 may be substantially equal. The electronic component 6 may be smaller in size than the controller chip and the driver chip 7.

The electronic component 6 is arranged at a substantially central portion of the resin package 2. The controller chip 5 and the driver chip 7 are respectively arranged at one of the lead 3 sides and at the opposite lead 3 side with respect to the electronic component 6.

The controller chip 5 and the driver chip 7 are arranged such as to sandwich the electronic component 6 therebetween. The controller chip 5 and the driver chip 7 are each adjacent to a plurality of the leads 3.

The controller chip 5 and the electronic component 6 are arranged on a first die pad 8 in common. The driver chip 7 is arranged on a second die pad 9 arranged at an interval from the first die pad 8.

A plurality of pads 10 and a plurality of pads 11 are formed on a front surface of the controller chip 5. The plurality of pads 10 are aligned along a long side of the controller chip 5 at the side closer to the leads 3. The plurality of pads 10 are connected by bonding wires 12 to the leads 3.

The plurality of pads 11 are aligned along a long side of the controller chip 5 at the side opposite to the leads 3 (the side closer to the electronic component 6).

A plurality of low voltage pads 13 and a plurality of high voltage pads 14 are formed on a front surface of the electronic component 6. The plurality of low voltage pads 13 are aligned along a long side of the electronic component 6 at the side closer to the controller chip 5. The plurality of low voltage pads 13 are connected to the pads 11 of the controller chip 5 by bonding wires 15.

In this embodiment, the pads 11 of the controller chip 5 are connected to a primary side of the electronic component 6. The plurality of high voltage pads 14 are aligned along a long side of the electronic component 6 at a width direction central portion of the electronic component 6.

A plurality of pads 16 and a plurality of pads 17 are formed on a front surface of the driver chip 7. The plurality of pads 16 are aligned along a long side of the driver chip 7 at the side closer to the electronic component 6. The plurality of pads 16 are connected by bonding wires 18 to the high voltage pads 14 of the electronic component 6.

In this embodiment, the pads 16 of the driver chip 7 are connected to a secondary side of the electronic component 6. The plurality of pads 17 are aligned along a long side of the driver chip 7 at the opposite side from the electronic component 6 (the side closer to the leads 3). The plurality of pads 17 are connected by bonding wires 19 to the leads 3.

The positional configuration of the pads of the respective chips 5 to 7 shown in FIG. 1 is merely an example and can be changed as appropriate according to the package type and the positional configuration of the chips 4.

Figure 2:
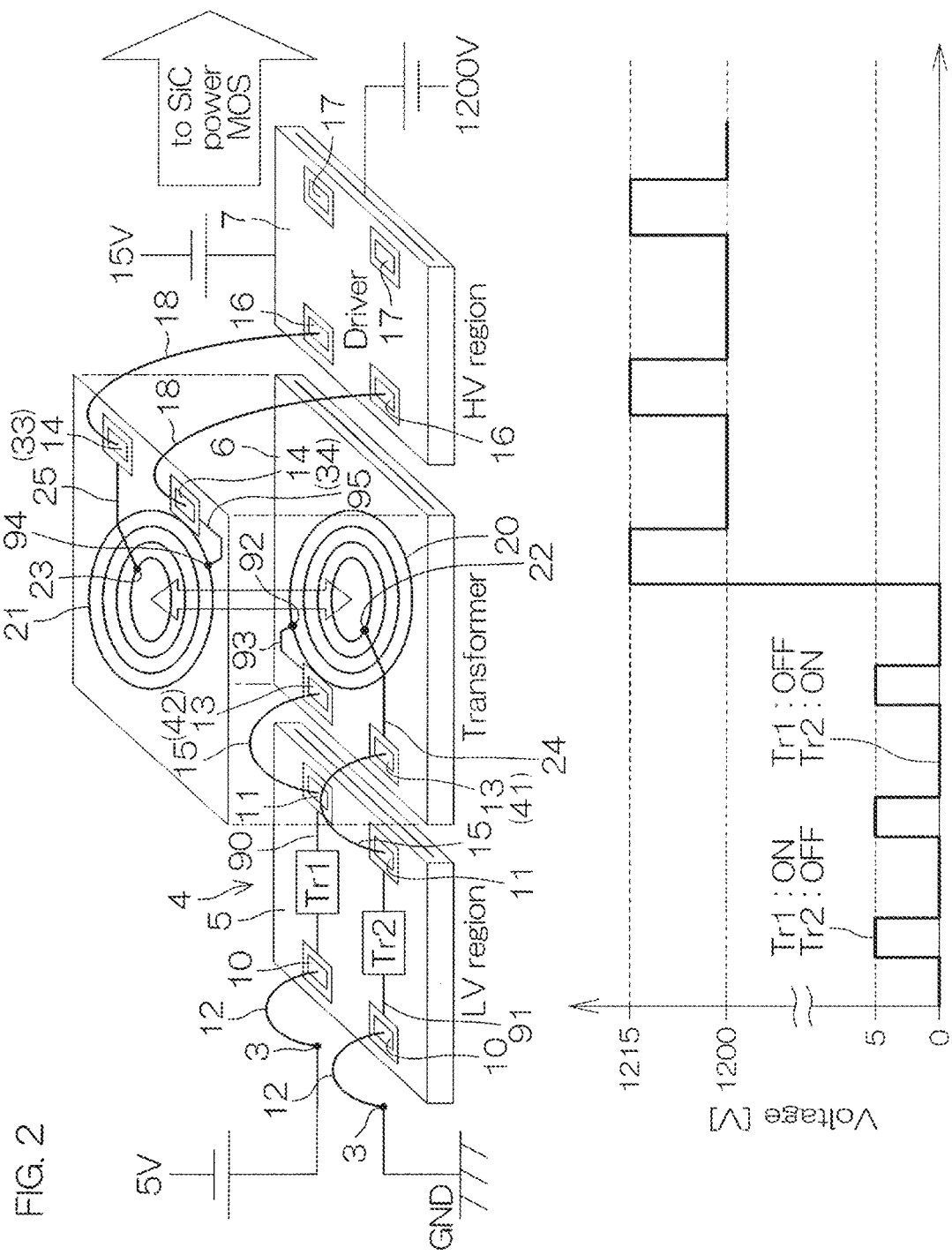
FIG. 2 is a diagram of a connection configuration and potentials at respective portions of the electronic component module.

FIG. 2 is a diagram of a connection configuration and potentials at respective portions of the electronic component module 1 of FIG. 1.

As shown in FIG. 2, with the electronic component module 1, a lower coil 20 at the primary side (low voltage side) and an upper coil 21 at the secondary side (high voltage side) of the electronic component 6 face each other across an interval in an up/down direction.

The lower coil 20 is formed as an example of a low voltage coil (low voltage conductor pattern). The upper coil 21 is formed as an example of a high voltage coil (high voltage conductor pattern). The lower coil 20 and the upper coil 21 are each formed to a spiral shape.

A transformer (each of a first transformer 301 and a second transformer 302) is formed by magnetic coupling of the lower coil 20 and the upper coil 21. The controller chip and the driver chip 7 are DC isolated by the transformer (the lower coil 20 and the upper coil 21). Also, the controller chip 5 and the driver chip 7 are AC connected by the transformer (the lower coil 20 and the upper coil 21).

A low voltage wiring 24 and a low voltage wiring 93 are respectively connected to an inner coil end 22 (inner terminal end of the spiral) and an outer coil end 92 (outer terminal end of the spiral) of the lower coil 20. The terminal ends of the low voltage wirings 24 and 93 are exposed as the low voltage pads 13.

A high voltage wiring 25 (inner coil end wiring) and a high voltage wiring 95 (outer coil end wiring) are respectively connected to an inner coil end 23 and an outer coil end 94 of the upper coil 21. The terminal ends of the high voltage wirings 25 and 95 are exposed as the high voltage pads 14.

The controller chip 5 includes transistors Tr1 and Tr2. The transistors Tr1 and Tr2 are switching devices that perform conductive connection and interruption of wirings 90 and 91, respectively.

The transistor Tr1 is provided in the middle of the wiring 90 that connects a certain pad 10 and a certain pad 11. The transistor Tr2 is provided in the middle of the wiring 91 that connects another pad 10 and another pad 11.

The pads 10 and 11 at the wiring 90 side are connected to an input voltage and the low voltage pads 13 at the outer coil end 92 side through bonding wires 12 and 15, respectively. The pads 10 and 11 at the wiring 91 side are connected to a ground voltage and the low voltage pads 13 at the inner coil end 22 side through bonding wires 12 and 15, respectively.

By controlling the controller chip 5 such that a first voltage application state (Tr1: ON, Tr2: OFF) and a second voltage application state (Tr1: OFF, Tr2: ON) are repeated alternately, a periodic pulse voltage is generated in the lower coil 20 of the electronic component 6. For example, in FIG. 2, a pulse voltage of 5 V with respect to a reference voltage=0 V (ground voltage) is generated in the lower coil 20.

With the electronic component 6, while a DC signal is interrupted between the lower coil 20 and the upper coil 21, just an AC signal based on the pulse voltage generated in the lower coil 20 is selectively transmitted to the high voltage side (upper coil 21) by electromagnetic induction.

The transmitted AC signal is boosted in accordance with a transformer ratio between the lower coil 20 and the upper coil 21. The transmitted AC signal is output to the driver chip 7 through the bonding wires 18. For example, in FIG. 2, after the pulse voltage of 5 V is boosted to 15 V, it is output to the driver chip 7 with which a reference voltage is set to 1200 V.

The driver chip 7 applies the input pulse voltage of 15 V to a gate electrode (not shown) of an SiC power MOSFET (for example, source-drain voltage=1200 V) to perform switching operation of the MOSFET.

The specific voltage values shown in FIG. 2 are merely an example used for describing an operation of the electronic component module 1. The reference voltage of the driver chip 7 (HV region) may be a value that exceeds 1200 V.

Figure 3:
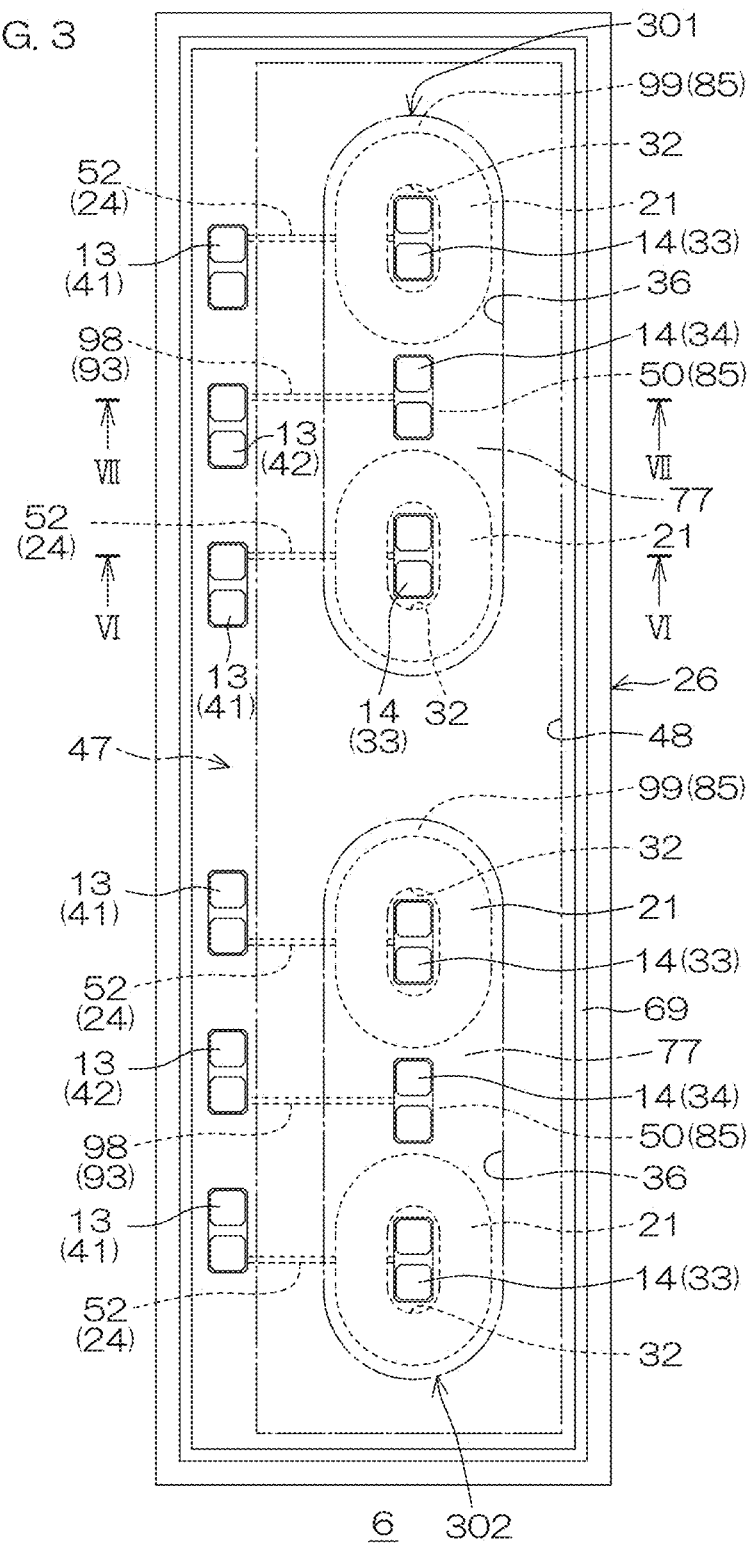
FIG. 3 is a diagram for describing the planar structure of the electronic component.
Figure 4:
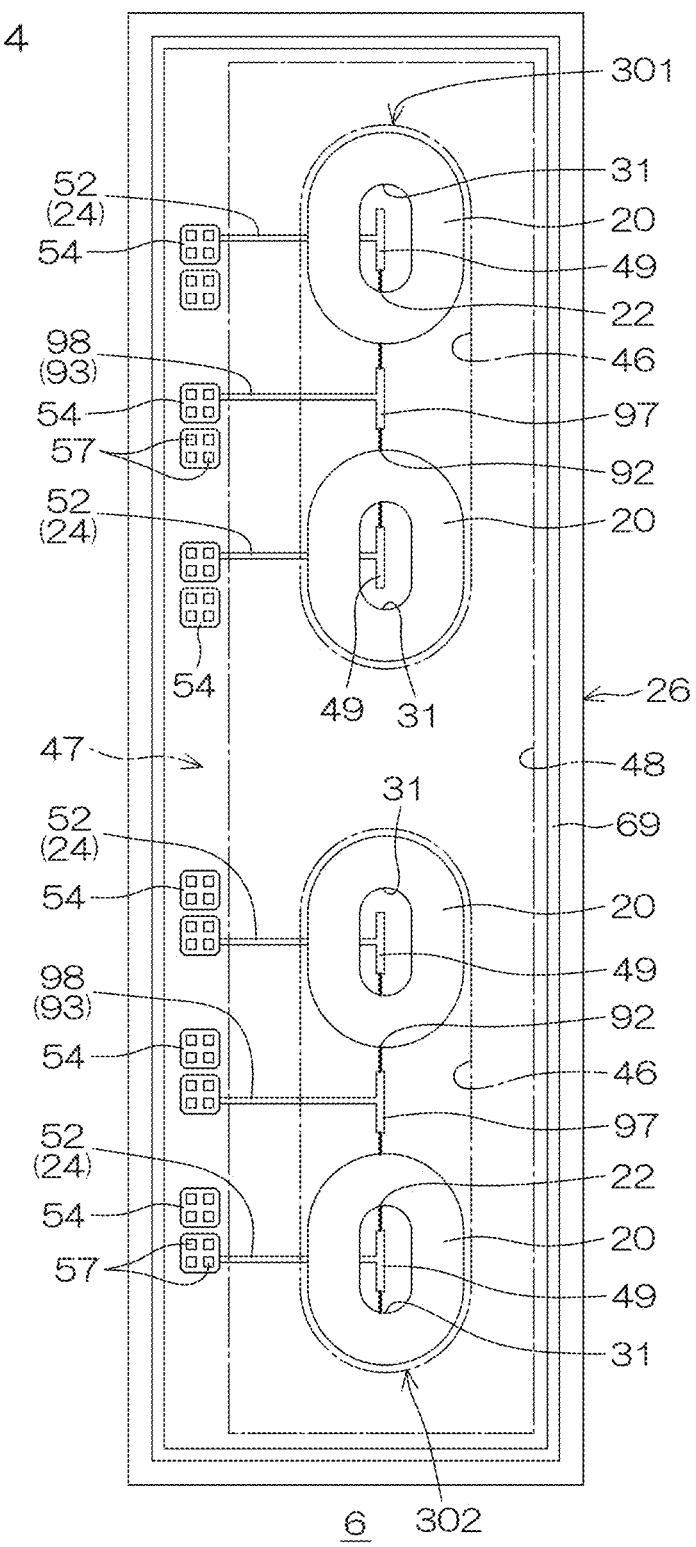
FIG. 4 is a diagram for describing the planar structure of a lower coil of the electronic component.
Figure 5:
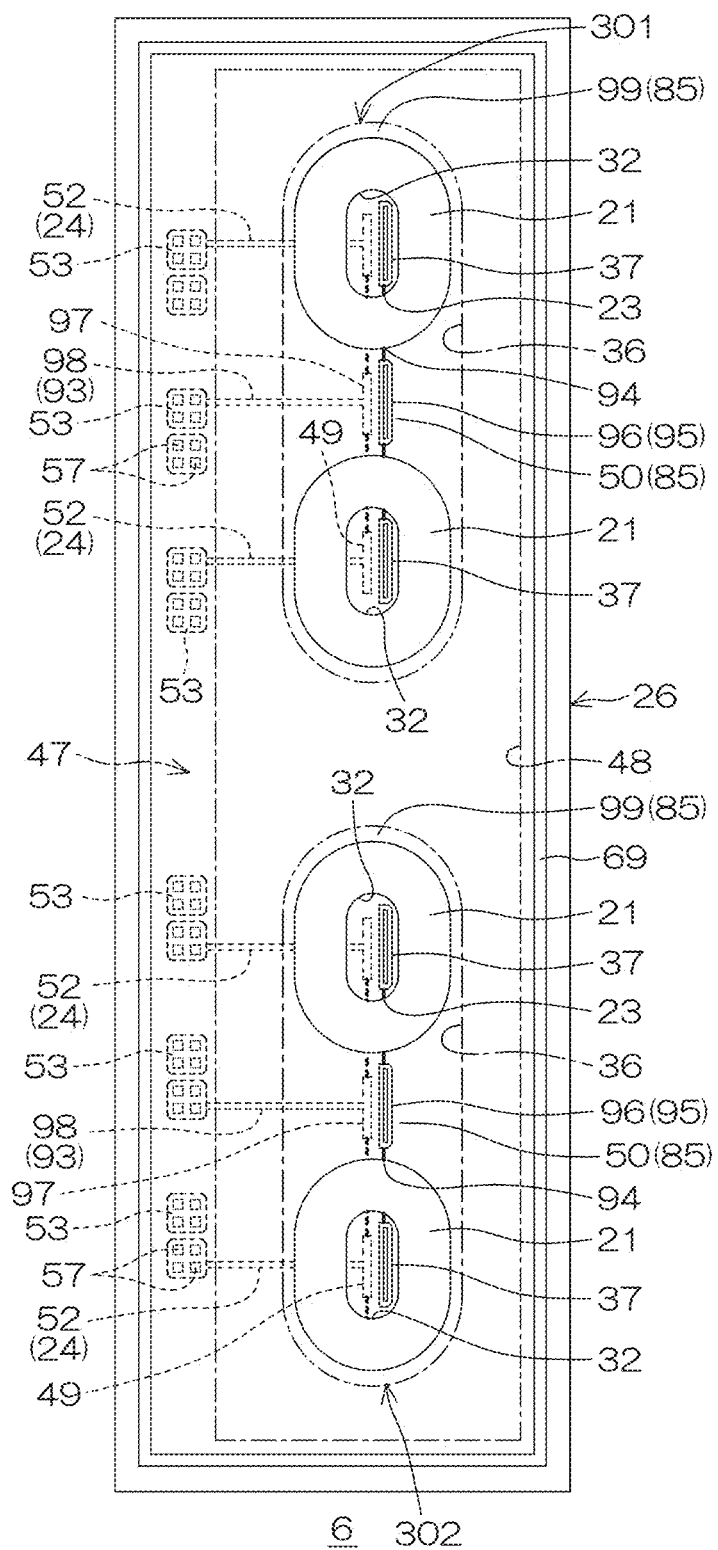
FIG. 5 is a diagram for describing the planar structure of an upper coil of the electronic component.

FIG. 3 is a diagram for describing the planar structure of the electronic component 6. FIG. 4 is a diagram for describing the planar structure of a layer of the electronic component 6 at which the lower coil 20 is arranged. FIG. 5 is a diagram for describing the planar structure of a layer of the electronic component 6 at which the upper coil 21 is arranged.

Figure 6:
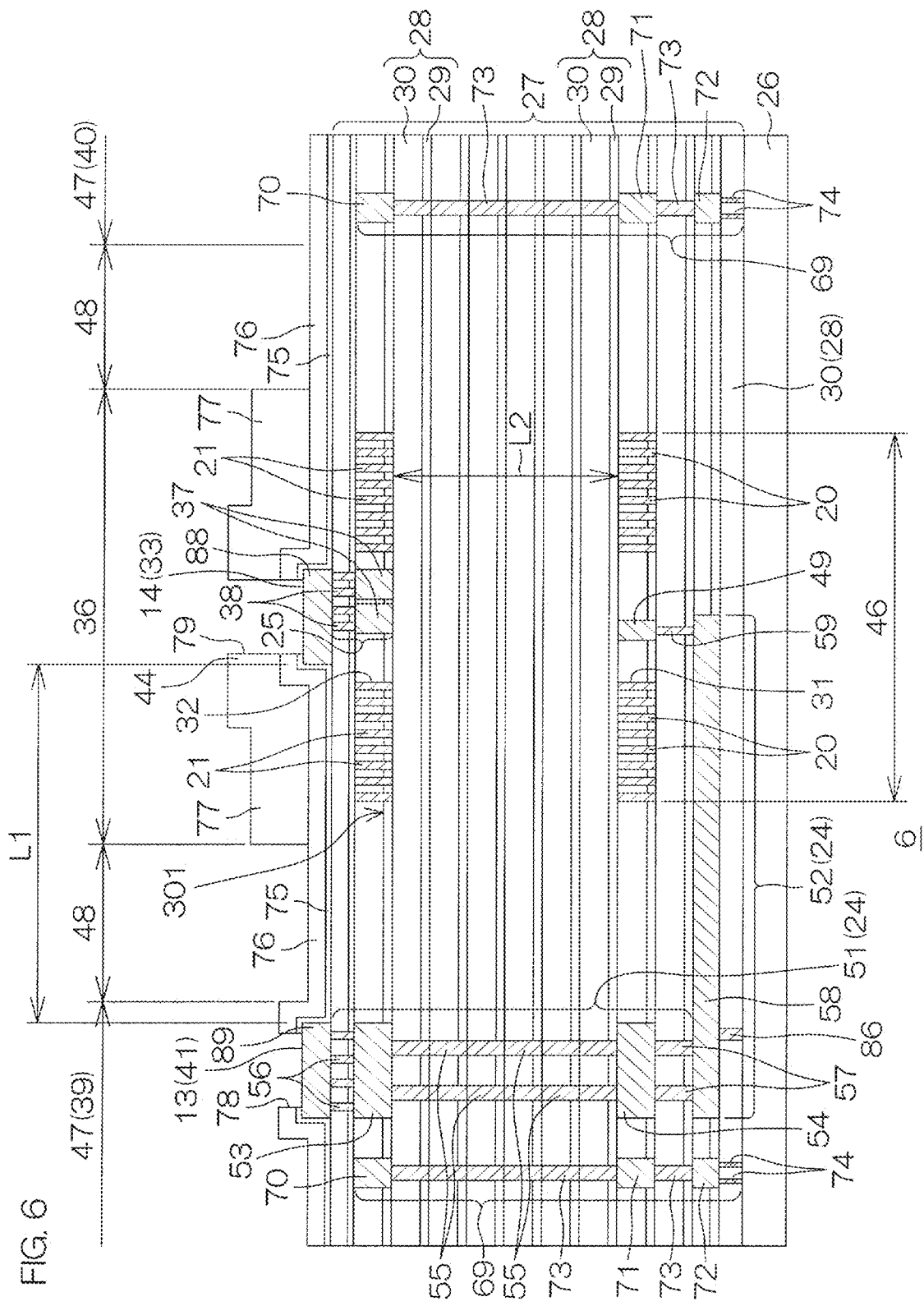
FIG. 6 is a sectional view taken along line VI-VI in FIG. 3.
Figure 7:
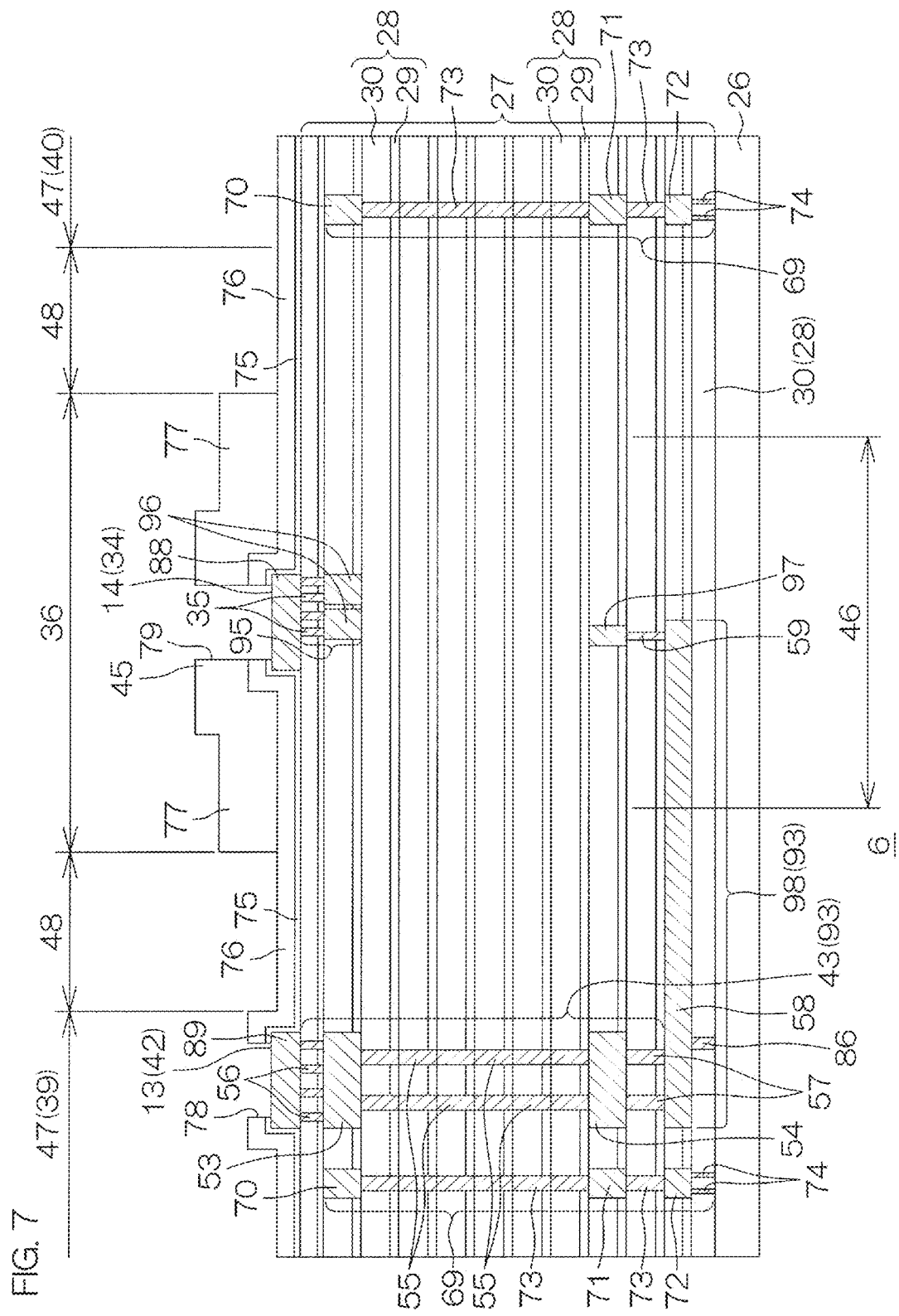
FIG. 7 is a sectional view taken along line VII-VII in FIG. 3.

FIG. 6 is a sectional view of the electronic component 6 (sectional view taken along line VI-VI in FIG. 3). FIG. 7 is a sectional view of the electronic component 6 (sectional view taken along line VII-VII in FIG. 3). In FIG. 6 and FIG. 7, just metal portions are applied with hatching for clarification.

Referring to FIG. 3 to FIG. 5, the electronic component 6 includes the first transformer 301 and the second transformer 302. The first transformer 301 and the second transformer 302 are formed at an interval along a length direction of the electronic component 6. On sheet surfaces of FIG. 3 to FIG. 5, the first transformer 301 is shown at an upper side and the second transformer 302 is shown at a lower side.

As shall be described below, the first transformer 301 includes two sets each of the lower coil 20 and the upper coil 21 that face each other. Similarly, the second transformer 302 includes two sets each of the lower coil 20 and the upper coil 21 that face each other.

As shown in FIG. 6 and FIG. 7, a semiconductor substrate 26 and an insulating layer laminated structure 27 formed on the semiconductor substrate 26 are included. As the semiconductor substrate 26, an Si (silicon) substrate, an SiC (silicon carbide) substrate, etc., can be applied.

By the semiconductor substrate 26, the electronic component 6 is formed as a semiconductor device. The electronic component module 1 that includes the electronic component 6 is thus formed as a semiconductor module.

The insulating layer laminated structure 27 is constituted of a plurality (twelve layers in FIG. 6 and FIG. 7) of insulating layers 28 that are laminated successively from a front surface of the semiconductor substrate 26. With the exception of the insulating layer 28 that is the lowermost layer contacting the front surface of the semiconductor substrate 26, the plurality of insulating layers 28 are each constituted of a laminated structure of an etching stopper film 29 that is a lower layer and an interlayer insulating film 30 that is an upper layer.

The insulating layer 28 that is the lowermost layer is constituted of just the interlayer insulating film 30. As the etching stopper film 29, an SiN film, an SiC film, an SiCN film, etc., may be used. As the interlayer insulating film 30, an $SiO_2$ film may be used.

The lower coil 20 and the upper coil 21 are formed in mutually different insulating layers 28 in the insulating layer laminated structure 27. The lower coil 20 and the upper coil 21 face each other across one layer or more of the insulating layers 28.

In this embodiment, the lower coil 20 is formed in the insulating layer 28 that is the fourth layer from the semiconductor substrate 26. The upper coil 21 is formed in the eleventh insulating layer 28 with six layers of the insulating layers 28 between the upper coil 21 and the lower coil 20.

As shown in FIG. 3 to FIG. 5, each lower coil 20 and each upper coil 21 are formed in regions of elliptical annular shapes that surround peripheries of inner regions 31 and 32, respectively, of elliptical shape in plan view such as to demarcate the inner regions 31 and 32 at centers thereof.

Each upper coil 21 is formed such that its upper surface is flush with an upper surface of an insulating layer 28. The upper coil 21 is thereby in contact with mutually different insulating layers 28 at its side surface, upper surface, and lower surface.

Specifically, with the insulating layer 28 in which the upper coil 21 is embedded, the etching stopper film 29 and the interlayer insulating film 30 are in contact with the side surface of the upper coil 21. With the interlayer insulating film 28 formed at an upper side of the insulating layer 28 in which the upper coil 21 is embedded, just the etching stopper film 29 that is the lower layer contacts the upper surface of the upper coil 21. With the insulating layer 28 at the lower side, just the interlayer insulating film 30 that is the upper layer contacts the lower surface of the upper coil 21.

Although description shall be omitted here, as with the upper coil 21, the lower coil 20 is also formed such that its upper surface is flush with an upper surface of an insulating layer 28.

As shown in FIG. 3, FIG. 6, and FIG. 7, high voltage pad layers 88 as examples of high voltage conducting layers and low voltage pad layers 89 as examples of low voltage conducting layers are formed on a front surface of the insulating layer laminated structure 27 (on the interlayer insulating film 30 of the insulating layer 28 that is the uppermost layer).

A protective film 75 and a passivation film 76 as examples of front surface insulating films are laminated successively on an entire surface of the insulating layer laminated structure 27 such as to cover the above integrally. Pad openings 79 and 78 are formed in the films 75 and 76. The pad openings 79 and 78 expose the high voltage pad layers 88 and the low voltage pad layers 89 as the high voltage pads 14 and the low voltage pads 13, respectively.

The high voltage pads 14 are arranged in central high voltage regions (HV regions) 36 in which the upper coils 21 are arranged in a plan view of viewing the electronic component 6 from above along a lamination direction of the insulating layer laminated structure 27.

Here, the high voltage regions 36 include regions of formation of the upper coils 21 and wirings equipotential to the upper coils 21 in the insulating layer 28 embedding the upper coils 21 and peripheral portions of the formation regions.

In this embodiment, a total of four upper coils 21 are formed in pairs of two each at intervals in the length direction of the electronic component 6 as shown in FIG. 3 and FIG. 5. In the inner regions 32 of the upper coils 21 and between the mutually adjacent upper coils 21 of each pair are respectively formed inner coil end wirings 37 and an outer coil end wiring 96.

With each pair of the upper coils 21, one upper coil 21 and the other upper coil 21 are electrically connected to each other by the outer coil end wiring 96 in common therebetween. Both of the upper coils 21, the outer coil end wiring 96 therebetween, and the inner coil end wirings 37 inside the respective upper coils 21 are all equipotential.

In the insulating layer 28, the inner regions 32 of the respective upper coils 21 and regions between the upper coils 21 of the respective upper coil 21 pairs are also included in the high voltage regions 36 as being within a range in which electric fields from the upper coils 21, the inner coil end wirings 37, and the outer coil end wirings 96 extend.

In each high voltage region 36, regions overlapping with the respective upper coils 21 in the plan views of FIG. 3 and FIG. 5 and the inner regions 32 of the respective upper coils 21 are examples of high voltage coil formation regions.

In each high voltage region 36, a region besides the high voltage coil formation regions is a coil exterior region 85 outside the upper coils 21. The region besides the high voltage coil formation regions includes, for example, a region between the upper coils 21 in each upper coil 21 pair (inter-coil region 50) and regions along peripheral edges of the respective upper coils 21 (coil periphery regions 99).

Although being coincident with the high voltage regions 36 in plan view, regions in which the lower coils 20 (low voltage coils) are arranged are separated from the upper coils 21 (high voltage coils) by a plurality of insulating layers 28. The regions in which the lower coils 20 (low voltage coils) are arranged are not included in the high voltage regions 36 as stated in regard to the present preferred embodiment because effects of the electric fields from the upper coils 21 hardly extend thereto.

As shown in FIG. 3, a total of six high voltage pads 14 are arranged, one each above the inner region 32 of each upper coil 21 and above the inter-coil region 50 of each upper coil 21 pair.

In classifying the high voltage pads 14 according to the positional configuration thereof, the high voltage pads 14 may include first pads 33 and second pads 34.

The first pads 33 are arranged above the inner regions 32 of the respective upper coils 21. Each first pad 33 faces the corresponding inner region 32 in a thickness direction (lamination direction) of the insulating layer laminated structure 27. The second pads 34 are arranged above the respective inter-coil regions 50. Each second pad 34 faces the corresponding inter-coil region 50 in a thickness direction (lamination direction) of the insulating layer laminated structure 27.

As shown in FIG. 3, FIG. 5, and FIG. 6, the first pads 33 are connected through vias 38 to the inner coil end wirings 37 embedded in the same insulating layer 28 as the upper coils 21.

As shown in FIG. 3, FIG. 5, and FIG. 7, by a similar structure, the second pads 34 are connected through vias 35 to the outer coil end wirings 96 embedded in the same insulating layer 28 as the upper coils 21.

AC signals transmitted to the upper coils 21 can thereby be output from the high voltage pads 14 via the inner coil end wirings 37 plus the vias 38 and the outer coil end wirings 96 plus the vias 35.

A combination of an inner coil end wiring 37 and the vias 38 connected thereto and a combination of an outer coil end wiring 96 and the vias 35 connected thereto constitute the high voltage wiring 25 and the high voltage wiring 95, respectively, of FIG. 2.

In the insulating layer laminated structure 27, low voltage regions 46 (FIG. 6 and FIG. 7), an outer low voltage region 47 (FIG. 3 to FIG. 7), and an intermediate region 48 (FIG. 3 to FIG. 7) are set as regions of low potential regions (LV regions) electrically separated from the high voltage regions 36.

The low voltage regions 46 include regions of formation of the lower coils 20 and wirings equipotential to the lower coils 20 in the insulating layer 28 embedding the lower coils 20 and peripheral portions of the formation regions. As with the relationship between the lower coils 20 and the upper coils 21, the low voltage regions 46 face the high voltage regions 36 across one layer or more of the insulating layers 28.

In this embodiment, a total of four lower coils 20 are formed at positions facing the upper coils 21, that is, in pairs of two each at intervals in the length direction of the electronic component 6 as shown in FIG. 4. In the inner regions 31 of the lower coils 20 and between the mutually adjacent lower coils 20 of each pair are respectively formed inner coil end wirings 49 and an outer coil end wiring 97.

With each pair, one lower coil 20 and the other lower coil 20 are electrically connected to each other by the outer coil end wiring 97 in common therebetween. Both of the lower coils 20, the outer coil end wiring 97 therebetween, and the inner coil end wirings 49 inside the respective lower coils are all equipotential.

In the insulating layer 28, the inner regions 31 of the respective lower coils 20 and regions between the lower coils 20 of the respective lower coil 20 pairs are also included in the low voltage regions 46 as being within a range in which electric fields from the lower coils 20, the inner coil end wirings 49, and the outer coil end wirings 97 extend. As shown in FIG. 5, the inner coil end wirings 49 are arranged at positions shifted from the inner coil end wirings 37 at the high voltage side in plan view.

As shown in FIG. 3 to FIG. 5, the outer low voltage region 47 is set such as to surround the high voltage regions 36 and the low voltage regions 46. The intermediate region 48 is set between the high voltage regions 36 plus the low voltage regions 46 and the outer low voltage region 47.

As shown in FIG. 3, FIG. 6, and FIG. 7, the low voltage pads 13 are formed on the front surface of the insulating layer laminated structure 27 (on the interlayer insulating film 30 of the insulating layer 28 that is the uppermost layer) in the outer low voltage region 47.

As shown in FIG. 6 and FIG. 7, the outer low voltage region 47 includes a first region 39 as an example of a first space and a second region 40 as an example of a second space.

The first region 39 is a region at one side (left side of sheet surface) across the high voltage pads 14. The second region 40 is a region at the other side (right side of sheet surface) across the high voltage pads 14. The low voltage pads 13 are selectively biasedly formed in the first region 39.

In this embodiment, a total of six low voltage pads 13 are arranged at intervals in the length direction of the electronic component 6 in the first region 39, one each at the side of the six provided high voltage pads 14.

The respective low voltage pads 13 are connected to the lower coils 20 by low voltage wirings 24 and 93 routed inside the insulating layer laminated structure 27. Each low voltage wiring 24 includes a penetrating wiring 51 and a lead-out wiring 52.

The penetrating wirings 51 are formed in the outer low voltage region 47 in columnar shapes that penetrate from the respective low voltage pads 13 through at least the insulating layer 28 in which the lower coils 20 are formed and reach an insulating layer 28 lower than the lower coils 20.

More specifically, each penetrating wiring 51 includes low voltage layer wirings 53 and 54 (low voltage wirings) and vias 55, 56, and 57. The low voltage layer wirings 53 and 54 are embedded in island shapes (quadrilateral shapes) in the same insulating layers 28 as the upper coils 21 and the lower coils 20, respectively.

The plurality of vias 55 connect between the low voltage layer wirings 53 and 54. The vias 56 connect the low voltage layer wirings 53 at the upper side with the low voltage pads 13. The vias 57 connect the low voltage layer wirings 54 at the lower side with the lead-out wirings 52.

The lead-out wirings 52 are formed to line shapes that are led out from the low voltage regions 46 to the outer low voltage region 47 via the insulating layer 28 lower than the lower coils 20.

More specifically, each lead-out wiring 52 includes the corresponding inner coil end wiring 49, a lead-out layer wiring 58, and a via 59. The lead-out layer wiring 58 is embedded in a line shape in the insulating layer 28 lower than the corresponding lower coil 20. The lead-out layer wiring 58 crosses below the lower coil 20.

The via 59 connects the lead-out layer wiring 58 with the inner coil end wiring 49. The lead-out layer wiring 58 is connected to the semiconductor substrate 26 via a via 86. The low voltage wirings 24 are thereby fixed at a substrate voltage (for example, the ground voltage).

Although details shall be omitted, as with the low voltage wirings 24, the low voltage wirings 93 are also constituted of wirings that include penetrating wirings 43 (FIG. 7) and lead-out wirings 98 (FIG. 3 to FIG. 5).

By the above arrangement, among the plurality of low voltage pads 13, first pads 41 arranged at the side of the first pads 33 of the high voltage pads 14 are connected via the penetrating wirings 51 and the lead-out wirings 52 to the inner coil end wirings 49 of the lower coils 20 as shown in FIG. 3 to FIG. 6.

As shown in FIG. 3 to FIG. 6, second pads 42 arranged at the side of the second pads 34 of the high voltage pads 14 are connected via the penetrating wirings 43 and the lead-out wirings 98 to the outer coil end wirings 97 of the lower coils 20. Signals input into the low voltage pads 13 can thereby be transmitted to the lower coils 20 via the penetrating wirings 51 and 43 and the lead-out wirings 52 and 98.

In the insulating layer laminated structure 27, a shield layer 69 is formed further outside than the low voltage wirings 24 and 93. The shield layer 69 prevents entry of moisture into the device from the exterior and spreading of a crack at an end surface into the interior.

As shown in FIG. 3 to FIG. 7, the shield layer 69 is formed to a wall shape along end surfaces of the electronic component 6. A bottom portion of the shield layer 69 is connected to the semiconductor substrate 26. The shield layer 69 is thereby fixed at the substrate voltage (for example, the ground voltage).

More specifically, as shown in FIG. 6 and FIG. 7, the shield layer 69 includes shield layer wirings 70 to 72 embedded in the same insulating layers 28 as the upper coils 21, the lower coils 20, and the lead-out layer wirings 58, respectively, a plurality of vias 73 connecting between the wirings, and vias 74 connecting the shielding layer wiring 72 at the lowermost layer and the semiconductor substrate 26.

Further, on the insulating layer laminated structure 27, resin films 77 are formed on the protective film 75 and the passivation film 76. In this embodiment, the resin films 77 are formed selectively on the passivation film 76 such as to integrally cover entireties of the high voltage regions 36.

That is, the resin films 77 cover the regions overlapping with the respective upper coils 21 in the plan view of FIG. 3, the inner regions 32 of the respective upper coils 21, the inter-coil regions 50, and the coil periphery regions 99. Thereby, in plan view, both the first pads 33 and the second pads 34 of the high voltage pads 14 are covered together with entire peripheries thereof by the resin films 77.

Openings in the resin films 77 that expose the high voltage pads 14 coincide with the pad openings 79. The resin films 77 thereby have overlapping portions 44 and 45 riding on peripheral edges of the first pads 33 and the second pads 34 of the high voltage pads 14.

The protective film 75 is constituted, for example, of $SiO_2$ and has a thickness of approximately 150 nm. The passivation film 76 is constituted, for example, of SiN and has a thickness of approximately 1000 nm. The resin films 77 are constituted, for example, of polyimide and have a thickness of approximately 4000 nm.

Details of the respective portions of the electronic component 6 shall now be described.

As described with FIG. 2, a large potential difference (for example, of approximately 1200 V) is generated between the lower coils 20 and the upper coils 21 of the electronic component 6. The insulating layers 28 arranged between the lower coils 20 and the upper coils 21 have a thickness capable of realizing a withstand voltage such that a dielectric breakdown due to the potential difference therebetween would not occur.

Thus, in this embodiment, a plurality of layers (for example, six layers) of the insulating layers 28 are interposed between the coils as shown in FIG. 6. Each insulating layer 28 is constituted of the laminated structure of the etching stopper film 29 of approximately 300 nm and the interlayer insulating film 30 of approximately 2100 nm. By making a total thickness L2 of the insulating layers 28 be not less than 12.0 μm and not more than 16.8 μm, DC insulation in a vertical direction is realized between the lower coils 20 and the upper coils 21.

A distance L1 between the high voltage pads 14 and the low voltage pads 13 is greater in comparison to the total thickness L2 of the insulating layers 28 between the lower coils and the upper coils 21. For example, the distance L1 is generally not less than 100 μm and not more than 450 μm and, expressed as a ratio with respect to the thickness L2 (distance L1/thickness L2), is not less than 6/1 and not more than 40/1.

Figure 8:
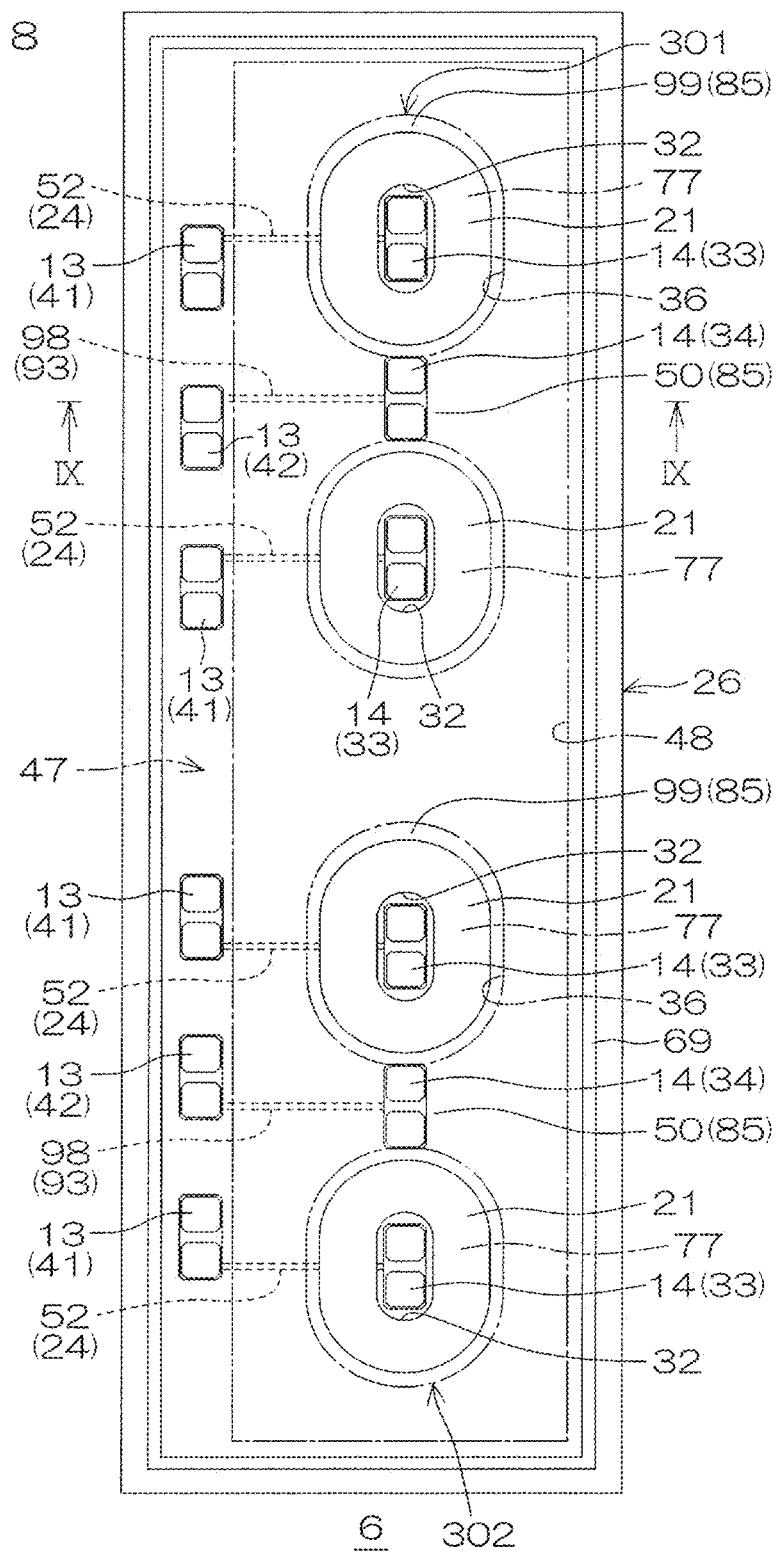
FIG. 8 is a sectional view of the arrangement of a comparative mode of the electronic component.
Figure 9:
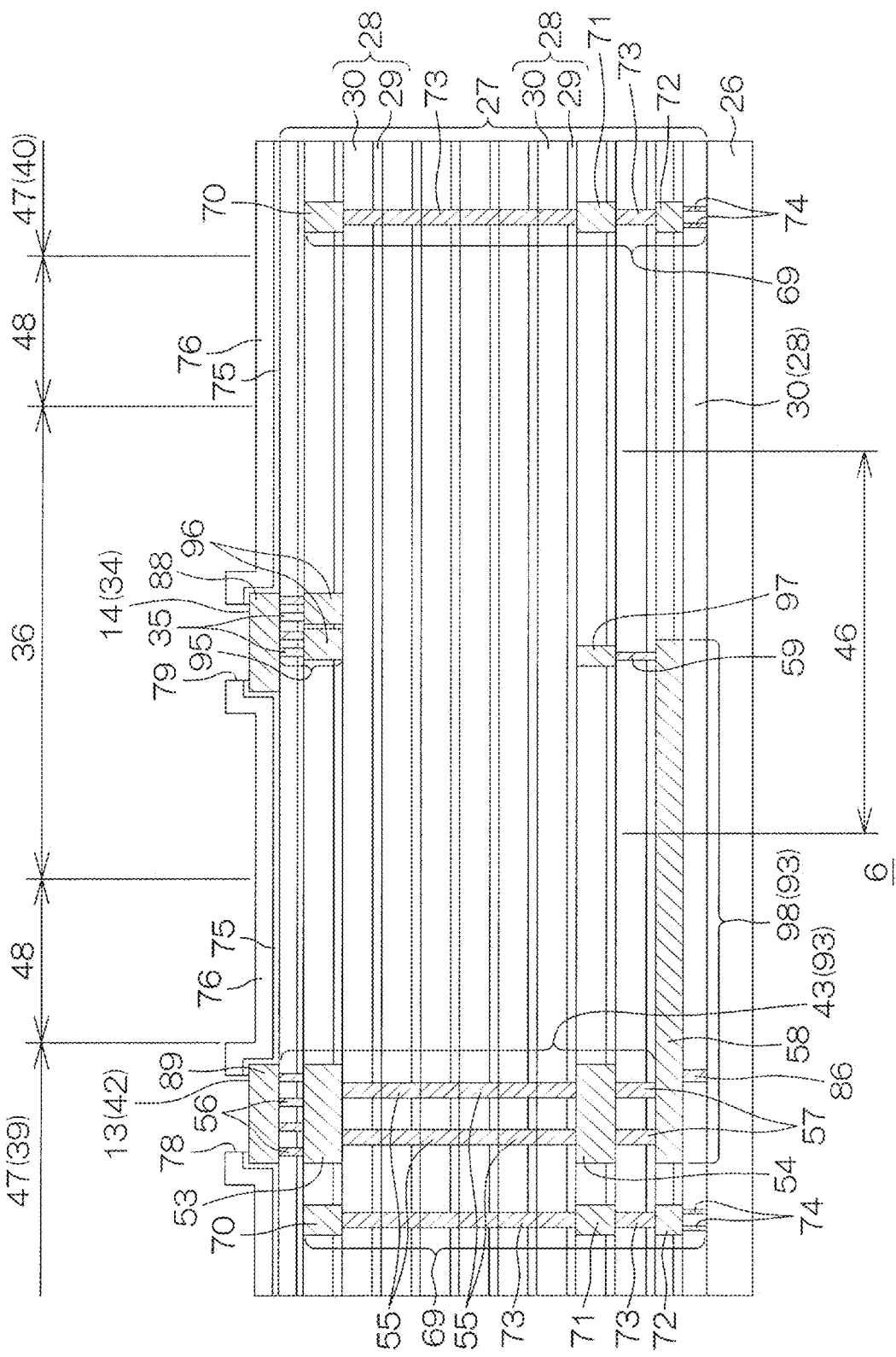
FIG. 9 is a sectional view taken along line IX-IX in FIG. 8.

FIG. 8 is a sectional view of the arrangement of an electronic component 6 according to a comparative mode of the present invention. FIG. 9 is a sectional view taken along line IX-IX in FIG. 8. As shown in FIG. 8 and FIG. 9, with the electronic component 6 according to the comparative example, the resin films 77 expose peripheries of the second pads 34 of the high voltage pads 14.

Figure 10:
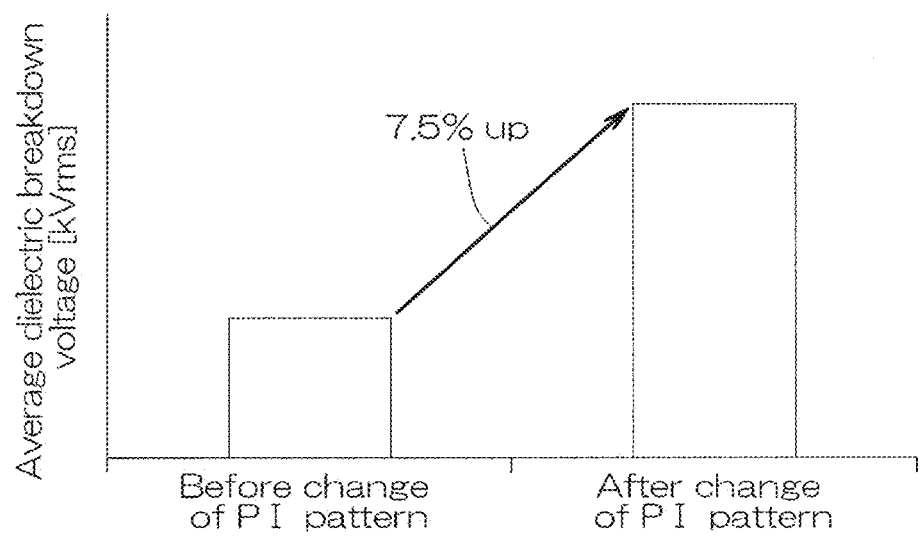
FIG. 10 is a graph comparing an average dielectric breakdown voltage of the electronic component according to the comparative mode of the present invention and an average dielectric breakdown voltage of the electronic component according to the first preferred embodiment of the present invention.

FIG. 10 is a graph comparing an average dielectric breakdown voltage of the electronic component according to the comparative mode of the present invention and an average dielectric breakdown voltage of the electronic component 6 according to the first preferred embodiment of the present invention. In FIG. 10, the ordinate represents the average dielectric breakdown voltage [kVrms].

Referring to FIG. 10, the average dielectric breakdown voltage of the electronic component 6 according to the first preferred embodiment was increased by 7.5% with respect to the average dielectric breakdown voltage of the electronic component 6 according to the comparative mode. From this, it was found that the average dielectric breakdown voltage can be improved by covering the peripheries of the second pads 34 by the resin films 77.

Figure 11:
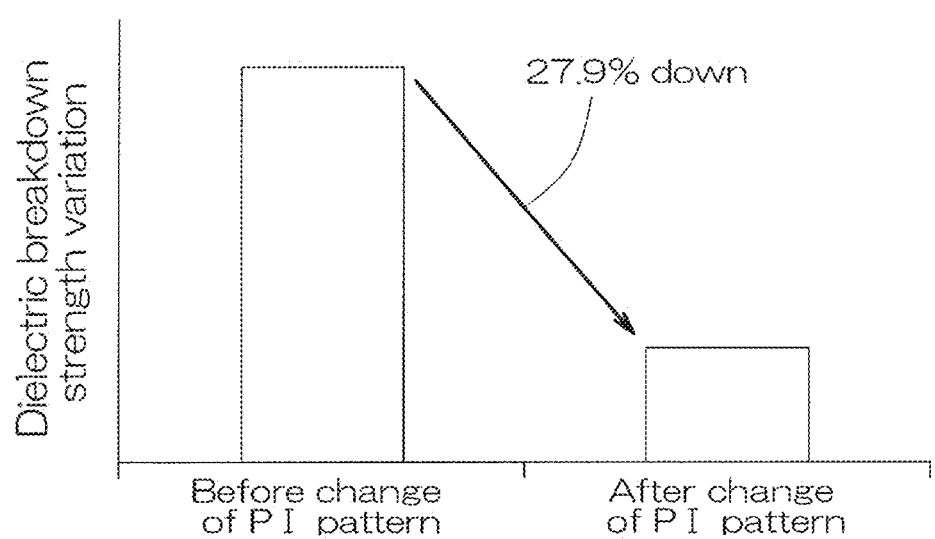
FIG. 11 is a graph comparing a variation of dielectric breakdown voltage of the electronic component according to the comparative mode of the present invention and a variation of dielectric breakdown voltage of the electronic component according to the first preferred embodiment of the present invention.

FIG. 11 is a graph comparing a variation of dielectric breakdown voltage of the electronic component 6 according to the comparative mode of the present invention and a variation of dielectric breakdown voltage of the electronic component 6 according to the first preferred embodiment of the present invention. In FIG. 11, the ordinate represents the variation of the average dielectric breakdown voltage.

Referring to FIG. 11, the variation of dielectric breakdown voltage of the electronic component 6 according to the first preferred embodiment was decreased by 27.9% with respect to the variation of dielectric breakdown voltage of the electronic component 6 according to the comparative mode. From this, it was found that the variation of dielectric breakdown voltage can be suppressed by covering the peripheries of the second pads 34 by the resin films 77.

Figure 12:
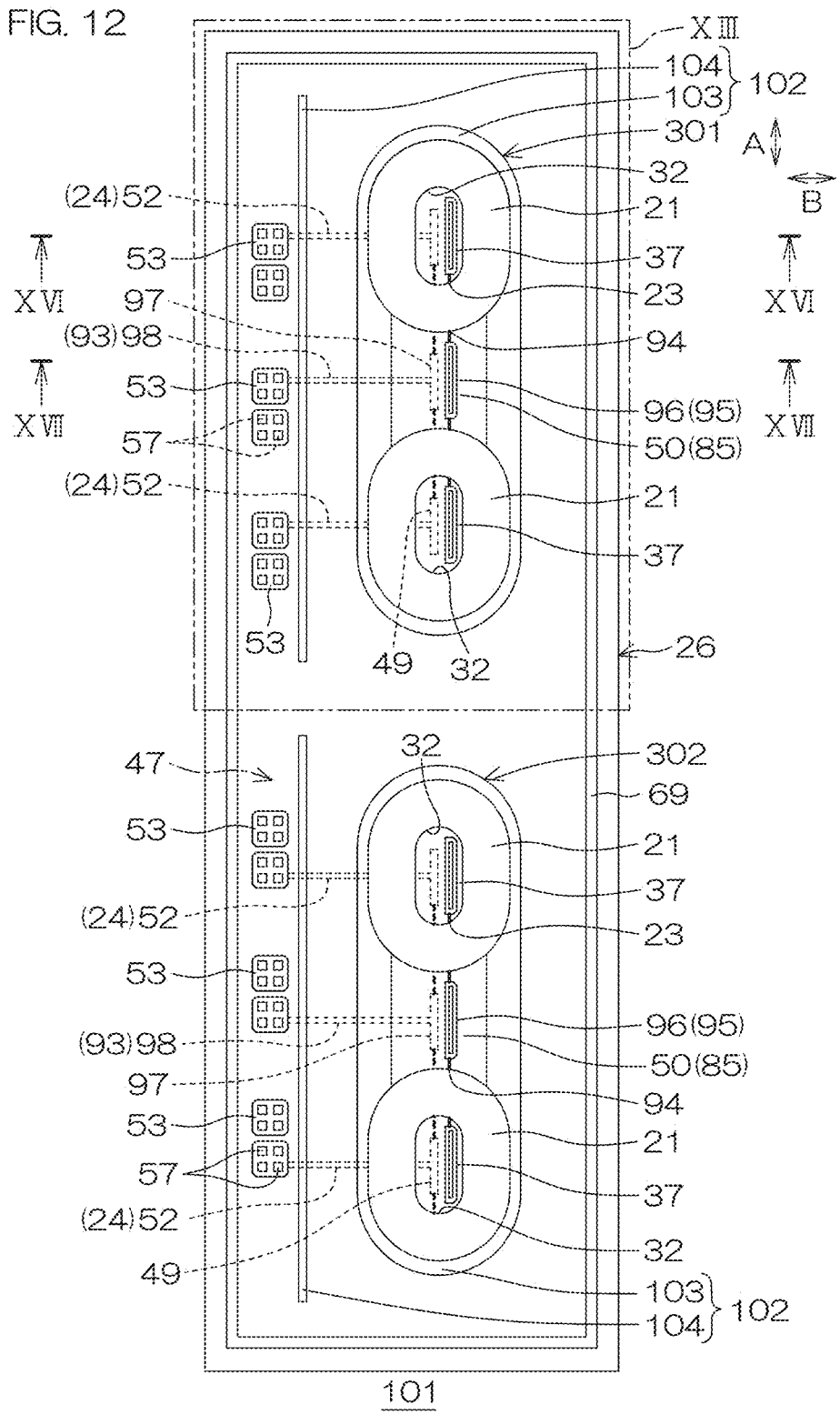
FIG. 12 is a diagram for describing the planar structure of upper coils of an electronic component according to a second preferred embodiment of the present invention.

FIG. 12 is a diagram for describing the planar structure of upper coils 21 of an electronic component 101 according to a second preferred embodiment of the present invention. With this embodiment, structures corresponding to structures of the electronic component 6 are provided with the same reference symbols and description thereof is omitted.

With an electronic component with which a low voltage portion and a high voltage portion are laid out on the same plane or on planes that can be deemed to be substantially the same (hereinafter referred to simply as "on the plane in common"), the high voltage portion forms an electric field with the low voltage portion. Therefore, a comparatively high electric field tends to concentrate on the high voltage portion.

For example, with an electronic component with which a single transformer is arranged by a low voltage coil and a high voltage coil that face each other, the high voltage coil forms an electric field with the low voltage coil. Therefore, a comparatively high electric field tends to concentrate on the high voltage coil. Occurrence of such concentration of electric field can be a detriment in terms of improving withstand voltage.

Thus, with this embodiment, an electronic component that enables relaxation of such concentration of electric field and improvement of the withstand voltage is provided.

In the following, out of the first transformer 301 and the second transformer 302, the structure at the first transformer 301 side shall be described as an example. The structure at the second transformer 302 side is the same as the structure at the first transformer 301 side and therefore the same reference symbols are provided and description thereof is omitted.

Also in the following, for convenience of description, one of the upper coils 21 out of the two upper coils 21 shall be referred to as the first upper coil 21A and the other upper coil 21 shall be referred to as the second upper coil 21B as necessary. When mention is made simply of the upper coils 21A and 21B, it shall be deemed that both the first upper coil 21A and the second upper coil 21B are included.

Also in the following, a direction in which the first upper coil 21A and the second upper coil 21B face each other shall be referred to as the "first direction A" and an intersecting direction intersecting the first direction A shall be referred to as the "second direction B." More specifically, the second direction B is an orthogonal direction orthogonal to the first direction A.

Referring to FIG. 12, the electronic component 101 is, in this embodiment, a transformer chip that includes transformers. The electronic component 101 includes withstand voltage enhancement structures 102 having conductive property. Each withstand voltage enhancement structure 102 is formed in a region between members of a low voltage side and members of a high voltage side. The members of the low voltage side include, for example, the low voltage pads 13, the shield layer 69, etc., that are fixed at a reference potential or a ground potential.

The members of the high voltage side include, for example, the high voltage pads 14, the upper coils 21A and 21B, etc. The withstand voltage enhancement structure 102 suppresses withstand voltage degradation due to electric fields that are formed in the region between the members of the low voltage side and the members of the high voltage side.

More specifically, the withstand voltage enhancement structure 102 includes a first withstand voltage enhancement structure 103 of the high voltage side and a second withstand voltage enhancement structure 104 of the low voltage side. In FIG. 12, each first withstand voltage enhancement structure 103 and each second withstand voltage enhancement structure 104 are shown in simplified manner.

The first withstand voltage enhancement structure 103 is formed along the upper coils 21A and 21B. The first withstand voltage enhancement structure 103 surrounds the upper coils 21A and 21B such as to demarcate the upper coils 21A and 21B from other regions.

More specifically, the first withstand voltage enhancement structure 103 surrounds the upper coils 21A and 21B and the outer coil end wiring 96 formed between the upper coils 21A and 21B altogether. That is, the first withstand voltage enhancement structure 103 is formed to a ring shape (elliptical ring shape) in plan view.

The second withstand voltage enhancement structure 104 is formed in a region between the upper coils 21A and 21B and the low voltage layer wirings 53 (low voltage pads 13)

in plan view. The second withstand voltage enhancement structure 104 extends in a line shape along the first direction A.

The second withstand voltage enhancement structure 104 is formed along the plurality of low voltage layer wirings 53 (low voltage pads 13) in plan view. The second withstand voltage enhancement structure 104 thereby protrudes further outside than outer contours of the low voltage pads 13 in plan view.

The second withstand voltage enhancement structure 104 extends in the line shape along the first direction A such as to pass along the plurality of low voltage pads 13. The second withstand voltage enhancement structure 104 thereby demarcates the plurality of low voltage pads 13 (low voltage layer wirings 53) respectively from the upper coils 21A and 21B.

Figure 13:
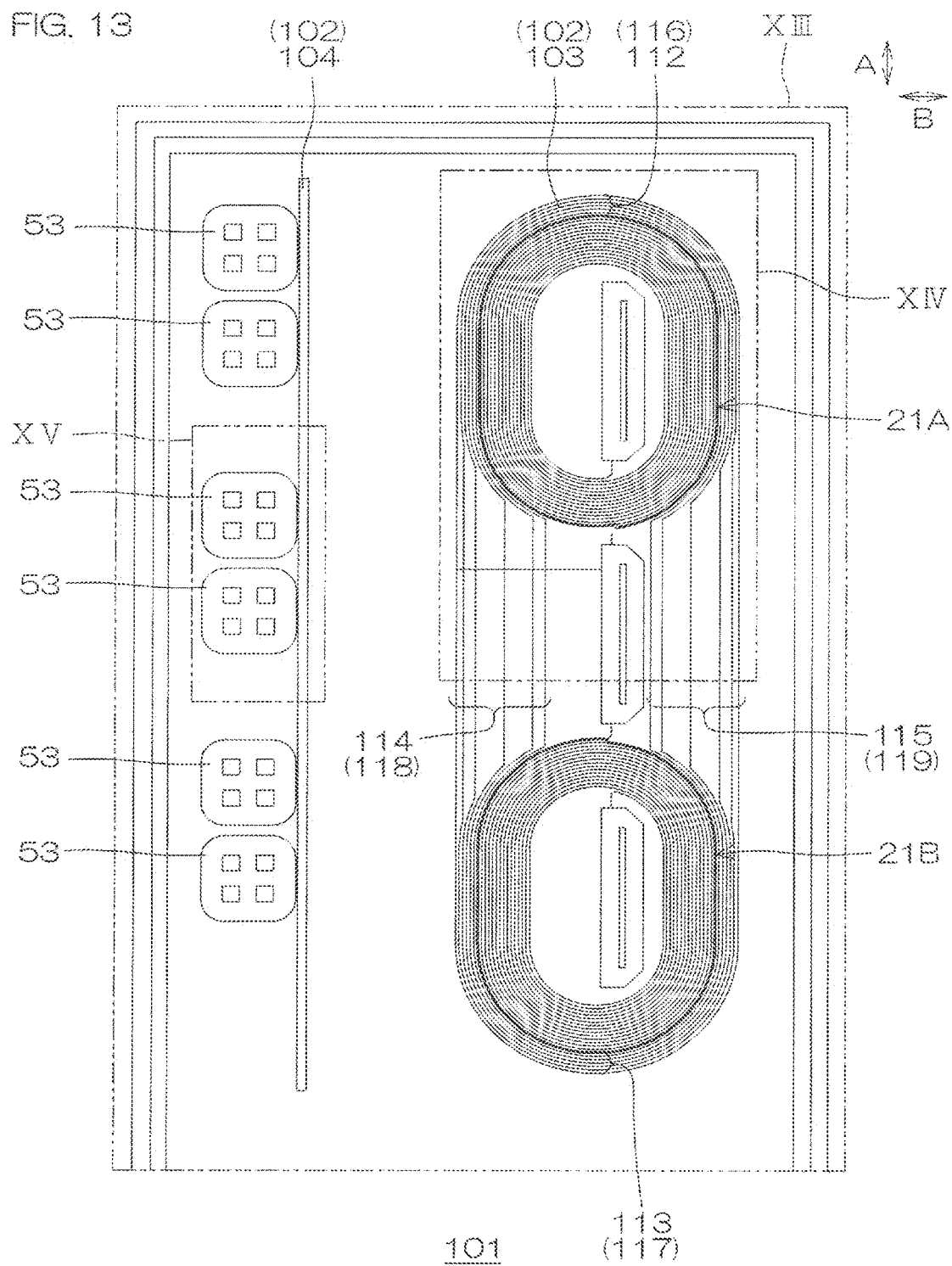
FIG. 13 is an enlarged view of a region XIII shown in FIG. 12.
Figure 14:
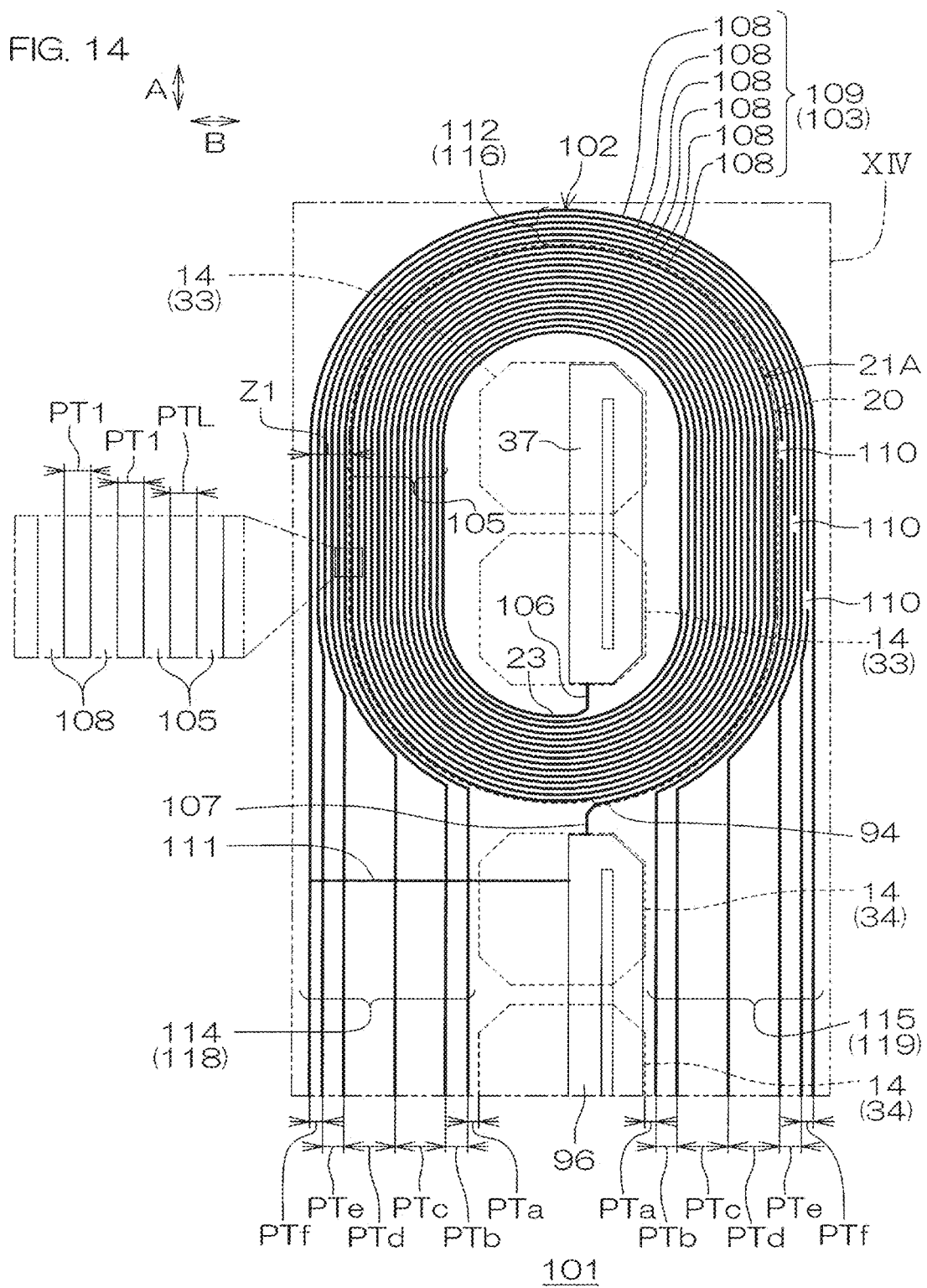
FIG. 14 is an enlarged view of a region XIV shown in FIG. 13.
Figure 15:
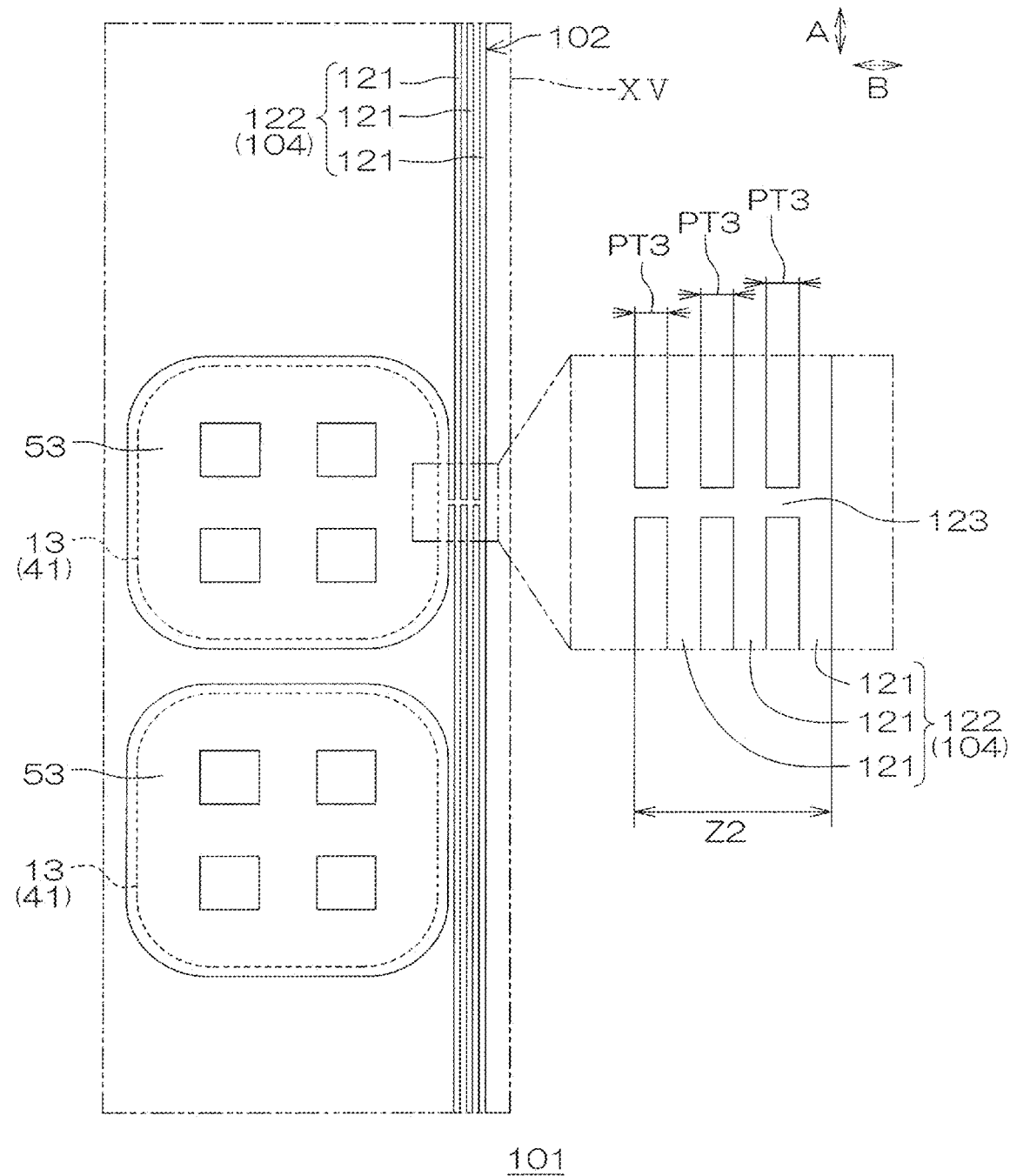
FIG. 15 is an enlarged view of a region XV shown in FIG. 13.
Figure 16:
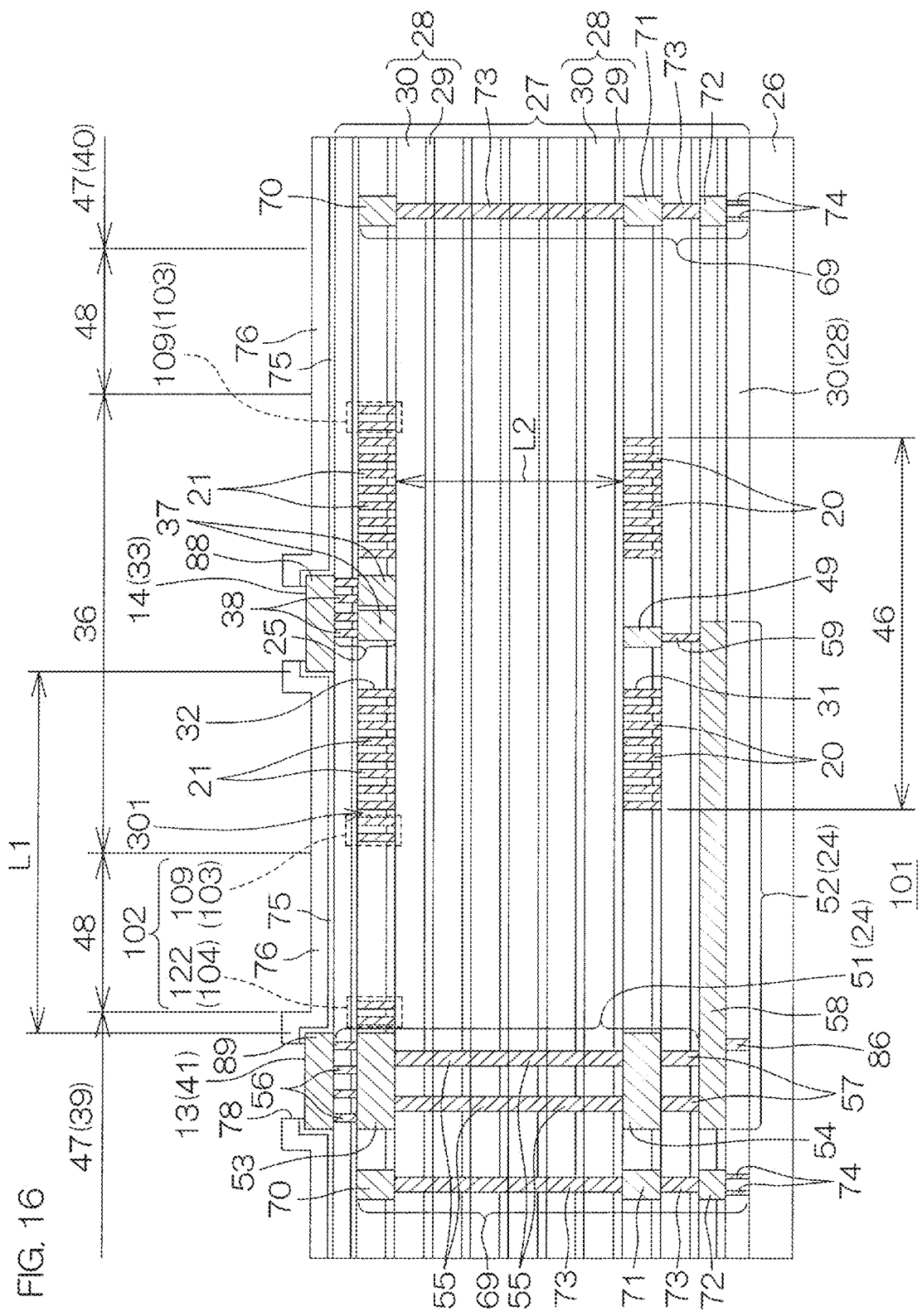
FIG. 16 is a sectional view taken along line XVI-XVI shown in FIG. 12.
Figure 17:
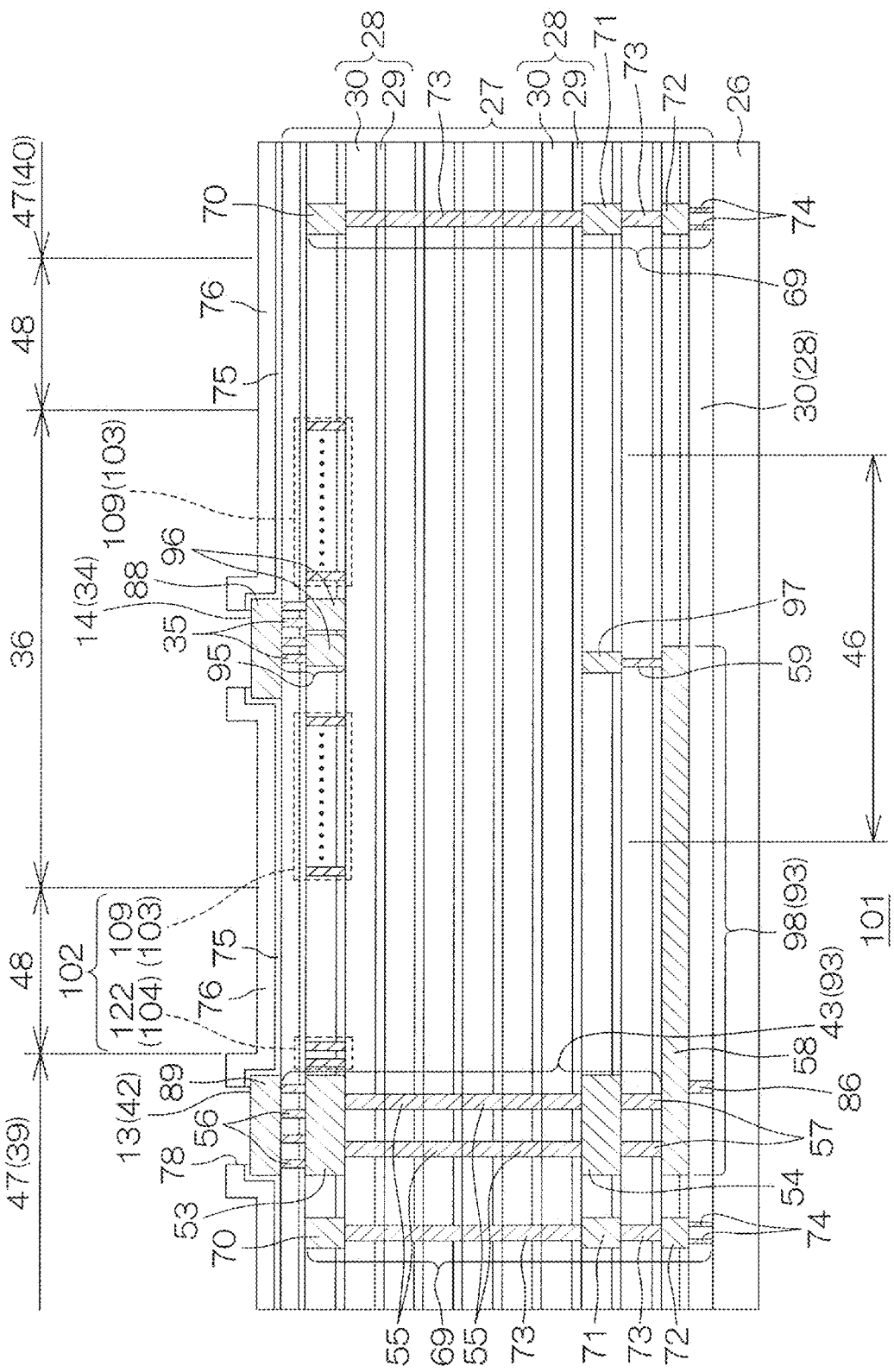
FIG. 17 is a sectional view taken along line XVII-XVII shown in FIG. 12.

The structure of the withstand voltage enhancement structure 102 shall now be described more specifically with reference to FIG. 13 to FIG. 17. FIG. 13 is an enlarged view of a region XIII shown in FIG. 12. FIG. 14 is an enlarged view of a region XIV shown in FIG. 13. FIG. 15 is an enlarged view of a region XV shown in FIG. 13. FIG. 16 is a sectional view taken along line XVI-XVI shown in FIG. 12. FIG. 17 is a sectional view taken along line XVII-XVII shown in FIG. 12.

In FIG. 13, outer contours of the upper coils 21A and 21B are indicated by thick lines for convenience of description. The outer contours of the upper coils 21A and 21B are respectively formed by outer peripheral edges of spiral patterns 105 of one turn each that form outermost peripheries of the upper coils 21A and 21B.

In FIG. 14, an outer contour of a lower coil 20 is indicated by a broken line for convenience of description. The outer contour of the lower coil 20 is formed by an outer peripheral edge of a spiral pattern of one turn that forms an outermost periphery of the lower coil 20. Also, in FIG. 14, the first pad 33 and the second pad 34 of a high voltage pad 14 are respectively indicated by broken lines for convenience of description.

Referring to FIG. 13 and FIG. 14, the upper coils 21A and 21B each include the corresponding inner coil end 22, outer coil end 94, and a spiral pattern 105.

The inner coil ends 22 of the upper coils 21A and 21B are respectively formed inside regions surrounded by outer contours of lower coils 20 in plan view. The outer coil ends 94 of the upper coils 21A and 21B are respectively formed in regions outside the regions surrounded by the outer contours of the lower coils 20 in plan view. The spiral patterns 105 of the upper coils 21A and 21B are respectively wound outwardly from the inner coil ends 22 toward the outer coil ends 94.

The number of turns of the spiral pattern 105 may be not less than 5 and not more than 30 (for example, 15). A width of each spiral pattern 105 may be not less than 0.5 µm and not more than 5 µm. The width of the spiral pattern 105 is preferably not less than 1 µm and not more than 3 µm. The width of the spiral pattern 105 is defined by a width in a direction orthogonal to a spiraling direction.

A winding pitch PTL of the spiral pattern 105 may be not less than 0.1 µm and not more than 10 µm. The winding pitch PTL of the spiral pattern 105 is preferably not less than 1 µm and not more than 3 µm. The winding pitch PTL of the spiral pattern 105 is defined by a distance between two spiral patterns 105 that are mutually adjacent in the direction orthogonal to the spiraling direction.

The inner coil ends 22 of the upper coils 21A and 21B are respectively connected to the inner coil end wirings 37 via inner connection portions 106. The inner connection portions 106 are respectively led out from the inner coil end wirings 37 toward the inner coil ends 22.

The outer coil ends 94 of the upper coils 21A and 21B are respectively connected to the outer coil end wiring 96 via outer connection portions 107. The outer connection portions 107 are respectively led out from the outer coil end wiring 96 toward the outer coil ends 94.

As described with the first preferred embodiment, the structure of the lower coils 20 is substantially the same as the structure of the upper coils 21A and 21B. Specific description of the lower coils 20 is omitted.

Referring to FIG. 13, FIG. 14, and FIG. 17, the first withstand voltage enhancement structure 103 is formed inside the same insulating layer 28 (interlayer insulating film 30) as the upper coils 21A and 21B. The first withstand voltage enhancement structure 103 is formed through a process in common with the upper coils 21A and 21B. The first withstand voltage enhancement structure 103 is thus formed by an electrode layer in common with the upper coils 21A and 21B.

The first withstand voltage enhancement structure 103 is formed along the outer contours of the upper coils 21A and 21B such as to protrude further outward than the outer contours of the lower coils 20 in plan view (see the broken line in FIG. 14). Further, the first withstand voltage enhancement structure 103 is formed along outer contours of the second pads 34 such as to protrude further outward than the outer contours of the second pad 34 in plan view (see the broken lines in FIG. 14).

The first withstand voltage enhancement structure 103 surrounds the upper coils 21A and 21B and the outer coil end wiring 96 formed between the upper coils 21A and 21B altogether. That is, the first withstand voltage enhancement structure 103 is formed to the ring shape (elliptical ring shape) in plan view. The first withstand voltage enhancement structure 103 demarcates the upper coils 21A and 21B and the outer coil end wiring 96 formed between the upper coils 21A and 21B from other regions.

More specifically, the first withstand voltage enhancement structure 103 includes a first dummy conductor pattern group 109 formed by an assembly of a plurality (for example, six) of first dummy conductor patterns 108. In FIG. 16 and FIG. 17, portions of the first dummy conductor pattern group 109 are omitted from illustration. Each of the plurality of first dummy conductor patterns 108 has a discontinuous pattern with respect to the spiral patterns 105 of the upper coils 21A and 21B.

The plurality of first dummy conductor patterns 108 are formed at intervals along directions away from the upper coils 21A and 21B. Each first dummy conductor pattern 108 surrounds the upper coils 21A and 21B and the outer coil end wiring 96 formed between the upper coils 21A and 21B altogether. That is, each first dummy conductor pattern 108 is formed to a ring shape (elliptical ring shape) in plan view.

A width of the first dummy conductor pattern 108 may be not less than 0.5 µm and not more than 5 µm. The width of the first dummy conductor pattern 108 is preferably not less than 1 µm and not more than 3 µm. The width of the first dummy conductor pattern 108 may be equal to the width of each spiral pattern 105. The width of the first dummy conductor pattern 108 is defined by a width in a direction orthogonal to a direction in which the first dummy conductor pattern 108 extends.

In this embodiment, each first dummy conductor pattern 108 includes an open portion 110 at which an electrode layer is not present. The open portion 110 of each first dummy conductor pattern 108 is formed by a portion of the insulating layer 28 (interlayer insulating film 30). Each first dummy conductor pattern 108 is thereby formed to a shape with ends.

The first dummy conductor pattern group 109 includes an inside first dummy conductor pattern 108 positioned at the upper coils 21A and 21B side and an outside first dummy conductor pattern 108 positioned at an opposite side from the upper coils 21A and 21B with respect to the inside first dummy conductor pattern 108.

The outside first dummy conductor pattern 108 extends such as to block the open portion 110 of the inside first dummy conductor pattern 108 from the outside. The open portion 110 of the outside first dummy conductor pattern 108 is formed in a region differing from the open portion 110 of the inside first dummy conductor pattern 108.

By the open portions 110, open circuits that include the first dummy conductor patterns 108 are formed. That is, the open portions 110 prevent a current path from forming in the first dummy conductor patterns 108.

Generation of noise due to the first dummy conductor patterns 108 is thereby suppressed. Obviously, at least one or all of the plurality of first dummy conductor patterns 108 may be of endless shape instead.

The respective first dummy conductor patterns 108 are connected to the outer coil end wiring 96 via a first dummy connection portion 111. The respective first dummy conductor patterns 108 are thereby fixed to be equipotential to the outer coil ends 94 of the upper coils 21A and 21B.

The first dummy connection portion 111 is led out along an arbitrary direction from the outer coil end wiring 96. The first dummy connection portion 111 may be led out from a region differing from the outer connection portions 107. In this embodiment, the first dummy connection portion 111 is led out along the second direction B from a region differing from the outer connection portions 107.

The first withstand voltage enhancement structure 103 includes a first proximal region 112, a second proximal region 113, a first connection region 114, and a second connection region 115. The first proximal region 112, the second proximal region 113, the first connection region 114, and the second connection region 115 are respectively formed by the first dummy conductor pattern group 109.

The first proximal region 112 is proximal to the first upper coil 21A and extends in a U shape along the outer contour of the first upper coil 21A. The first proximal region 112 sandwiches the first upper coil 21A from three directions. The first proximal region 112 demarcates the first upper coil 21A from the low voltage pads 13 (low voltage layer wirings 53) and the shield layer 69.

The second proximal region 113 is proximal to the second upper coil 21B and extends in a U shape along the outer contour of the second upper coil 21B. The second proximal region 113 sandwiches the second upper coil 21B from three directions. The second proximal region 113 demarcates the second upper coil 21B from the low voltage pads 13 (low voltage layer wirings 53) and the shield layer 69.

The first connection region 114 is formed in a line shape extending along the first direction A in a region at the low voltage pad 13 side with respect to the outer coil end wiring 96. The first connection region 114 connects one end of the first proximal region 112 and one end of the second proximal region 113. The first connection region 114 demarcates portions of the upper coils 21A and 21B and the outer coil end wiring 96 from the low voltage pads 13 (low voltage layer wirings 53).

More specifically, the first connection region 114 is formed along the outer contours of the second pads 34 (see the broken lines in FIG. 14) in the region at the low voltage pad 13 side with respect to the outer coil end wiring 96.

The plurality of first dummy conductor patterns 108 included in the first connection region 114 are formed at intervals along a direction away from the second pads 34. The direction away from the second pads 34 is the second direction B.

The second connection region 115 is formed in a line shape extending along the first direction A in a region at an opposite side from the first connection region 114 with respect to the outer coil end wiring 96. The second connection region 115 connects the other end of the first proximal region 112 and the other end of the second proximal region 113. The second connection region 115 demarcates portions of the upper coils 21A and 21B and the outer coil end wiring 96 from the shield layer 69.

More specifically, the second connection region 115 is formed along the outer contours of the second pads 34 (see the broken lines in FIG. 14) in the region at the opposite side from the first connection region 114 with respect to the outer coil end wiring 96.

The plurality of first dummy conductor patterns 108 included in the second connection region 115 are formed at intervals along a direction away from the second pads 34. The direction away from the second pads 34 is the second direction B.

The plurality of first dummy conductor patterns 108 included in the first proximal region 112 and the second proximal region 113 are respectively formed at a first pitch PT1. The first pitch PT1 of the first dummy conductor patterns 108 may be equal to the winding pitch PTL of the spiral pattern 105 (PT1=PTL).

The first pitch PT1 is defined by a distance between the first dummy conductor pattern 108 most proximal to the upper coils 21A and 21B and the upper coils 21A and 21B and a distance between two first dummy conductor patterns 108 that are mutually adjacent.

The plurality of first dummy conductor patterns 108 included in the first connection region 114 and the second connection region 115 are formed at second pitches PTa, PTb, PTc, PTd, PTe, and PTf, respectively.

The second pitch PTa is defined by a distance along the second direction B between the first dummy conductor pattern 108 most proximal to the second pads 34 and the second pads 34. The second pitches PTb to PTf are each defined by a distance along the second direction B of two first dummy conductor patterns 108 that are mutually adjacent.

The second pitches PTa to PTf can each take on values different from the first pitch PT1 (PTa to PTf≠PT1). The second pitches PTa to PTf may be not less than 1 μm and not more than 50 μm. The second pitches PTa to PTf can take on various values in a range of not less than 1 μm to not more than 50 μm. The respective values of the second pitches PTa to PTf shall be described in detail later.

In the first proximal region 112 and the second proximal region 113, a protrusion amount Z1 of the first withstand voltage enhancement structure 103 with respect to the outer contours of the lower coils 20 may exceed 0 μm and be not more than 100 μm (0 μm<Z1≤100 μm). The protrusion amount Z1 may be adjusted by changing the number of the first dummy conductor patterns 108 and the value of the first pitch PT1 thereof.

One configuration example where the electronic component 101 has a withstand voltage of not less than 5000 V is as follows. The insulating layers 28 may have a dielectric breakdown strength of not less than 8 MV/cm and not more than MV/cm.

The insulating layer 28 may include at least one of either of $SiO_2$ and SiN. In this case, the protrusion amount Z1 is preferably not less than 10 μm. More specifically, the protrusion amount Z1 is more preferably not less than 20 μm.

The protrusion amount Z1 is defined by a distance, in the first proximal region 112 and the second proximal region 113, between the outer contours of the lower coils 20 and an outer peripheral edge of the first dummy conductor pattern 108 forming an outermost periphery of the first withstand voltage enhancement structure 103.

The resin package 2 may have a dielectric breakdown strength of not less than 0.1 and not more than 0.3 MV/cm. The resin package 2 may include at least one molded resin among an epoxy resin, a polyimide resin, and a polybenzoxazole resin. The "dielectric breakdown strength" is defined by the maximum value of electric field strength that can be applied without causing dielectric breakdown (the same applies hereinafter).

The first proximal region 112 of the first withstand voltage enhancement structure 103 forms a first coil side withstand voltage enhancement structure 116 that suppresses decrease in withstand voltage at the first upper coil 21A side. More specifically, the first coil side withstand voltage enhancement structure 116 suppresses the decrease in withstand voltage due to an electric field that is formed between the first upper coil 21A and the low voltage pads 13 (low voltage layer wirings 53). Also, the first coil side withstand voltage enhancement structure 116 suppresses the decrease in withstand voltage due to an electric field that is formed between the first upper coil 21A and the shield layer 69.

The second proximal region 113 of the first withstand voltage enhancement structure 103 forms a second coil side withstand voltage enhancement structure 117 that suppresses decrease in withstand voltage at the second upper coil 21B side. More specifically, the second coil side withstand voltage enhancement structure 117 suppresses the decrease in withstand voltage due to an electric field that is formed between the second upper coil 21B and the low voltage pads 13 (low voltage layer wirings 53). Also, the second coil side withstand voltage enhancement structure 117 suppresses the decrease in withstand voltage due to an electric field that is formed between the second upper coil 21B and the shield layer 69.

The first connection region 114 of the first withstand voltage enhancement structure 103 forms a first pad side withstand voltage enhancement structure 118 that suppresses decrease in withstand voltage at the second pad 34 side. More specifically, the first pad side withstand voltage enhancement structure 118 suppresses the decrease in withstand voltage due to an electric field that is formed between the outer coil end wiring 96 and the low voltage pads 13 (low voltage layer wirings 53). Also, the first pad side withstand voltage enhancement structure 118 suppresses the decrease in withstand voltage due to an electric field that is formed between the second pads 34 and the shield layer 69.

The second connection region 115 of the first withstand voltage enhancement structure 103 forms a second pad side withstand voltage enhancement structure 119 that suppresses decrease in withstand voltage at the second pad 34 side. More specifically, the second pad side withstand voltage enhancement structure 119 suppresses the decrease in withstand voltage due to the electric field that is formed between the second pads 34 and the shield layer 69.

Referring to FIG. 13, FIG. 15, and FIG. 17, the second withstand voltage enhancement structure 104 is formed inside the same insulating layer 28 (interlayer insulating film 30) as the upper coils 21A and 21B. The second withstand voltage enhancement structure 104 is formed through a process in common with the upper coils 21A and 21B. The second withstand voltage enhancement structure 104 is thus formed by the electrode layer in common with the upper coils 21A and 21B.

The second withstand voltage enhancement structure 104 includes a second dummy conductor pattern group 122 formed by an assembly of a plurality (for example, three) of second dummy conductor patterns 121. In FIG. 16 and FIG. 17, portions of the second dummy conductor pattern group 122 are omitted from illustration. Each of the plurality of second dummy conductor patterns 121 has a discontinuous pattern with respect to the spiral patterns 105 of the upper coils 21A and 21B.

Each of the plurality of second dummy conductor patterns 121 includes a line shaped pattern that extends in the first direction A. The plurality of second dummy conductor patterns 121 are aligned at intervals from each other along the second direction B.

A width of each second dummy conductor pattern 121 may be not less than 0.5 μm and not more than 5 μm. The width of the second dummy conductor pattern 121 is preferably not less than 1 μm and not more than 3 μm. The width of the second dummy conductor pattern 121 may be equal to the width of each spiral pattern 105.

The width of the second dummy conductor pattern 121 may be equal to the width of each first dummy conductor pattern 108. The width of the second dummy conductor pattern 121 is defined by a width in a direction orthogonal to a direction in which the second dummy conductor pattern 121 extends. The direction orthogonal to the direction in which the second dummy conductor pattern 121 extends is the second direction B.

The plurality of second dummy conductor patterns 121 are respectively formed at a third pitch PT3. The third pitch PT3 may be equal to the winding pitch PTL of the spiral pattern 105 (PT3=PTL).

The third pitch PT3 is defined by a distance between the second dummy conductor pattern 121 most proximal to the low voltage pads 13 and the low voltage pads 13 and a distance between two mutually adjacent second dummy conductor patterns 121 that are mutually adjacent.

Each second dummy conductor pattern 121 is formed to a shape with ends. Open circuits that include the second dummy conductor patterns 121 are thereby formed. That is, the open circuits prevent a current path from forming in the second dummy conductor patterns 121.

Generation of noise due to the second dummy conductor patterns 121 is thereby suppressed. Obviously, at least one or all of the plurality of second dummy conductor patterns 121 may be of endless shape instead.

The respective second dummy conductor patterns 121 are connected to a low voltage layer wiring 53 via a second dummy connection portion 123. The respective second dummy conductor patterns 121 are thereby fixed to be equipotential to the low voltage pads 13 (low voltage layer wirings 53).

The second dummy connection portion 123 is led out from an arbitrary low voltage layer wiring 53 toward a region at the upper coils 21A and 21B side. In this embodiment, the second dummy connection portion 123 is led out from the low voltage layer wiring 53 corresponding to the outer coil end wiring 97 of the lower coils 20.

In this embodiment, the second dummy connection portion 123 is led out in a line shape along the second direction B. One or a plurality of the second dummy connection portion 123 may be led out from one or a plurality of the low voltage layer wiring 53.

A protrusion amount Z2 of the second withstand voltage enhancement structure 104 may exceed 0 μm and be not more than 50 μm (0 μm<Z2≤50 μm). The protrusion amount Z2 of the second withstand voltage enhancement structure 104 is defined by a distance in the second direction B between the outer contours of the low voltage pads 13 and a peripheral edge at the upper coils 21A and 21B side of the second dummy conductor pattern 121 most proximal to the upper coils 21A and 21B.

The second withstand voltage enhancement structure 104 suppresses the decrease in withstand voltage due to the electric field that is formed between the first upper coil 21A and the low voltage pads 13 (low voltage layer wirings 53). Also, the second withstand voltage enhancement structure 104 suppresses the decrease in withstand voltage due to the electric field that is formed between the second upper coil 21B and the low voltage pads 13 (low voltage layer wirings 53). Also, the second withstand voltage enhancement structure 104 suppresses decrease in withstand voltage due to an electric field that is formed between the second pads 34 and the low voltage pads 13 (low voltage layer wirings 53).

Next, a relationship between the withstand voltage enhancement structure 102 and electric field strength and a relationship between the withstand voltage enhancement structure 102 and dielectric breakdown resistance shall be described specifically. It shall be deemed that the electric field strength includes a peak value of the electric field strength.

Although in the following, a description shall be provided with the first coil side withstand voltage enhancement structure 116 as an example, the same description also holds for the second coil side withstand voltage enhancement structure 117. It is therefore deemed that the description related to the first coil side withstand voltage enhancement structure 116 applies to a description related to the second coil side withstand voltage enhancement structure 117 and the description related to the second coil side withstand voltage enhancement structure 117 is omitted.

Also, although in the following, a description shall be provided with the first pad side withstand voltage enhancement structure 118 as an example, the same description also holds for the second pad side withstand voltage enhancement structure 119. It is therefore deemed that the description related to the first pad side withstand voltage enhancement structure 118 applies to a description related to the second pad side withstand voltage enhancement structure 119 and the description related to the second pad side withstand voltage enhancement structure 119 is omitted.

To examine a relationship between the protrusion amount Z1 of the first withstand voltage enhancement structure 103 and the electric field strength in the first coil side withstand voltage enhancement structure 116, six samples A1, B1, C1, D1, E1, and F1 were prepared as indicated in Table 1 below.

TABLE 1

| Sample | A1 | B1 | C1 | D1 | E1 | F1 |
|---|---|---|---|---|---|---|
| Protrusion amount Z1 | 0 μm | 10 μm | 20 μm | 30 μm | 40 μm | 50 μm |

Sample A1 is an electronic component according to a reference example. The electronic component according to the reference example has the same structure as the electronic component 101 according to the present preferred embodiment with the exception of not including the withstand voltage enhancement structure 102. Description is omitted in regard to the structure of the electronic component according to the reference example (the same applies hereinafter).

Sample B1 is the electronic component 101 with which the protrusion amount Z1 of the first withstand voltage enhancement structure 103 is set to 10 μm. Sample C1 is the electronic component 101 with which the protrusion amount Z1 of the first withstand voltage enhancement structure 103 is set to 20 μm.

Sample D1 is the electronic component 101 with which the protrusion amount Z1 of the first withstand voltage enhancement structure 103 is set to 30 μm. Sample E1 is the electronic component 101 with which the protrusion amount Z1 of the first withstand voltage enhancement structure 103 is set to 40 μm. Sample F1 is the electronic component 101 with which the protrusion amount Z1 of the first withstand voltage enhancement structure 103 is set to 50 μm.

Figure 18:
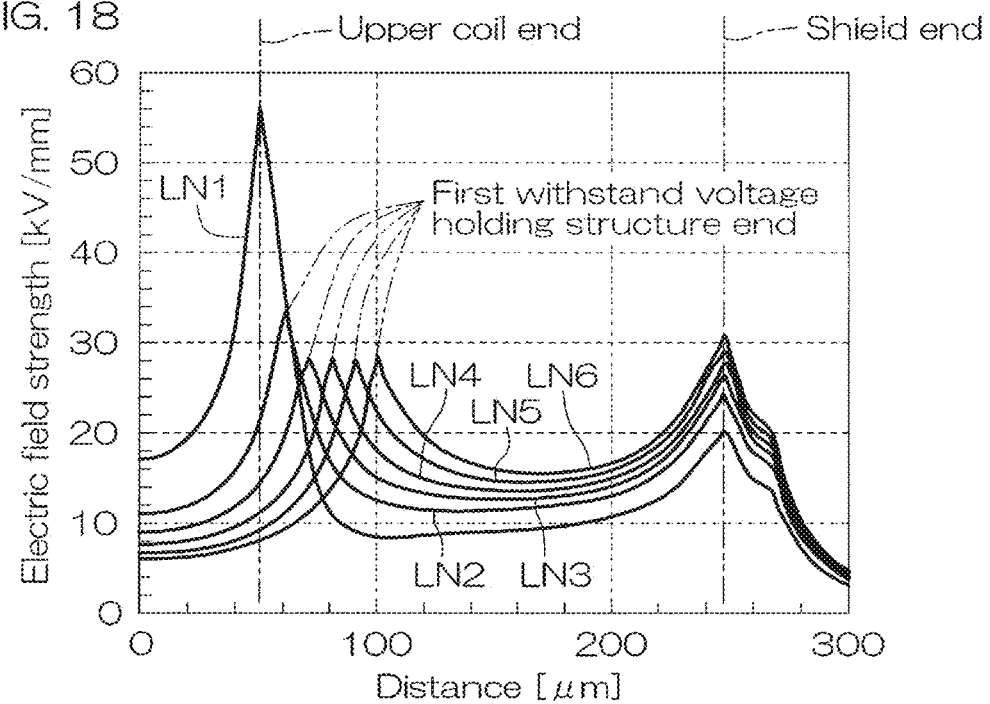
FIG. 18 is a graph of a relationship between a protrusion amount of a first withstand voltage enhancement structure and electric field strength determined by simulation.

FIG. 18 is a graph of a relationship between the protrusion amount Z1 of the first withstand voltage enhancement structure 103 and the electric field strength determined by simulation. In FIG. 18, the ordinate represents the electric field strength [kV/ram] and the abscissa represents a distance [μm] between the first withstand voltage enhancement structure 103 and the shield layer 69.

In the following, outer contours (outermost peripheral edges) of the upper coils 21A and 21B shall be referred to simply as the "upper coil ends." Also, an outer contour (outermost peripheral edge) of the first withstand voltage enhancement structure 103 shall be referred to simply as the "first withstand voltage enhancement structure end." Also, an inner contour (inner peripheral edge) of the shield layer 69 shall be referred to simply as the "shield layer end."

In FIG. 18, a first curve LN1, a second curve LN2, a third curve LN3, a fourth curve LN4, a fifth curve LN5, and a sixth curve LN6 are shown.

The first curve LN1 represents the simulation results for sample A1. The second curve LN2 represents the simulation results for sample B1. The third curve LN3 represents the simulation results for sample C1.

The fourth curve LN4 represents the simulation results for sample D1. The fifth curve LN5 represents the simulation results for sample E1. The sixth curve LN6 represents the simulation results for sample F1.

Referring to the first curve LN1, the electric field strength at the upper coil ends side of sample A1 was 56 kV/mm. Referring to the second curve LN2, the electric field strength at the first withstand voltage enhancement structure end of sample B1 was 34 kV/ram. Referring to the third curve LN3, the electric field strength at the first withstand voltage enhancement structure end of sample C1 was 28 kV/ram.

Referring to the fourth curve LN4, the electric field strength at the first withstand voltage enhancement structure end of sample D1 was 28 kV/mm. Referring to the fifth curve LN5, the electric field strength at the first withstand voltage enhancement structure end of sample E1 was 28 kV/ram. Referring to the sixth curve LN6, the electric field strength at the first withstand voltage enhancement structure end of sample F1 was 28 kV/ram.

The electric field strength at the upper coil ends of sample A1 was thus higher than the electric field strengths of samples B1 to F1. That is, with sample A1 that does not have the first withstand voltage enhancement structure 103, the concentration of electric field on the upper coil ends was significant. On the other hand, it was found that the concentration of electric field on the upper coil ends is relaxed with samples B1 to F1 each having the first withstand voltage enhancement structure 103.

Referring to the first curve LN1, the electric field strength at the shield layer end of sample A1 was 20 kV/ram. Referring to the second curve LN2, the electric field strength at the shield layer end of sample B1 was 24 kV/ram. Referring to the third curve LN3, the electric field strength at the shield layer end of sample C1 was 26 kV/ram.

Referring to the fourth curve LN4, the electric field strength at the shield layer end of sample D1 was 28 kV/mm. Referring to the fifth curve LN5, the electric field strength at the shield layer end of sample E1 was 29 kV/mm. Referring to the sixth curve LN6, the electric field strength at the shield layer end of sample F1 was 30 kV/mm.

The electric field strength at the shield layer end increased such as to be proportional to the increase in the protrusion amount Z1 of the first withstand voltage enhancement structure 103. These results are in accordance with the physical law that electric field is inversely proportional to distance.

As described above, from the first curve LN1 to the sixth curve LN6, it was found that the concentration of electric field on the upper coil ends is relaxed as long as the protrusion amount Z1 of the first withstand voltage enhancement structure 103 is not set to zero (that is, as long as the protrusion amount Z1>0). On the other hand, when the protrusion amount Z1 of the first withstand voltage enhancement structure 103 exceeds μm, the electric field strength at the first withstand voltage enhancement structure end converged to approximately 28 kV/mm.

That is, it was found that when the protrusion amount Z1 of the first withstand voltage enhancement structure 103 exceeds a certain value (20 μm in the present case), the electric field strength at the first withstand voltage enhancement structure 103 side is determined by a distance between the first withstand voltage enhancement structure end and the shield layer end. This is also one of the reasons why the electric field strength at the shield layer end increased.

The results of FIG. 18 are summarized as follows. It is preferable to provide the first withstand voltage enhancement structure 103 (first coil side withstand voltage enhancement structure 116). Trailing ends of the electric fields that are formed between the upper coils 21A and 21B and the lower coils 20 can thereby be shifted from the upper coils 21A and 21B side to the first withstand voltage enhancement structure 103 side.

Also, the first withstand voltage enhancement structure 103 protrudes outward from the outer contours of the upper coils 21A and 21B. The electric fields that are formed between the lower coils 20 and the upper coils 21A and 21B can thus be shielded by the first withstand voltage enhancement structure 103. The electric field can thereby be suppressed from forming such as to wrap around end portions of the upper coils 21A and 21B.

Consequently, the concentration of electric field on the upper coils 21A and 21B can be relaxed. More specifically, the concentration of electric field on the upper coil ends (first withstand voltage enhancement structure end) can be relaxed in the region between the upper coils 21A and 21B and the low voltage pads 13. Also, the concentration of electric field on the upper coil ends (first withstand voltage enhancement structure end) can be relaxed in the region between the upper coils 21A and 21B and the shield layer 69.

Preferably, the protrusion amount Z1 of the first withstand voltage enhancement structure 103 exceeds 0 μm. That "the protrusion amount Z1 exceeds 0 μm" means that a first dummy conductor pattern 108 is formed.

The protrusion amount Z1 of the first withstand voltage enhancement structure 103 may be not less than 10 μm and not more than 50 μm. In this case, the electric field strength at the first withstand voltage enhancement structure end becomes not more than 34 kV/ram and the concentration of electric field on the upper coil ends can be relaxed. Also, in this case, an absolute value of a difference between the electric field strength at the first withstand voltage enhancement structure end and the electric field strength at the shield layer end becomes not more than 15 kV/ram.

The protrusion amount Z1 of the first withstand voltage enhancement structure 103 is preferably not less than 20 μm and not more than 50 μm. In this case, the electric field strength at the first withstand voltage enhancement structure end becomes not more than 30 kV/ram and the concentration of electric field on the upper coil ends can be relaxed. Also, in this case, the absolute value of the difference between the electric field strength at the first withstand voltage enhancement structure end and the electric field strength at the shield layer end becomes not more than 5 kV/ram.

To examine a relationship between the second withstand voltage enhancement structure 104 and the electric field strength, four samples A2, B2, C2, and D2 were prepared as indicated in Table 2 below.

TABLE 2

| Sample | A2 | B2 | C2 | D2 |
| --- | --- | --- | --- | --- |
| Number of second dummy patterns 121 | 0 pcs | 3 pcs | 6 pcs | 12 pcs |

Sample A2 is the electronic component according to the reference example. Sample B2 is the electronic component 101 that includes three second dummy conductor patterns 121. Sample C2 is the electronic component 101 that includes six second dummy conductor patterns 121. Sample D2 is the electronic component 101 that includes twelve second dummy conductor patterns 121.

Figure 19:
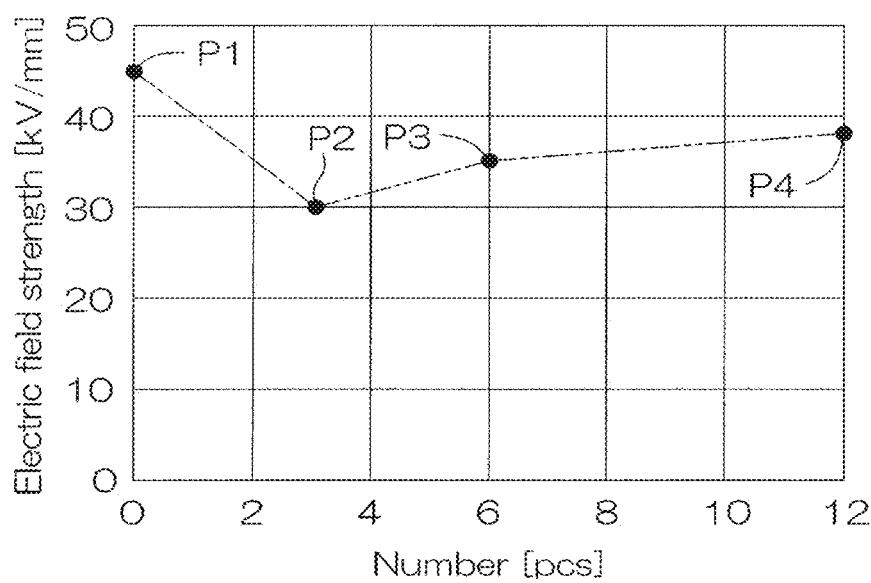
FIG. 19 is a graph of a relationship between the number of second dummy conductor patterns and electric field strength determined by simulation.

FIG. 19 is a graph of a relationship between the number of the second dummy conductor patterns 121 and the electric field strength determined by simulation. In FIG. 19, the ordinate represents the electric field strength [kV/ram] and the abscissa represents the number [pcs] of the second dummy conductor patterns 121.

In the following, peripheral edges of the low voltage pads 13 at the upper coils 21A and 21B side shall be referred to simply as the "low voltage pad ends." Also, a peripheral edge of the second withstand voltage enhancement structure 104 at the upper coils 21A and 21B side shall be referred to simply as the "second withstand voltage enhancement structure end."

In FIG. 19, a first plotted point P1, a second plotted point P2, a third plotted point P3, and a fourth plotted point P4 are indicated.

The first plotted point P1 represents the electric field strength at the low voltage pad ends in sample A2. The second plotted point P2 represents the electric field strength at the second withstand voltage enhancement structure end in sample B2.

The third plotted point P3 represents the electric field strength at the second withstand voltage enhancement structure end in sample C2. The fourth plotted point P4 represents the electric field strength at the second withstand voltage enhancement structure end in sample D2.

Referring to the first plotted point P1, the electric field strength at the low voltage pad ends in sample A2 was 45 kV/ram. Referring to the second plotted point P2, the electric field strength at the second withstand voltage enhancement structure end in sample B2 was 30 kV/ram.

Referring to the third plotted point P3, the electric field strength at the second withstand voltage enhancement structure end in sample C2 was 35 kV/mm. Referring to the fourth plotted point P4, the electric field strength at the second withstand voltage enhancement structure end in sample D2 was 38 kV/ram.

The electric field strength at the low voltage pad ends of sample A2 was thus higher than the electric field strengths at the second withstand voltage enhancement structure ends of samples B2 to D2. That is, with sample A2 that does not have the second withstand voltage enhancement structure end, the concentration of electric field on the low voltage pad ends was significant. On the other hand, it was found that the concentration of electric field on the low voltage pad ends is relaxed with samples B2 to D2 each having the second withstand voltage enhancement structure end.

Although unillustrated, in sample B2, the electric field strength at the upper coil ends was 25 kV/ram. Although unillustrated, in sample C2, the electric field strength at the upper coil ends was 30 kV/ram. Although unillustrated, in sample D2, the electric field strength at the upper coil ends was 31 kV/ram.

The electric field strength at the upper coil end increased such as to be proportional to the increase in the number of the second dummy conductor patterns 121. These results are in accordance with the physical law that electric field is inversely proportional to distance.

As described above, it was found that the concentration of electric field on the low voltage pads 13 is relaxed by forming the second withstand voltage enhancement structure 104. On the other hand, it was found that the effect of suppressing the concentration of electric field on the low voltage pads 13 is not necessarily improved by increasing the number of second dummy conductor patterns 121.

The results of FIG. 19 are summarized as follows. It is preferable to provide the second withstand voltage enhancement structure 104. The concentration of electric field on the low voltage pad ends (second withstand voltage holding region end) can thereby be relaxed in the region between the low voltage pads 13 and the upper coils 21A and 21B. Also, the concentration of electric field on the low voltage pad ends (second withstand voltage holding region end) can be relaxed in a region between the low voltage pads 13 and the second pads 34.

Preferably, the protrusion amount Z2 of the second withstand voltage enhancement structure 104 exceeds 0 μm. That "the protrusion amount Z2 exceeds 0 μm" practically means that a second dummy conductor pattern 121 is formed.

The number of the second dummy conductor patterns 121 may be not more than 12. In this case, the protrusion amount Z2 of the second withstand voltage enhancement structure 104 may exceed 0 μm and be not more than 50 μm. In this case, the electric field strength on the second withstand voltage enhancement structure 104 becomes not more than 35 kV/ram and the concentration of electric field on the low voltage pad ends (second withstand voltage holding region end) can be relaxed. In this case, an absolute value of a difference between the electric field strength at the second withstand voltage enhancement structure end and the electric field strength at the upper coil ends may be not more than 10 kV/ram.

The number of the second dummy conductor patterns 121 may be not more than 6. In this case, the protrusion amount Z2 of the second withstand voltage enhancement structure 104 may exceed 0 μm and be not more than 25 μm. In this case, the electric field strength on the low voltage pad ends becomes not more than 35 kV/mm and the concentration of electric field on the low voltage pad ends (second withstand voltage holding region end) can be relaxed. In this case, the absolute value of the difference between the electric field strength at the second withstand voltage enhancement structure end and the electric field strength at the upper coil ends may be not more than 5 kV/mm.

The number of the second dummy conductor patterns 121 may be not more than 3. In this case, the protrusion amount Z2 of the second withstand voltage enhancement structure 104 may exceed 0 μm and be not more than 10 μm. In this case, the electric field strength on the low voltage pad ends becomes not more than 30 kV/mm and the concentration of electric field on the low voltage pad ends (second withstand voltage holding region end) can be relaxed. In this case, the absolute value of the difference between the electric field strength at the second withstand voltage enhancement structure end and the electric field strength at the upper coil ends may be not more than 5 kV/mm.

To examine a relationship between the first pad side withstand voltage enhancement structure 118 and the electric field strength, three samples A3, B3, and C3 were prepared as indicated in Table 3 below. With the three samples A3, B3, and C3, the second pitches PTa to PTf (see also FIG. 14) are respectively set to the values as indicated in Table 3 below.

In the following, end portions of the second pads 34 at the low voltage pads 13 (low voltage layer wirings 53) side shall be referred to simply as the "second pad ends." Also, an end portion of the first pad side withstand voltage enhancement structure 118 (first withstand voltage enhancement structure 103) at the low voltage pads 13 (low voltage layer wirings 53) side shall be referred to simply as the "first pad side withstand voltage enhancement structure end."

TABLE 3

|  | Reference Example | Sample A3 | Sample B3 | Sample C3 |
|---|---|---|---|---|
| Second pitch PTa |  | 20 μm | 1 μm | 5 μm |
| Second pitch PTb |  | 20 μm | 10 μm | 10 μm |
| Second pitch PTc |  | 20 μm | 20 μm | 30 μm |
| Second pitch PTd |  | 20 μm | 20 μm | 30 μm |
| Second pitch PTe |  | 10 μm | 20 μm | 10 μm |
| Second pitch PTf |  | 1 μm | 20 μm | 5 μm |
| Total value |  | 91 μm | 91 μm | 90 μm |
| Electric field strength | 66 kV/mm | 25 kV/mm | 9 kV/mm | 5 kV/mm |

Here, the electric field strength at the first pad side withstand voltage enhancement structure end (second pad ends) was determined for samples A3 to C3. The electric field strength at the second pad end of the electronic component according to the reference example is also shown in Table 3.

The electric field strength at the first pad side withstand voltage enhancement structure end in sample A3 was kV/ram. The electric field strength at the first pad side withstand voltage enhancement structure end in sample B3 was 9 kV/ram. The electric field strength at the first pad side withstand voltage enhancement structure end in sample C3 was kV/mm.

From the above, it was found that even when total values of the second pitches PTa to PTf are set to be substantially equal, the electric field strength at the second pad ends is changed by differing the values of the second pitches PTa to PTf.

In particular, it was found that the electric field strength at the second pad ends can be relaxed appropriately by setting the second pitch PTa to not more than 10 μm as in sample B3 and sample C3.

The results of Table 3 are summarized as follows. It is preferable to form the first pad side withstand voltage enhancement structure 118 (first withstand voltage enhancement structure 103) along the second pads 34. The concentration of electric field on the second pad ends can thereby be relaxed.

Preferably, the second pitch PTa between the first dummy conductor pattern 108 most proximal to the second pads 34 and the second pads 34 is not more than the second pitches PTb to PTf. The trailing ends of the electric fields that are formed between the upper coils 21A and 21B and the lower coils can thereby be shifted from the second pad ends to the first dummy conductor pattern 108 most proximal to the second pad ends. The concentration of electric field on the second pad ends can thereby be relaxed appropriately.

Also, the second pitch PTa is preferably not more than a vertical direction distance L2 between the upper coils 21A and 21B and the lower coils 20 (PTa L2). The vertical direction distance L2 is the total thickness L2 of the insulating layers 28 between the lower coils 20 and the upper coils 21.

The second pitch PTa most proximal to the second pads 34 is preferably not more than 10 μm (PTa 10 μm). The electric field strength at the first pad side withstand voltage enhancement structure end thereby becomes not more than 10 kV/mm and the electric field strength at the second pad ends can be decreased effectively.

The second pitches PTa to PTf of the first pad side withstand voltage enhancement structure 118 do not necessarily have to be set to the values in Table 3 above. The second pitches PTa to PTf of the first pad side withstand voltage enhancement structure 118 may be set to any of various values based on the electric field strength to be relaxed between the second pads 34 and the low voltage pads 13.

The second pitches PTa to PTf of the second pad side withstand voltage enhancement structure 119 do not necessarily have to be set to be the same as the second pitches PTa to PTf of the first pad side withstand voltage enhancement structure 118. The second pitches PTa to PTf of the second pad side withstand voltage enhancement structure 119 may be set to any of various values based on the electric field strength to be relaxed between the second pads 34 and the shield layer 69.

Figure 20:
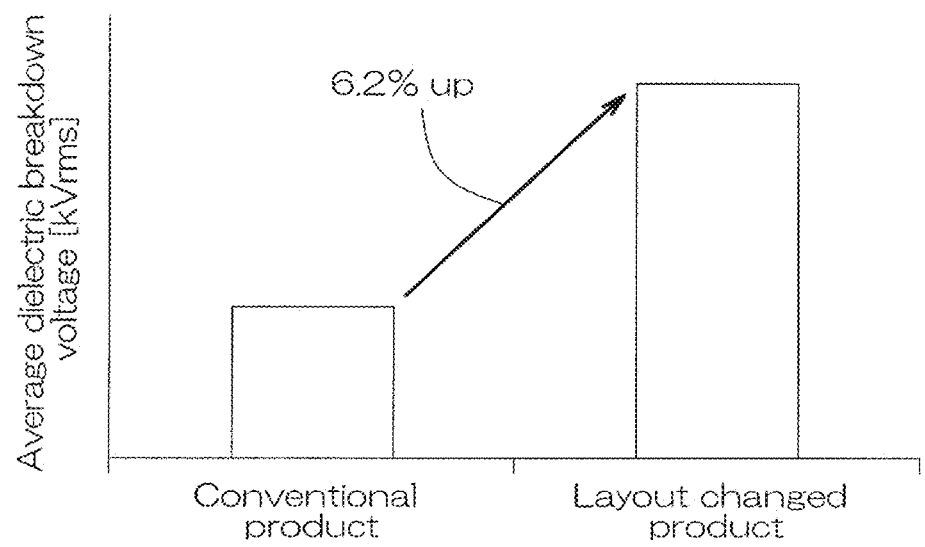
FIG. 20 is a graph comparing an average dielectric breakdown voltage of an electronic component according to a reference example of the present invention and an average dielectric breakdown voltage of the electronic component according to the second preferred embodiment of the present invention.

FIG. 20 is a graph comparing an average dielectric breakdown voltage of the electronic component according to the reference example of the present invention and an average dielectric breakdown voltage of the electronic component 101. In FIG. 20, the ordinate represents the average dielectric breakdown voltage [kVrms].

Referring to FIG. 20, the average dielectric breakdown voltage of the electronic component 101 was increased by 6.2% with respect to the average dielectric breakdown voltage of the electronic component according to the reference example. From this, it was found that the average dielectric breakdown voltage can be improved by the withstand voltage enhancement structure 102.

As described above, with the electronic component 101, the concentration of electric field on respective members can be relaxed by the withstand voltage enhancement structure 102. The electronic component 101 that enables improvement of the dielectric breakdown resistance can thus be provided.

Figure 21:
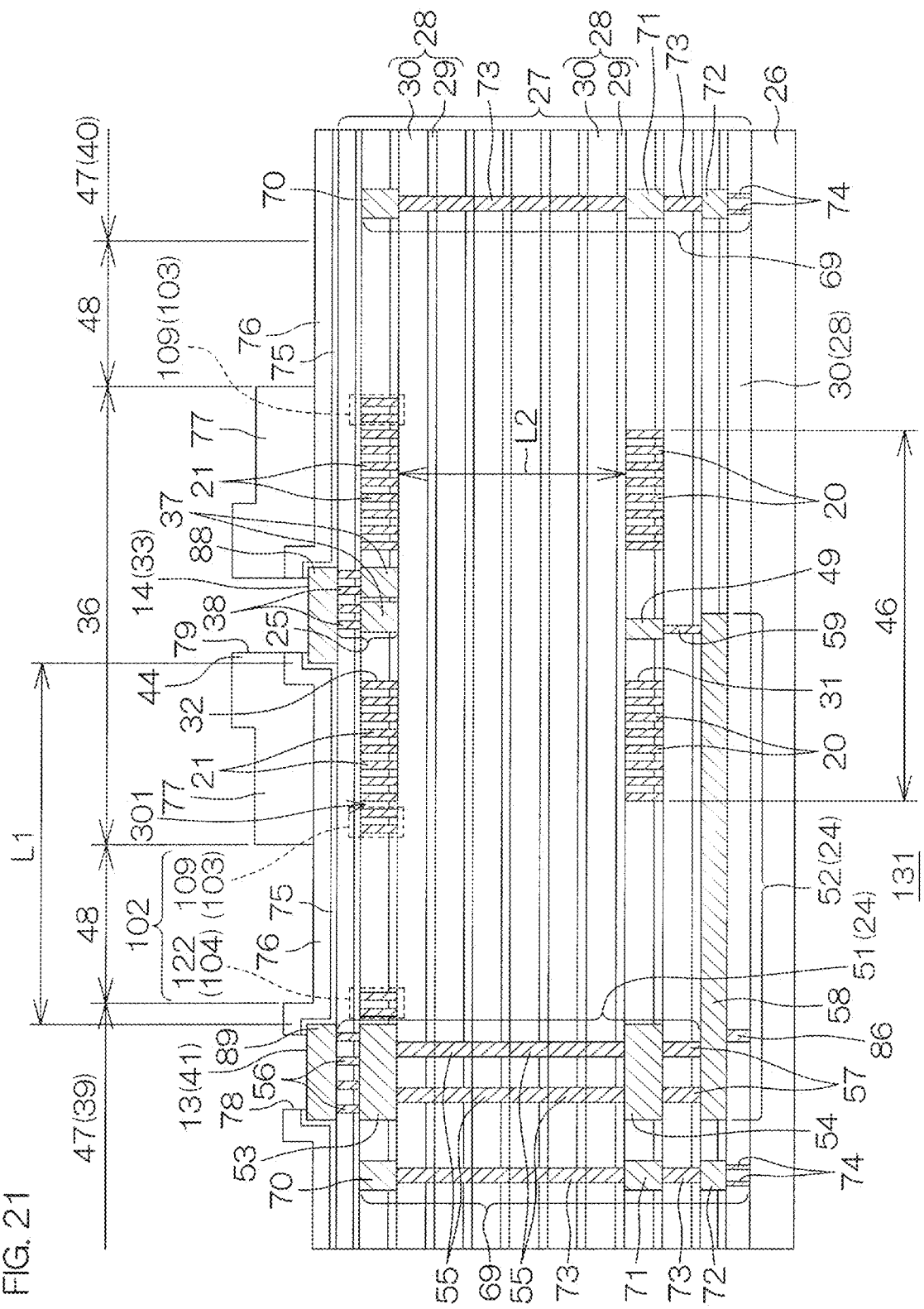
FIG. 21 is a diagram of a portion corresponding to FIG. 16 and is a sectional view of an electronic component according to a third preferred embodiment of the present invention.

FIG. 21 is a diagram of a portion corresponding to FIG. 16 and is a sectional view of an electronic component 131 according to a third preferred embodiment of the present invention. With this embodiment, structures corresponding to structures of the electronic component 101 are provided with the same reference symbols and description thereof is omitted.

Referring to FIG. 21, the electronic component 131 includes the resin films 77 (see also FIG. 3, etc.). In this embodiment, each resin film 77 overlaps with each first withstand voltage enhancement structure 103 in plan view. More specifically, the resin film 77 covers an entirety of the first withstand voltage enhancement structure 103.

The upper coils 21A and 21B and the first withstand voltage enhancement structure 103 are thus arranged within a region surrounded by an outer peripheral edge of the resin film 77 in plan view.

The resin film 77 may cover a front surface of a portion of the insulating layer laminated structure 27. The resin film 77 may cover an entirety of the front surface of the insulating layer laminated structure 27.

With the electronic component 131 described above, the same effects as the effects described with the first preferred embodiment can be exhibited in addition to the effects described with the second preferred embodiment.

FIG. 22 is a diagram of a portion corresponding to FIG. 14 and is a diagram for describing the planar structure at the first upper coil 21A side of an electronic component 141 according to a fourth preferred embodiment of the present invention. With this embodiment, structures corresponding to the structures of the electronic component 101 are provided with the same reference symbols and description thereof is omitted.

In the electronic component 141, the spiral pattern 105 of each of the upper coils 21A and 21B include a first spiral pattern 142 and a second spiral pattern 143. The first spiral pattern 142 is routed to be wound outwardly in regions facing the lower coils 20 in plan view.

The second spiral pattern 143 is routed to be wound outwardly continuously from the first spiral pattern 142 in regions outside the lower coils 20 in plan view. The second spiral pattern 143 is connected to the outer coil end wiring 96.

The first withstand voltage enhancement structure 103 can include the second spiral pattern 143. That is, the first coil side withstand voltage enhancement structure 116 and the second coil side withstand voltage enhancement structure 117 can each include the second spiral pattern 143.

In this embodiment, a total protrusion amount Z4 of the second spiral pattern 143 and the first withstand voltage enhancement structure 103 with respect to the outer contours of the lower coils 20 applies in place of the protrusion amount Z1. The total protrusion amount Z4 may exceed 0 μm and be not more than 100 μm.

The total protrusion amount Z4 is defined by a sum (=Z3+Z1) of a protrusion amount Z3 of the second spiral pattern 143 with respect to the outer contours of the lower coils 20 and the protrusion amount Z1 of the first withstand voltage enhancement structure 103 with respect to the outer contours of the second spiral pattern 143 (outer contours of the upper coils 21A and 21B).

The total protrusion amount Z4 may be adjusted by changing the number of turns and the winding pitch PTL of the second spiral pattern 143. The total protrusion amount Z4 may be adjusted by changing the number of the first dummy conductor patterns 108 and the value of the first pitch PT1 thereof.

Next, a relationship between the second spiral pattern 143 and the electric field strength shall be described. Here, to examine the relationship between the second spiral pattern 143 and the electric field strength, three samples A4, B4, and C4, shown in FIG. 23, FIG. 24, and FIG. 25 were prepared.

FIG. 23 is a plan view of an upper coil 21 (upper coil 21A or 21B) of sample A4 of the electronic component 141 shown in FIG. 22. FIG. 24 is a plan view of an upper coil 21 (upper coil 21A or 21B) of sample B4 of the electronic component 141 shown in FIG. 22. FIG. 25 is a plan view of an upper coil 21 (upper coil 21A or 21B) of sample C4 of the electronic component 141 shown in FIG. 22.

In each of FIG. 23, FIG. 24, and FIG. 25, the upper coil 21 is represented by an elliptical annular shape and the outer contour of a lower coil 20 is represented by a broken line for convenience of description. The structure of the lower coils 20 is the same as the structure of the upper coils 21A and 21B with the exception of differing in the number of turns and therefore specific description shall be omitted in regard to FIG. 23, FIG. 24, and FIG. 25.

Also, with FIG. 23, FIG. 24, and FIG. 25, in order to examine the relationship between the second spiral pattern 143 and the electric field strength, the first withstand voltage enhancement structure 103 is not formed. That is, the protrusion amount Z1 of the first withstand voltage enhancement structure 103 is zero (protrusion amount Z1=0).

Referring to FIG. 23, with sample A4, the number of turns of the lower coil 20 is 13. On the other hand, in the upper coils 21A and 21B, the number of turns of the first spiral pattern 142 is 13 and the number of turns of the second spiral pattern 143 is 2. The total protrusion amount Z4 is not less than 8 μm and not more than 13 μm (here, approximately μm).

Referring to FIG. 24, with sample B4, the number of turns of the lower coil 20 is 10. On the other hand, in the upper coils 21A and 21B, the number of turns of the first spiral pattern 142 is 10 and the number of turns of the second spiral pattern 143 is 5. The total protrusion amount Z4 is not less than 17 μm and not more than 23 μm (here, approximately μm).

Referring to FIG. 25, with sample C4, the number of turns of the lower coil 20 is 7. On the other hand, in the upper coils 21A and 21B, the number of turns of the first spiral pattern 142 is 7 and the number of turns of the second spiral pattern 143 is 8. The total protrusion amount Z4 is not less than 27 μm and not more than 33 μm (here, approximately 30 μm).

Figure 26:
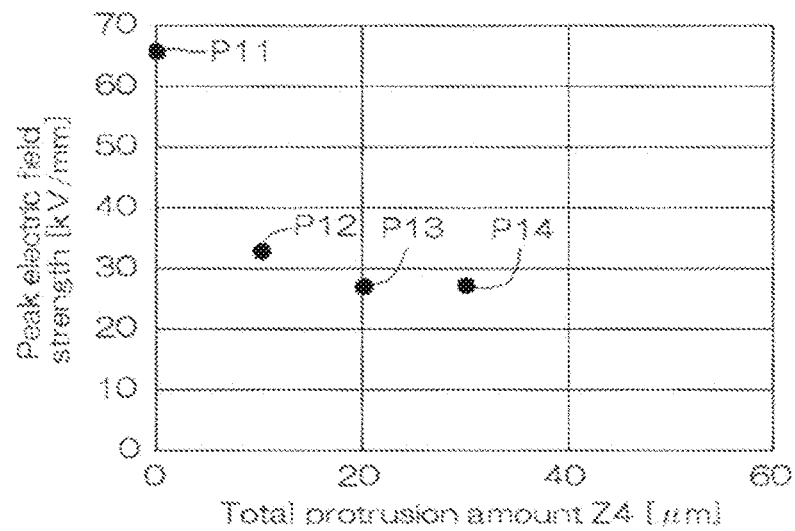
FIG. 26 is a graph of electric field strength measurement results of the sample shown in FIG. 23, the sample shown in FIG. 24, and the sample shown FIG. 25.

FIG. 26 is a graph of electric field strength measurement results of sample A4, sample B4, and sample C4. In FIG. 26, the ordinate represents the electric field strength [kV/mm] and the abscissa represents the total protrusion amount Z4 [μm].

In FIG. 26, a first plotted point P11, a second plotted point P12, a third plotted point P13, and a fourth plotted point P14 are indicated.

The first plotted point P11 represents the electric field strength at the upper coil ends of the electronic component according to the reference example. The second plotted point P12 represents the electric field strength at end portions of the second spiral pattern 143 of sample A4.

The third plotted point P13 represents the electric field strength at the end portions of the second spiral pattern 143 of sample B4. The fourth plotted point P14 represents the electric field strength at the end portions of the second spiral pattern 143 of sample C4.

Referring to the first plotted point P11, the electric field strength at the upper coil ends in the electronic component according to the reference example was 66 kV/mm.

Referring to the second plotted point P12, the electric field strength at the end portions of the second spiral pattern 143 of sample A4 was not less than 30 kV/mm and not more than 35 kV/mm.

Referring to the third plotted point P13, the electric field strength at the end portions of the second spiral pattern 143 of sample B4 was not less than 25 kV/ram and not more than 30 kV/ram.

Referring to the fourth plotted point P14, the electric field strength at the end portions of the second spiral pattern 143 of sample C4 was not less than 25 kV/ram and not more than 30 kV/ram.

The electric field strength at the upper coil ends of the electronic component according to the reference example was thus higher than the respective electric field strengths of the three samples A4, B4, and C4. That is, with the electronic component according to the reference example that does not have the second spiral pattern 143, the concentration of electric field on the upper coil ends was significant. On the other hand, it was found that with samples A4, B4, and C4 each having the second spiral pattern 143, the concentration of electric field is relaxed by the second spiral pattern 143.

From the above, it was found that the concentration of electric field on the upper coil ends is relaxed as long as the total protrusion amount Z4 is not set to zero.

Figure 27:
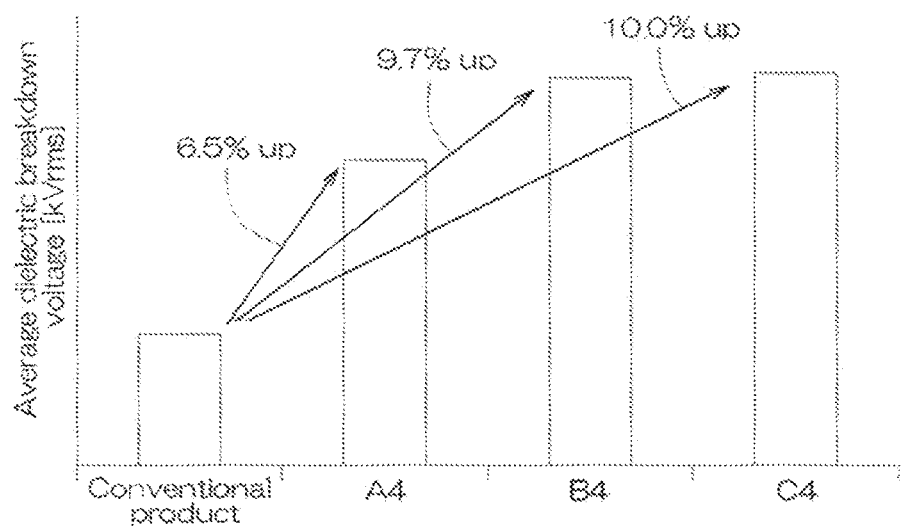
FIG. 27 is a graph comparing the average dielectric breakdown voltage of the electronic component according to the reference example of the present invention, an average dielectric breakdown voltage of the sample shown in FIG. 23, an average dielectric breakdown voltage of the sample shown in FIG. 24, and an average dielectric breakdown voltage of the sample shown in FIG. 25.

FIG. 27 is a graph comparing the average dielectric breakdown voltage of the electronic component according to the reference example of the present invention, an average dielectric breakdown voltage of sample A4 shown in FIG. 23, an average dielectric breakdown voltage of sample B4 shown in FIG. 24, and an average dielectric breakdown voltage of sample C4 shown in FIG. 25. In FIG. 27, the ordinate represents the average dielectric breakdown voltage [kVrms].

Referring to FIG. 27, the average dielectric breakdown voltage of sample A4 was increased by 6.5% with respect to the average dielectric breakdown voltage of the electronic component according to the reference example. The average dielectric breakdown voltage of sample B4 was increased by 9.7% with respect to the average dielectric breakdown voltage of the electronic component according to the reference example.

The average dielectric breakdown voltage of sample C4 was increased by 10.0% with respect to the average dielectric breakdown voltage of the electronic component according to the reference example.

From this, it was found that the average dielectric breakdown voltage can be increased, that is, the dielectric breakdown resistance can be improved by increasing the total protrusion amount Z4.

The results of FIG. 26 and FIG. 27 are summarized as follows. Each of the first coil side withstand voltage enhancement structure 116 and the second coil side withstand voltage enhancement structure 117 can include the second spiral patterns 143 of the upper coils 21A and 21B. Since the electric field strength is inversely proportional to distance, it is preferable to provide the first withstand voltage enhancement structure 103 and/or the second spiral pattern 143 in accordance with the electric field strength to be relaxed.

The concentration of electric field on the second spiral pattern 143 can thus be relaxed in a region between the second spiral pattern 143 and the low voltage pads 13. Also, the concentration of electric field on the second spiral pattern 143 can be relaxed in a region between the second spiral pattern 143 and the shield layer 69.

The total protrusion amount Z4 may be not less than 5 μm and not more than 11 μm. In this case, the electric field strength at the end portions of the second spiral pattern 143 becomes not less than 30 kV/ram and not more than 35 kV/ram.

The total protrusion amount Z4 is preferably not less than 17 μm and not more than 23 μm. In this case, the electric field strength at the end portions of the second spiral pattern 143 becomes not less than 25 kV/ram and not more than kV/mm.

The total protrusion amount Z4 is preferably not less than 27 μm and not more than 33 μm. In this case, the electric field strength at the end portions of the second spiral pattern 143 becomes not less than 25 kV/ram and not more than kV/mm.

As described above, with the electronic component 141, substantially the same effects as the effects described with the second preferred embodiment can be exhibited.

In this embodiment, in adjusting the total protrusion amount Z4, the number of turns of the upper coils 21 was made greater than the number of turns of the lower coils under a condition that a wire width and a pitch width of the lower coils 20 and a wire width and a pitch width of the upper coils 21 are respectively equal to each other.

However, in adjusting the total protrusion amount Z4, at least one of the wire width, the pitch width, and the number of turns of the upper coils 21 may be changed. Also, in adjusting the total protrusion amount Z4, at least one of the wire width, the pitch width, and the number of turns of the lower coils 20 may be changed.

Further, the respective conditions of the lower coils 20 and the respective conditions of the upper coils 21 may be changed respectively. In one configuration example, the wire width of the upper coils 21 may be set to a value greater than the wire width of the lower coils 20 while the number of turns of the lower coils 20 and the number of turns of the upper coils 21 are set to the same value.

In another configuration example, the pitch width of the upper coils 21 may be set to a value greater than the pitch width of the lower coils 20 while the wire width and the number of turns of the lower coils 20 and the wire width and the number of turns of the upper coils 21 are respectively set to the same values.

Obviously, in increasing the total protrusion amount Z4, at least two among the number of turns, the wire width, and the pitch width of the upper coils 21 may be set to larger values than those of the lower coils 20.

Figure 28:
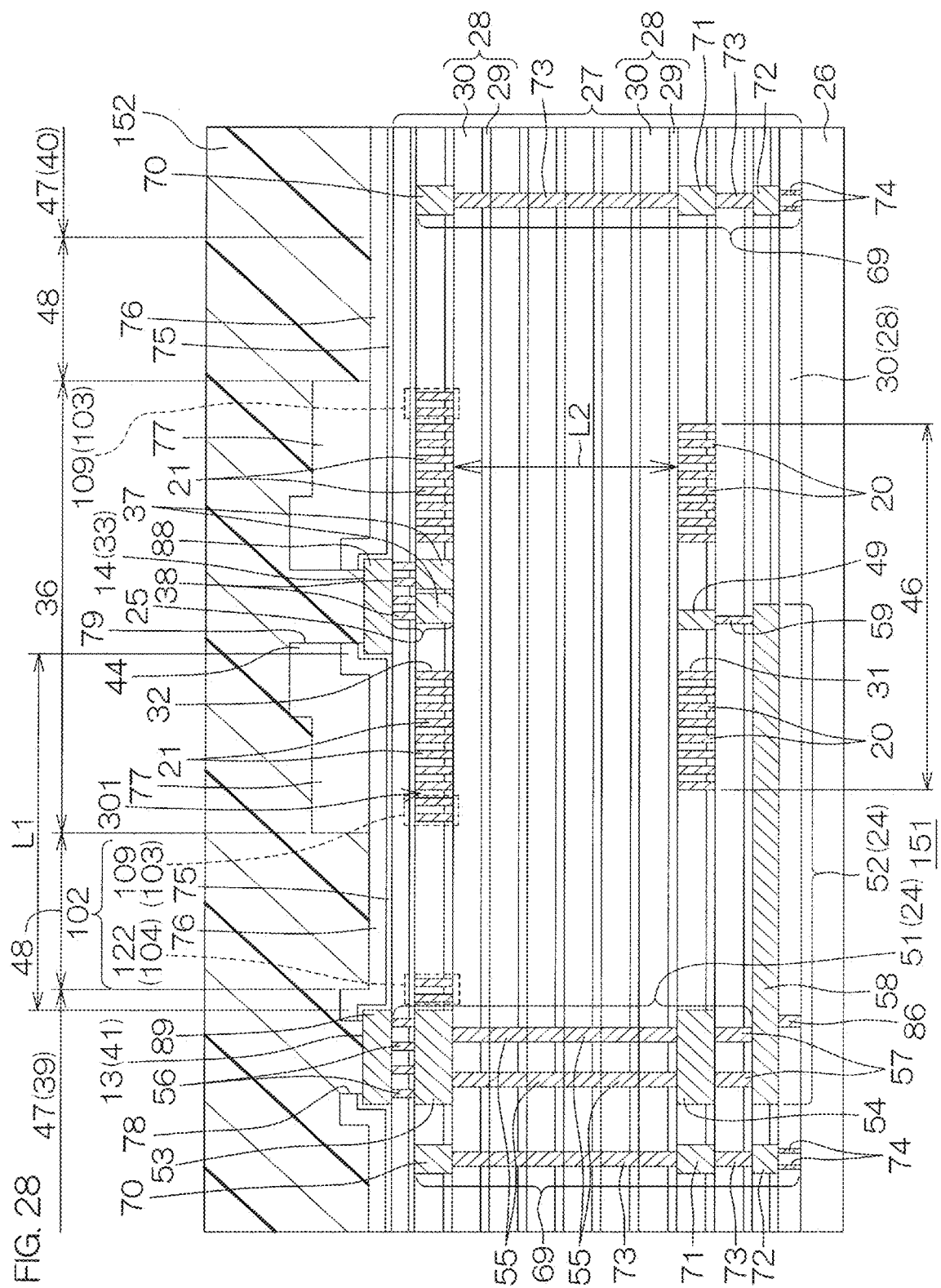
FIG. 28 is a sectional view for describing an electronic component according to a fifth preferred embodiment of the present invention.

FIG. 28 is a sectional view for describing an electronic component 151 according to a fifth preferred embodiment of the present invention. With this embodiment, structures corresponding to the structures of the electronic component 101 are provided with the same reference symbols and description thereof is omitted.

The electronic component 151 has a second insulating layer 152 that covers a region above the insulating layer laminated structure 27 as a first insulating layer. The second insulating layer 152 covers the protective film 75, the passivation film 76, the resin films 77, etc., altogether.

As mentioned above, the insulating layer laminated structure 27 includes the etching stopper films 29 and the interlayer insulating films 30. The etching stopper films 29 include, for example, an SiN film, an SiC film, an SiCN film, etc. The interlayer insulating films 30 include, for example, an $SiO_2$ film.

The insulating layer laminated structure 27 thus has a first dielectric breakdown strength S1 of not less than 5.0 MV/cm. The first dielectric breakdown strength S1 of the insulating layer laminated structure 27 is preferably not less than 8.0 MV/cm and not more than 15 MV/cm.

The insulating layer laminated structure 27 may include an insulating film constituted of an insulating material other than SiN, SiC, SiCN, and $SiO_2$ as long as the first dielectric breakdown strength S1 is not less than 5.0 MV/cm. An insulator ($SiO_2$ or SiN, etc.) having the first dielectric breakdown strength S1 of not less than 8.0 MV/cm and not more than 10 MV/cm may be selected as the insulating layer laminated structure 27.

The second insulating layer 152 has a second dielectric breakdown strength S2 not more than the first dielectric breakdown strength S1 (S2≤S1). More specifically, the second dielectric breakdown strength S2 is less than the first dielectric breakdown strength S1 (S2<S1).

The second dielectric breakdown strength S2 of the second insulating layer 152 may be not less than 0.1 MV/cm and not more than 0.5 MV/cm. A resin (epoxy resin or polyimide resin, etc.) having the second dielectric breakdown strength S2 of not less than 0.1 MV/cm and not more than 0.3 MV/cm may be selected as the second insulating layer 152.

In this embodiment, the second insulating layer 152 is constituted of a resin layer. The resin layer may include at least one resin among an epoxy resin, a polyimide resin, and a polybenzoxazole resin. The resin layer may be formed of a molded resin including at least one resin among an epoxy resin, a polyimide resin, and a polybenzoxazole resin.

If the second insulating layer 152 includes a molded resin, the second insulating layer 152 may be formed by a portion of the resin package 2 (see FIG. 1) of the electronic component module 1. That is, the electronic component 151 in a state of being arranged in an interior of the resin package 2 may include a portion of the resin package 2 that covers the region above the insulating layer laminated structure 27.

Although there is present a difference due to having or not having the resin films 77, such a configuration is practically the same as a configuration where the electronic component 101 according to the second preferred embodiment or the electronic component 131 according to the third preferred embodiment or the electronic component 141 according to the fourth preferred embodiment is arranged in the interior of the resin package 2.

The upper coils 21A and 21B form, with the low voltage layer wirings 53, an electric field having a first value R1 not more than the first dielectric breakdown strength S1 (R1≤S1). More specifically, the first value R1 is less than the first dielectric breakdown strength S1 (R1<S1).

The first withstand voltage enhancement structure 103 forms, with the low voltage layer wirings 53, an electric field having a second value R2 not less than the first value R1 and not more than the first dielectric breakdown strength S1 (R1≤R2≤S1). More specifically, the second value R2 exceeds the first value R1 and is less than the first dielectric breakdown strength S1 (R1<R2<S1).

The first withstand voltage enhancement structure 103 increases the electric field between the upper coils 21A and 21B and the low voltage layer wirings 53 by shortening of distance while relaxing the concentration of electric field on the upper coils 21A and 21B.

The second withstand voltage enhancement structure 104 forms, with the first withstand voltage enhancement structure 103, an electric field having a third value R3 not less than the second value R2 and not more than the first dielectric breakdown strength S1 (R2≤R3≤S1). More specifically, the third value R3 exceeds the second value R2 and is less than the first dielectric breakdown strength S1 (R2<R3<S1).

The second withstand voltage enhancement structure 104 increases the electric field between the upper coils 21A and 21B and the low voltage layer wirings 53 by shortening of distance while relaxing the concentration of electric field on the low voltage layer wirings 53.

The high voltage pads 14 form, with the low voltage pads 13, an electric field having a fourth value R4 not more than the second dielectric breakdown strength S2 (R4≤S2). More specifically, the fourth value R4 is less than the second dielectric breakdown strength S2 (R4<S2).

The electric field between the upper coils 21A and 21B and the low voltage layer wirings 53 is practically determined by a distance between the first withstand voltage enhancement structure 103 and the second withstand voltage enhancement structure 104. Similarly, the electric field between the upper coils 21A and 21B and the shield layer 69 is practically determined by a distance between the first withstand voltage enhancement structure 103 and the shield layer 69.

The first withstand voltage enhancement structure 103 thereby functions as a first electric field enhancement structure that increases the electric field between the upper coils 21A and 21B and the low voltage layer wirings 53 and the electric field between the upper coils 21A and 21B and the shield layer 69. Also, the second withstand voltage enhancement structure 104 functions as a second electric field enhancement structure that increases the electric field between the upper coils 21A and 21B and the low voltage layer wirings 53.

More specifically, the first proximal region 112 of the first withstand voltage enhancement structure 103 forms a first coil side electric field enhancement structure that increases the electric field between the first upper coil 21A and the low voltage layer wirings 53. Also, the first proximal region 112 of the first withstand voltage enhancement structure 103 forms the first coil side electric field enhancement structure that increases the electric field between the first upper coil 21A and the shield layer 69.

The second proximal region 113 of the first withstand voltage enhancement structure 103 forms a second coil side electric field enhancement structure that increases the electric field between the second upper coil 21B and the low voltage layer wirings 53. Also, the second proximal region 113 of the first withstand voltage enhancement structure 103 forms the second coil side electric field enhancement structure that increases the electric field between the second upper coil 21B and the shield layer 69.

The first connection region 114 of the first withstand voltage enhancement structure 103 forms a first pad side electric field enhancement structure that increases the electric field between the second pads 34 and the low voltage layer wirings 53. Also, the first connection region 114 of the first withstand voltage enhancement structure 103 forms the first pad side electric field enhancement structure that increases the electric field between the second pads 34 and the shield layer 69.

The connection region 115 of the first withstand voltage enhancement structure 103 forms the second pad side electric field enhancement structure that increases the electric field between the second pads 34 and the shield layer 69.

Figure 29:
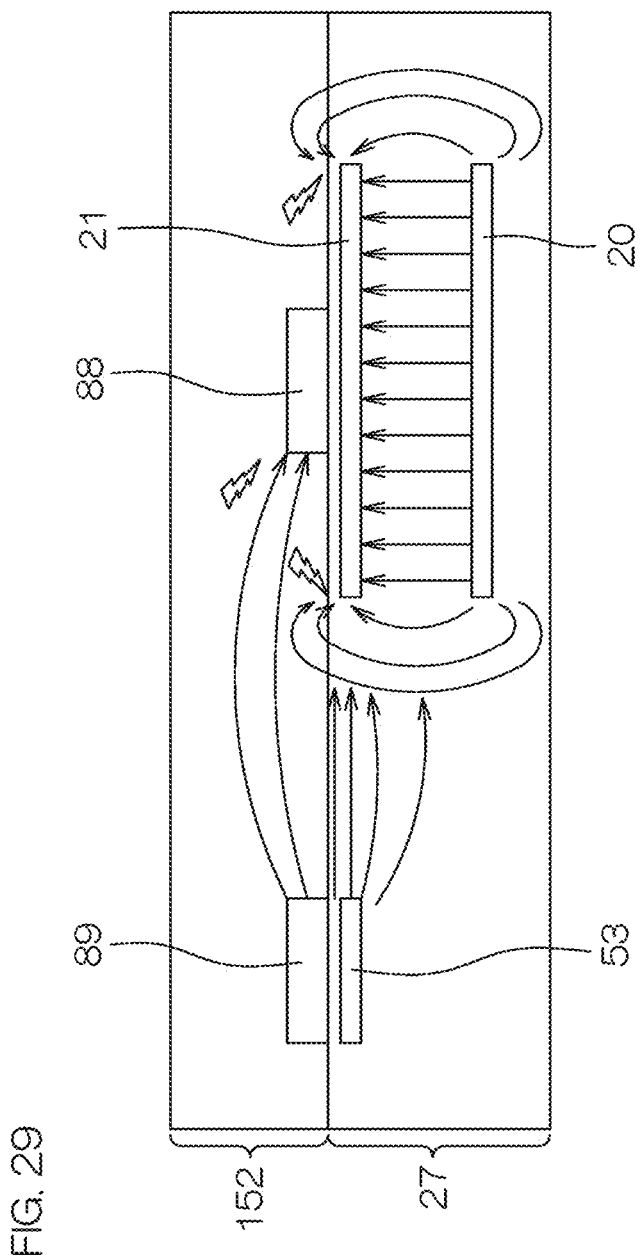
FIG. 29 is a diagram for describing an effect of the electronic component shown in FIG. 28.
Figure 30:
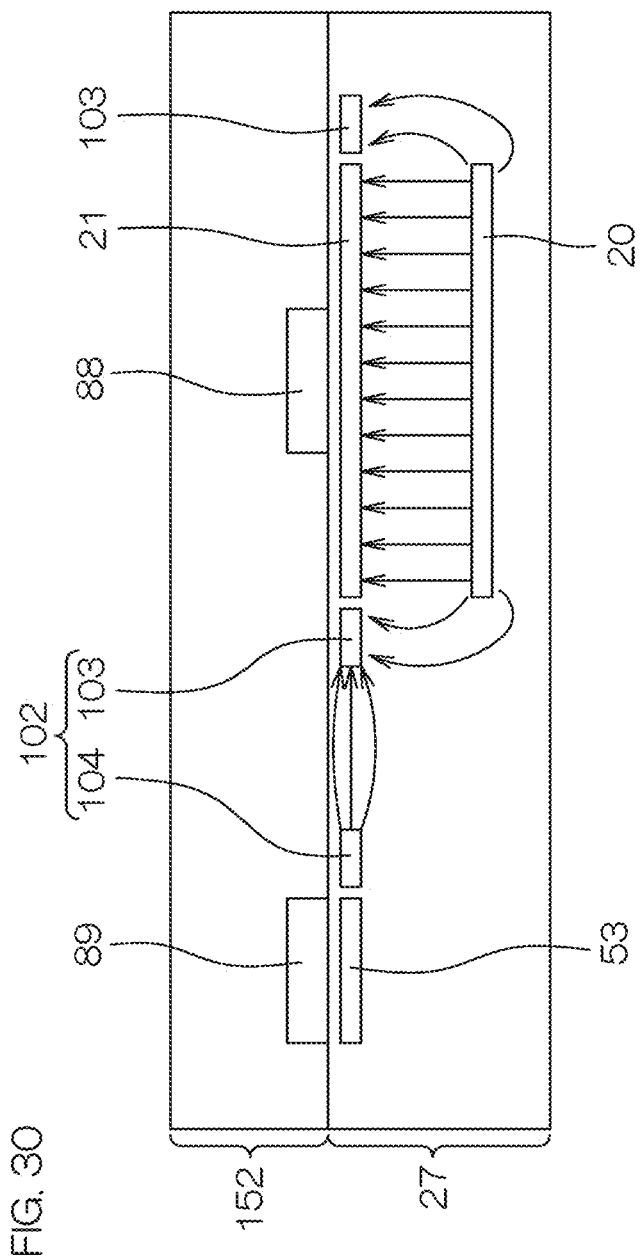
FIG. 30 is a diagram for describing the effect of the electronic component shown in FIG. 28.

FIG. 29 is a diagram for describing an effect of the electronic component 151 shown in FIG. 28. FIG. 30 is a diagram for describing the effect of the electronic component 151 shown in FIG. 28. For convenience of description, a lower coil 20, an upper coil 21, the withstand voltage enhancement structure 102, and other structures are simplified in FIG. 29 and FIG. 30.

With the electronic component 151 according to the present preferred embodiment, the upper coils 21A and 21B and the lower coils 20 are formed inside the insulating layer laminated structure 27 having the first dielectric breakdown strength S1.

Referring to FIG. 29, as described with the second preferred embodiment, if the withstand voltage enhancement structure 102 is not formed, an electric field concentrates at the upper coil end. Especially, if a plan view area of the upper coils 21A and 21B is not more than a plan view area of the lower coils 20, the electric field wraps around over a boundary region between the insulating layer laminated structure 27 and the second insulating layer 152 to an upper side of the upper coil end and the electric field thus tends to concentrate at the upper coil end.

If the electric field strength at the upper coil end exceeds the second dielectric breakdown strength S2 of the second insulating layer 152, there is a possibility of dielectric breakdown occurring at the second insulating layer 152.

On the other hand, referring to FIG. 30, if the first withstand voltage enhancement structure 103 (withstand voltage enhancement structure 102) is formed, the concentration of electric field on the upper coil end, etc., is relaxed as described with the second preferred embodiment.

The first withstand voltage enhancement structure 103 protrudes outward from the outer contours of the upper coils 21A and 21B and can therefore shield the electric field formed between the lower coils 20 and the upper coils 21A and 21B. The electric field is thereby suppressed from extending over the boundary region between the insulating layer laminated structure 27 and the second insulating layer 152.

Moreover, the second withstand voltage enhancement structure 104 (withstand voltage enhancement structure 102) protrudes from the outer contours of the low voltage pads 13 toward the upper coils 21A and 21B side. The electric field between the upper coils 21A and 21B and the low voltage layer wirings 53 is thereby practically determined by the distance between the first withstand voltage enhancement structure 103 and the second withstand voltage enhancement structure 104.

Therefore, while the electric field strength increases in the insulating layer laminated structure 27 having the first dielectric breakdown strength S1 not less than the second dielectric breakdown strength S2 (S1≥S2), the electric field strength decreases in the second insulating layer 152 having the second dielectric breakdown strength S2 not more than the first dielectric breakdown strength S1 (S2≤S1).

With the electronic component 151, the electric field strength at the second insulating layer 152 side that is low in dielectric breakdown strength is decreased by intentionally increasing the electric field strength at the insulating layer laminated structure 27 side that is high in dielectric breakdown strength. The dielectric breakdown of the second insulating layer 152 due to the concentration of electric field can thus be suppressed. Consequently, the electronic component 151 that enables improvement of the withstand voltage can thus be provided.

Figure 31:
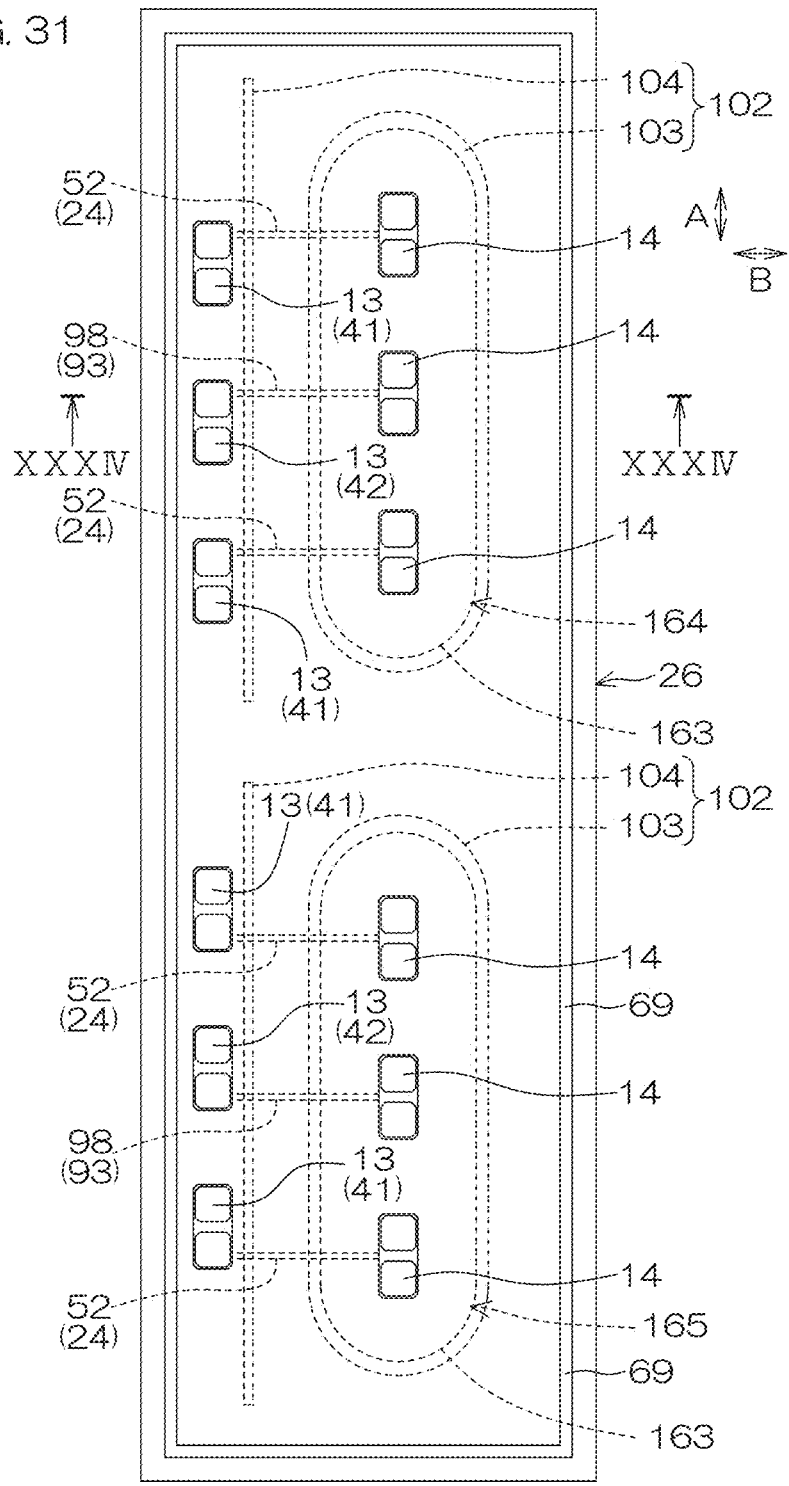
FIG. 31 is a diagram for describing the planar structure of an electronic component according to a sixth preferred embodiment of the present invention.
Figure 32:
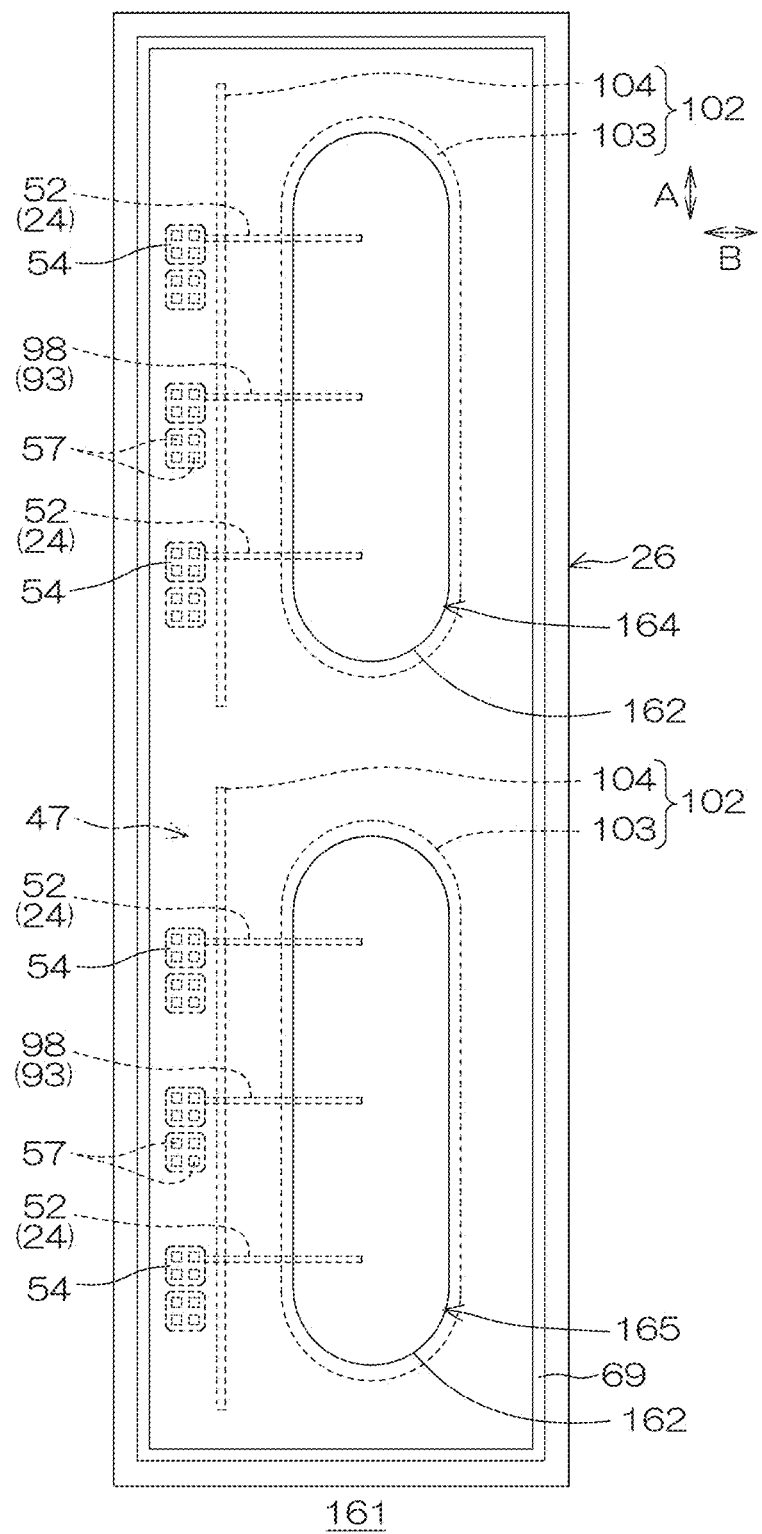
FIG. 32 is a diagram for describing the planar structures of low voltage side capacitor conductor films of the electronic component shown in FIG. 31.

FIG. 31 is a diagram for describing the planar structure of an electronic component 161 according to a sixth preferred embodiment of the present invention. FIG. 32 is a diagram for describing the planar structures of low voltage side capacitor conductor films 162 of the electronic component 161 shown in FIG. 31.

Figure 33:
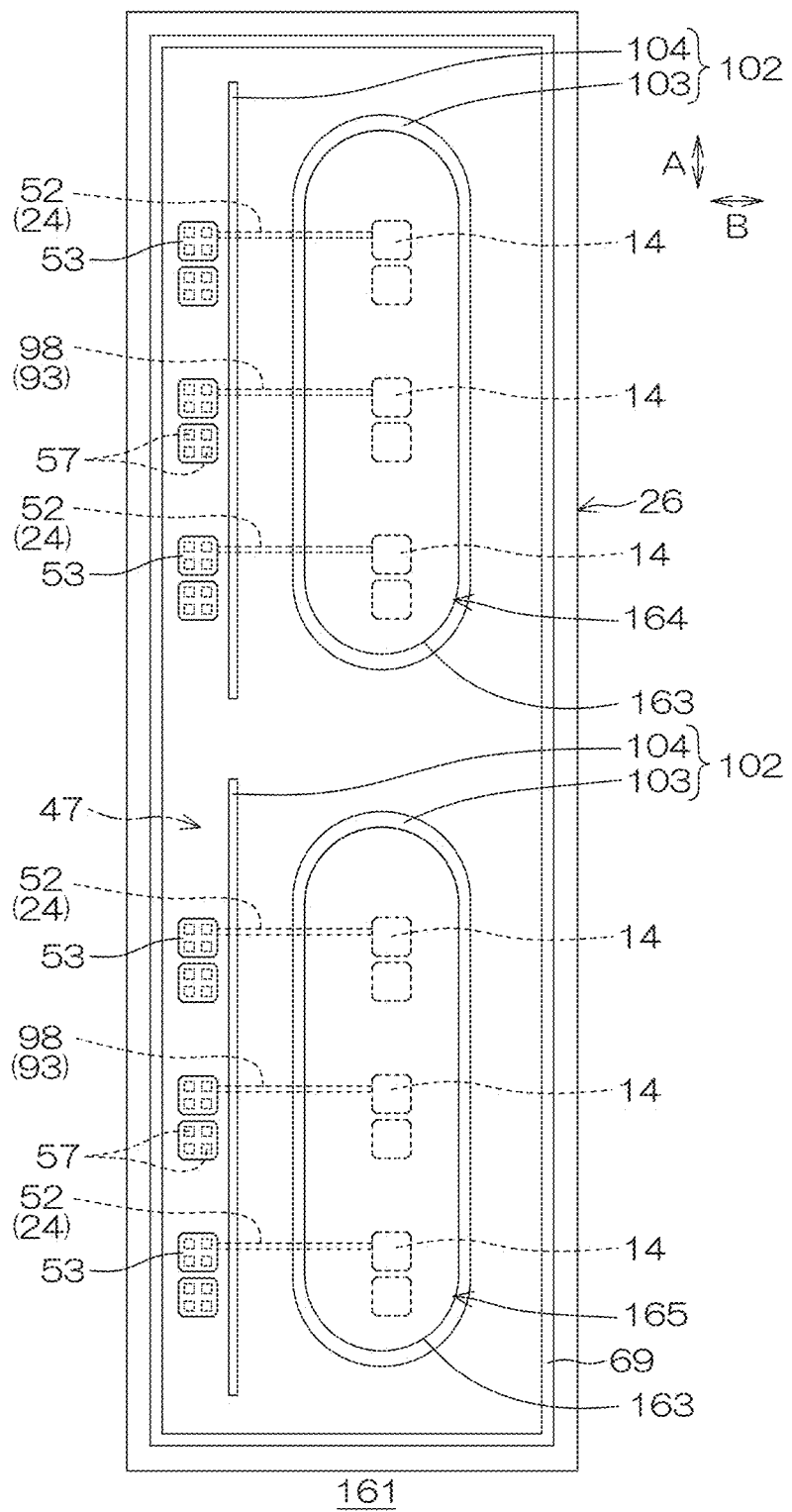
FIG. 33 is a diagram for describing the planar structures of high voltage side capacitor conductor films of the electronic component shown in FIG. 31.
Figure 34:
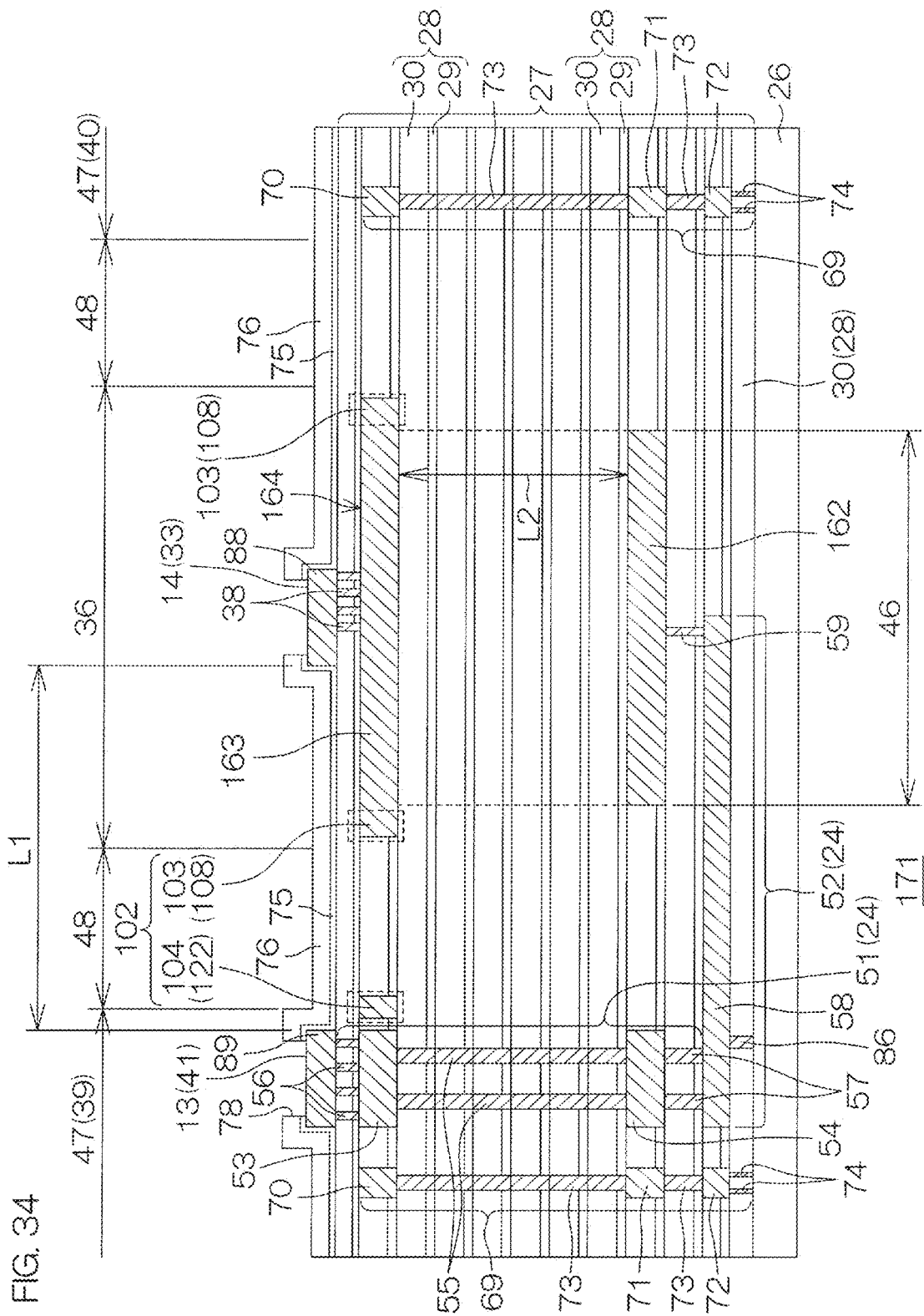
FIG. 34 is a sectional view taken along line XXXIV-XXXIV shown in FIG. 31.

FIG. 33 is a diagram for describing the planar structures of high voltage side capacitor conductor films 163 of the electronic component 161 shown in FIG. 31. FIG. 34 is a sectional view taken along line XXXIV-XXXIV shown in FIG. 31. In the following, structures corresponding to the structures of the electronic component 101 are provided with the same reference symbols and description thereof is omitted.

Referring to FIG. 31 to FIG. 34, with the electronic component 161, the lower coils 20 and the upper coils 21, the inner coil end wirings 37 and the outer coil end wiring 96, and the inner coil end wirings 49 and the outer coil end wiring 97 are not formed.

With the electronic component 161, the low voltage side capacitor conductor films 162 are formed in place of the lower coils 20, the inner coil end wirings 49, and the outer coil end wiring 97. Also, the high voltage side capacitor conductor films 163 are formed in place of the upper coils 21, the inner coil end wirings 37, and the outer coil end wiring 96.

The low voltage side capacitor conductor films 162 are formed as examples of low voltage conductor patterns. The high voltage side capacitor conductor films 163 are formed as examples of high voltage conductor patterns. The low voltage side capacitor conductor films 162 and the high voltage side capacitor conductor films 163 are formed by simply changing mask patterns for forming the lower coils 20 and the upper coils 21.

With this embodiment, two low voltage side capacitor conductor films 162 are formed at an interval along the first direction A. Also, two high voltage side capacitor conductor films 163 are formed at an interval along the first direction A.

The respective high voltage side capacitor conductor films 163 face the low voltage side capacitor conductor films 162, respectively, across at least one insulating layer 28. A vertical direction distance L2 between the high voltage side capacitor conductor films 163 and the low voltage side capacitor conductor films 162 may be not less than 12.0 μm and not more than 16.8 μm. The vertical direction distance L2 is the total thickness L2 of the insulating layers 28 between the high voltage side capacitor conductor films 163 and the low voltage side capacitor conductor films 162.

A first capacitance 164 is formed by a low voltage side capacitor conductor film 162 and a high voltage side capacitor conductor film 163 that face each other at one side in the first direction A. A second capacitance 165 is formed by the low voltage side capacitor conductor film 162 and the high voltage side capacitor conductor film 163 that face each other at the other side in the first direction A.

The structure at the first capacitance 164 side and the structure at the second capacitance 165 side are substantially the same. In the following, the structure at the first capacitance 164 side shall be described as an example, and for the structure at the second capacitance 165 side, the same reference symbols as the first capacitance 164 side are provided and description thereof is omitted.

In the first capacitance 164, the low voltage side capacitor conductor film 162 and the high voltage side capacitor conductor film 163 are respectively formed to flat plate shapes. In this embodiment, the low voltage side capacitor conductor film 162 and the high voltage side capacitor conductor film 163 are formed to elliptical shapes in plan view.

The planar shapes of the low voltage side capacitor conductor film 162 and the high voltage side capacitor conductor film 163 are arbitrary and not restricted to elliptical shapes. The low voltage side capacitor conductor film 162 and the high voltage side capacitor conductor film 163 may thus be formed respectively to circular shapes or polygonal shapes (for example, quadrilateral shapes).

The low voltage side capacitor conductor film 162 is electrically connected to the low voltage pads 13 via the penetrating wirings 51 and the lead-out wirings 52. The high voltage side capacitor conductor film 163 is electrically connected to the high voltage pads 14 via the vias 38.

In this embodiment, the low voltage pads 13 are formed in a region outside the high voltage side capacitor conductor film 163 in plan view. In this embodiment, the high voltage pads 14 are formed in a region facing the high voltage side capacitor conductor film 163 in plan view.

As with the electronic component 101, the electronic component 161 includes the withstand voltage enhancement structures 102 of conductive property. Each withstand voltage enhancement structure 102 is formed in a region between members of the low voltage side and members of the high voltage side. The members of the low voltage side include, for example, the low voltage pads 13, the shield layer 69, etc., that are fixed at the reference potential or the ground potential.

The members of the high voltage side include, for example, the high voltage pads 14, the high voltage side capacitor conductor film 163, etc. The withstand voltage enhancement structure 102 suppresses withstand voltage degradation due to an electric field that is formed in the region between the members of the low voltage side and the members of the high voltage side. The withstand voltage enhancement structure 102 includes the first withstand voltage enhancement structure 103 at the high voltage side and the second withstand voltage enhancement structure 104 at the low voltage side.

In this embodiment, the first withstand voltage enhancement structure 103 is, in plan view, formed along an outer contour of the low voltage side capacitor conductor film 162 such as to protrude further outward than the outer contour of the low voltage side capacitor conductor film 162. The first withstand voltage enhancement structure 103 surrounds the high voltage side capacitor conductor film 163 such as to demarcate the high voltage side capacitor conductor film 163 from other regions.

The first withstand voltage enhancement structure 103 is formed to be equipotential to the high voltage side capacitor conductor film 163. In this embodiment, the first withstand voltage enhancement structure 103 includes a single first dummy conductor pattern 108 of ring shape (elliptical ring shape) in plan view.

The first dummy conductor pattern 108 forms a shield layer. In this embodiment, the first dummy conductor pattern 108 is formed integral to an outer peripheral edge of the high voltage side capacitor conductor film 163.

With the exception of the point that the first dummy conductor pattern 108 is constituted of a single pattern, the arrangement of the first withstand voltage enhancement structure 103 (first dummy conductor pattern 108) is the same as the first withstand voltage enhancement structure 103 (first dummy conductor patterns 108) according to the electronic component 101. Specific description of the first withstand voltage enhancement structure 103 (first dummy conductor pattern 108) is omitted.

The second withstand voltage enhancement structure 104 is formed in a region between the high voltage side capacitor conductor film 163 and the low voltage layer wirings 53 (low voltage pads 13) in plan view. The second withstand voltage enhancement structure 104 extends in a line shape along the first direction A.

The second withstand voltage enhancement structure 104 is formed along the plurality of low voltage layer wirings 53 (low voltage pads 13) in plan view. The second withstand voltage enhancement structure 104 extends in the line shape along the first direction A such as to pass along the plurality of low voltage pads 13. The second withstand voltage enhancement structure 104 thereby demarcates the plurality of low voltage pads 13 (low voltage layer wirings 53) respectively from the upper coils 21A and 21B.

In this embodiment, the second withstand voltage enhancement structure 104 includes a single second dummy conductor pattern 121. The second dummy conductor pattern 121 forms a shield layer. As in the electronic component 101, the second withstand voltage enhancement structure 104 may include the second dummy conductor pattern group 122 formed by the assembly of a plurality of the second dummy conductor patterns 121.

The arrangement of the second withstand voltage enhancement structure 104 (second dummy conductor pattern 121) is the same as the second withstand voltage enhancement structure 104 (second dummy conductor patterns 121) according to the electronic component 101. Specific description of the second withstand voltage enhancement structure 104 (second dummy conductor pattern 121) is omitted.

Even when the low voltage side capacitor conductor films 162 and the high voltage side capacitor conductor films 163 are included as in the electronic component 161 described above, the same effects as the effects described for the electronic component 101 can be exhibited.

As with the electronic component 101, the electronic component 161 may include the second insulating layer 152 that covers the region above the insulating layer laminated structure 27 (see also FIG. 28). In this case, the same effects as the effects described with FIG. 29 and FIG. can be exhibited.

As with the electronic component 6 and the electronic component 131, the electronic component 161 may include the resin films 77 (see also FIG. 3, etc.). Each resin film 77 may overlap with the corresponding first withstand voltage enhancement structure 103 in plan view. The resin film 77 may cover the entirety of the first withstand voltage enhancement structure 103.

The high voltage side capacitor conductor film 163 and the first withstand voltage enhancement structure 103 may be arranged within the region surrounded by the outer peripheral edge of the resin film 77 in plan view. The resin film 77 may cover the front surface of a portion of the insulating layer laminated structure 27. The resin film 77 may cover the entirety of the front surface of the insulating layer laminated structure 27. In this case, the same effects as the effects described for the electronic component 6 and the electronic component 131 can be exhibited.

Figure 35:
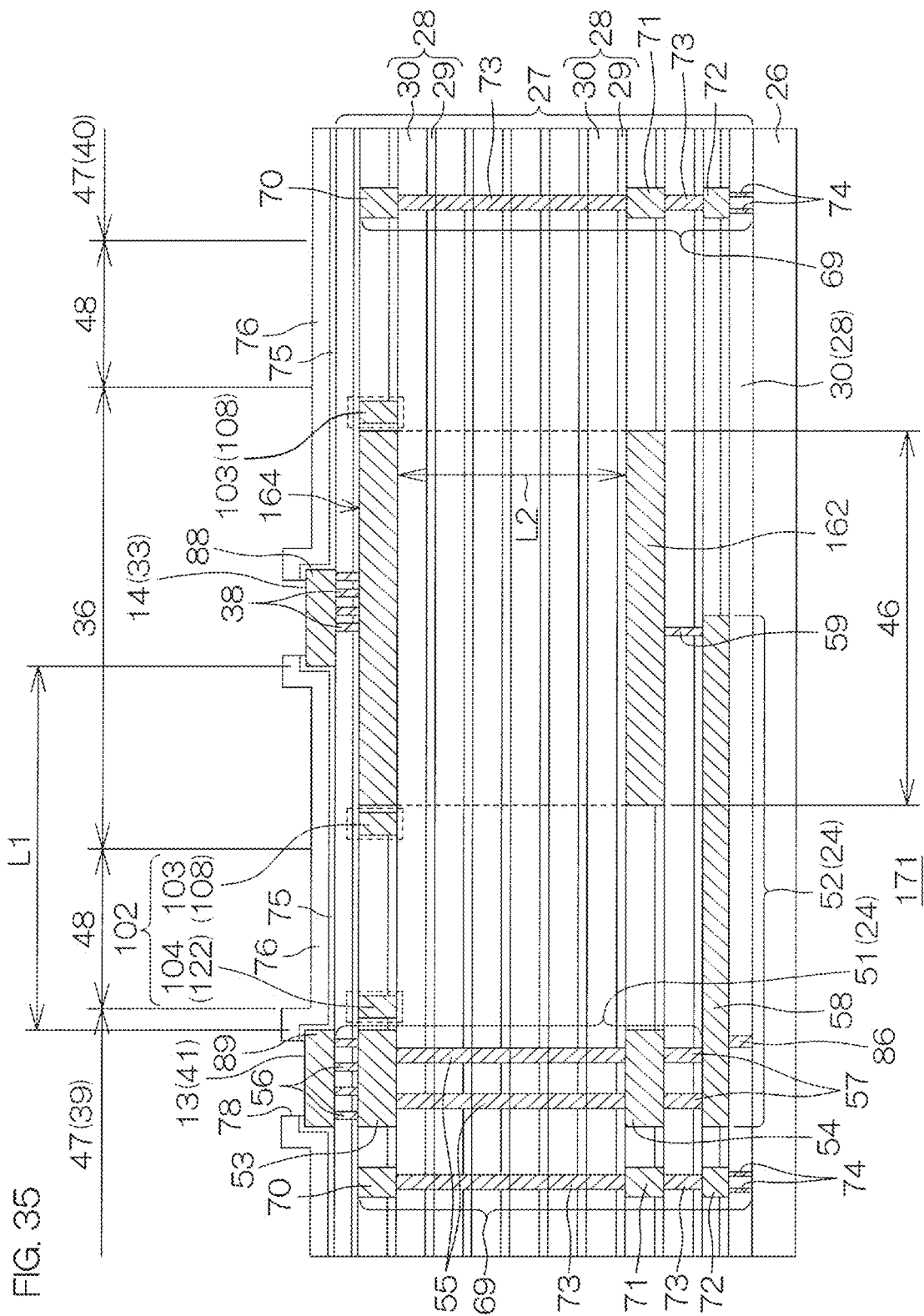
FIG. 35 is a sectional view for describing an electronic component according to a seventh preferred embodiment of the present invention.

FIG. 35 is a sectional view for describing an electronic component 171 according to a seventh preferred embodiment of the present invention. In the following, structures corresponding to structures of the electronic component 161 are provided with the same reference symbols and description thereof is omitted.

With the electronic component 171, the first withstand voltage enhancement structure 103 is formed at an interval from the high voltage side capacitor conductor film 163. The first withstand voltage enhancement structure 103 is formed to be equipotential to the high voltage side capacitor conductor film 163.

The first withstand voltage enhancement structure 103 may be connected to the high voltage side capacitor conductor film 163 via a connection wiring (not shown). The connection wiring may be formed in the same layer as the first withstand voltage enhancement structure 103 and the high voltage side capacitor conductor film 163. The connection wiring may be formed in a layer differing from that of the first withstand voltage enhancement structure 103 and the high voltage side capacitor conductor film 163.

The first withstand voltage enhancement structure 103 includes the first dummy conductor pattern 108 formed at an interval from the high voltage side capacitor conductor film 163. As in the electronic component 101, the first withstand voltage enhancement structure 103 may include the first dummy conductor pattern group 109 formed by the assembly of a plurality of the first dummy conductor patterns 108.

The arrangement of the first withstand voltage enhancement structure 103 (first dummy conductor pattern group 109) is the same as the first withstand voltage enhancement structure 103 (first dummy conductor pattern group 109) according to the electronic component 101. Specific description of the first withstand voltage enhancement structure 103 (first dummy conductor pattern group 109) is omitted.

Even when the low voltage side capacitor conductor films 162 and the high voltage side capacitor conductor films 163 are included as in the electronic component 171 described above, the same effects as the effects described for the electronic component 101 can be exhibited.

As with the electronic component 151, the electronic component 171 may include the second insulating layer 152 that covers the region above the insulating layer laminated structure 27 (see also FIG. 28). In this case, the same effects as the effects described with FIG. 29 and FIG. can be exhibited.

As with the electronic component 6 and the electronic component 131, the electronic component 171 may include the resin films 77 (see also FIG. 3, etc.). The resin films 77 may overlap with the corresponding first withstand voltage enhancement structure 103 in plan view. The resin film 77 may cover the entirety of the first withstand voltage enhancement structure 103.

The high voltage side capacitor conductor film 163 and the first withstand voltage enhancement structure 103 may be arranged within the region surrounded by the outer peripheral edge of the resin film 77 in plan view. The resin film 77 may cover the front surface of a portion of the insulating layer laminated structure 27. The resin film 77 may cover the entirety of the front surface of the insulating layer laminated structure 27. In this case, the same effects as the effects described for the electronic component 6 and the electronic component 131 can be exhibited.

Although the preferred embodiments of the present invention were described above, with the present invention, various design changes may be applied within the scope of the matters described in the claims.

Figure 36:
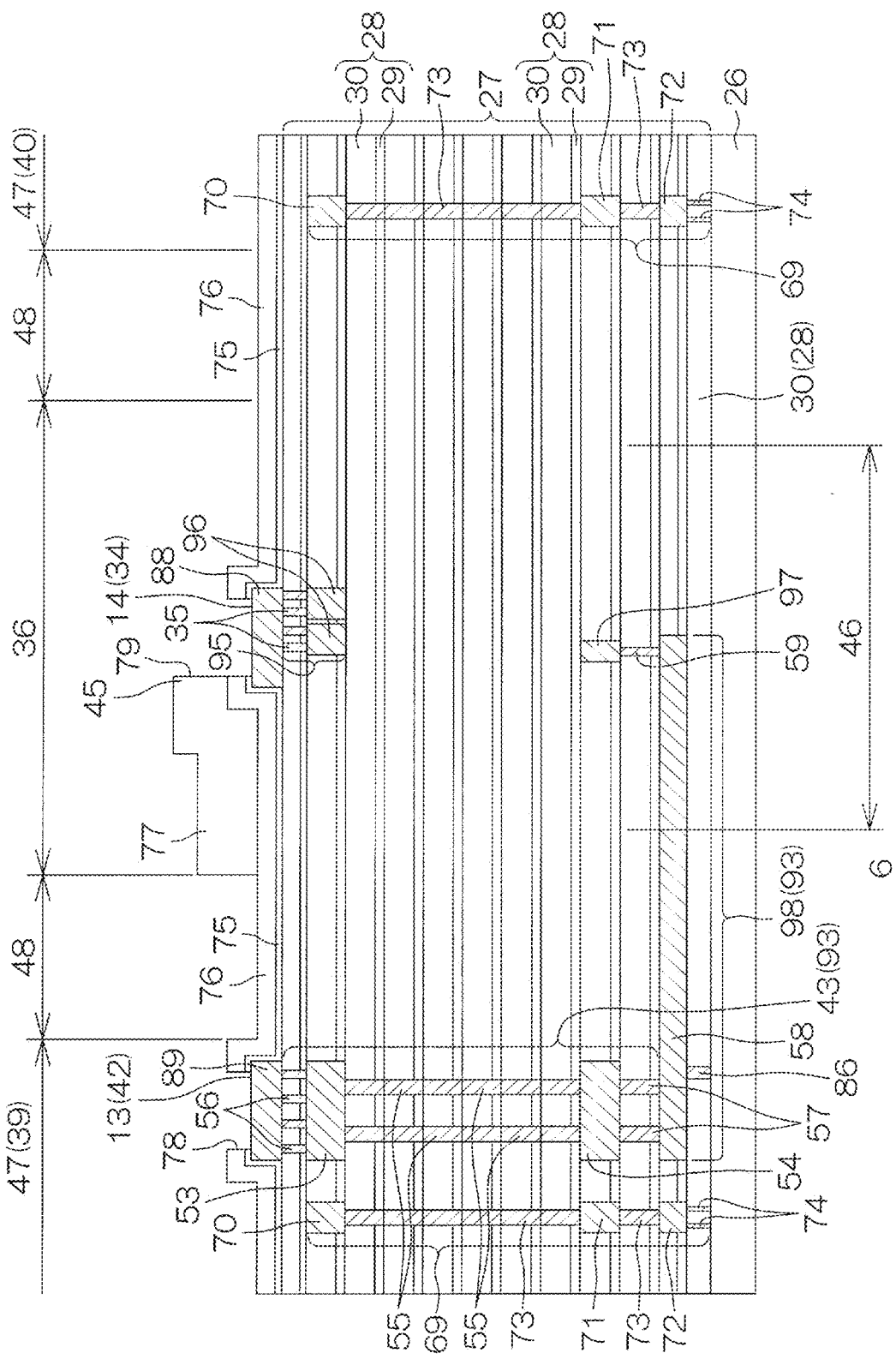
FIG. 36 is a diagram of a modification example related to a pattern of a resin film.

With the first present embodiment, the resin films 77 cover entire peripheries of both second pads 34 of the high voltage pads 14. However, as shown in FIG. 36, the resin films 77 may selectively cover just sides of the second pads 34 toward the first region 39 at which the low voltage pads 13 are arranged.

In this case, the resin films 77 are preferably formed such as to cover the upper coils 21 entirely at peripheries of the first pads 33 in plan view.

For example, if a filler is included in the resin package 2 that seals the electronic component 6, unless the upper coils 21 are covered by the resin films 77, the upper coils 21 may receive damage (filler attack) due to the filler during sealing. However, if the upper coils 21 are entirely covered by resin films 77, the problem of filler attack, etc., can be suppressed. The present structure is also applicable to the second to seventh preferred embodiments.

Figure 37:
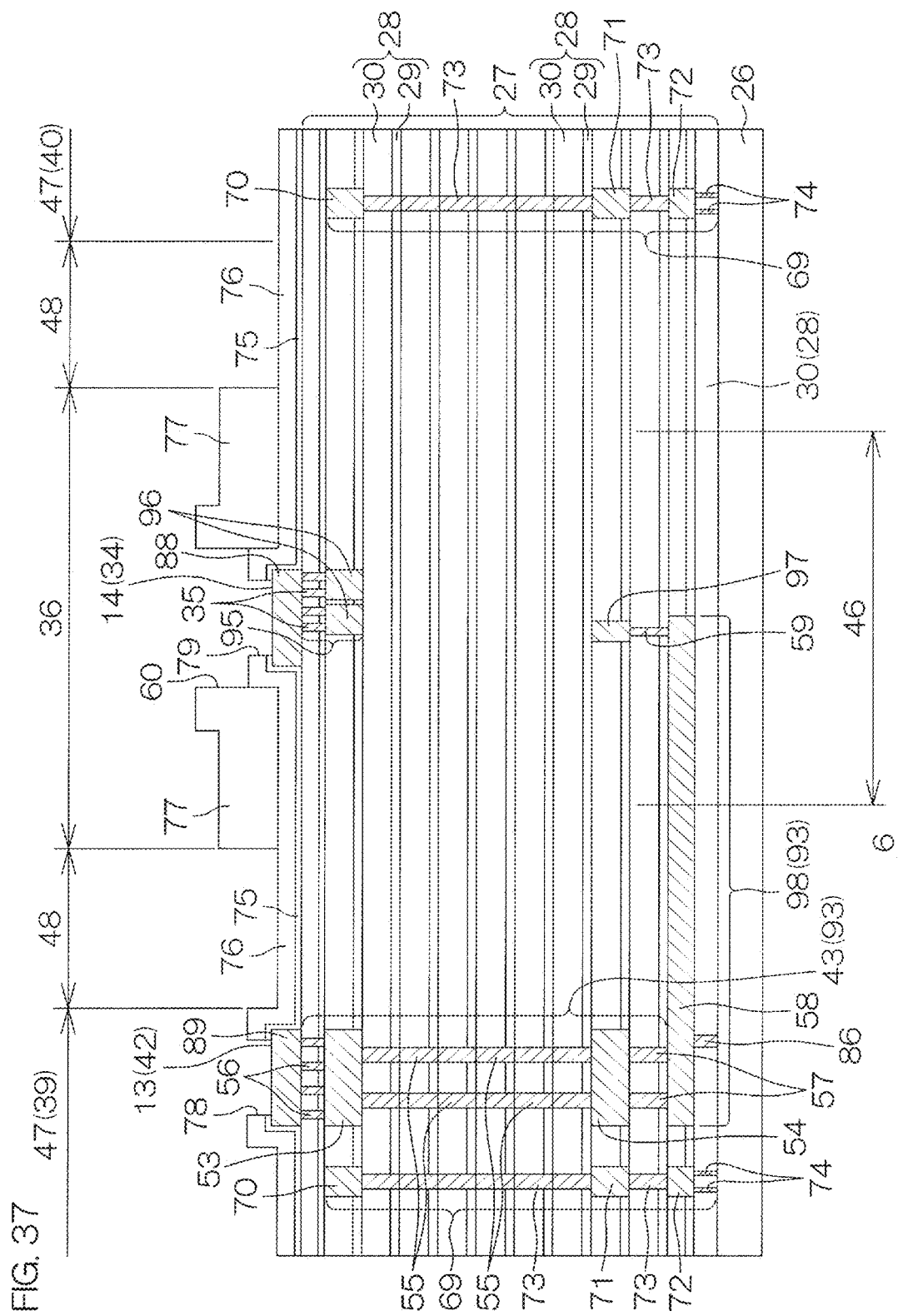
FIG. 37 is a diagram of a modification example related to a pattern of a resin film.

With the first preferred embodiment, the resin films 77 are formed to overlap with the peripheral edges of the second pads 34. However, as shown in FIG. 37, the resin films 77 do not have to overlap with the peripheral edges of the second pads 34.

In this case, the resin films 77 may have openings 60 having a larger diameter than the pad openings 79 to expose the second pad 34. The present structure is also applicable to the second to seventh preferred embodiments.

In the first to fifth preferred embodiments, a thickness of the lower coils 20 may be not less than a thickness of the upper coils 21. The thickness of the lower coils 20 may be not more than the thickness of the upper coils 21.

In the first to fifth preferred embodiments, the lower coils 20 may include at least one substance among gold, silver, copper, aluminum, titanium, titanium nitride, and tungsten. The upper coils 21 may include at least one substance among gold, silver, copper, aluminum, titanium, titanium nitride, and tungsten. From a perspective of cost and mass productivity, the lower coils 20 and the upper coils 21 preferably include copper or aluminum.

In the first to fifth preferred embodiments, a width of the spiral patterns of the lower coils 20 may be not more than the width of the spiral patterns 105 of the upper coils 21A and 21B. Obviously, the width of the spiral patterns of the lower coils 20 may be not less than the width of the spiral patterns 105 of the upper coils 21A and 21B.

In the second to fifth preferred embodiments, the first withstand voltage enhancement structure 103 at the first transformer 301 side and the first withstand voltage enhancement structure 103 at the second transformer 302 side may be formed integrally.

In this case, the upper coils 21A and 21B and the outer coil end wiring 96 at the first transformer 301 side and the upper coils 21A and 21B and the outer coil end wiring 96 at the second transformer 302 side may be surrounded by the first withstand voltage enhancement structure 103 altogether.

In the second to fifth preferred embodiments, the second withstand voltage enhancement structure 104 at the first transformer 301 side and the second withstand voltage enhancement structure 104 at the second transformer 302 side may be formed integrally.

In this case, the second withstand voltage enhancement structure 104 may be formed such as to extend continuously along the low voltage pads 13 (low voltage wirings 53) at the first transformer 301 side and the low voltage pads 13 (low voltage wirings 53) at the second transformer 302 side.

In the second to fifth preferred embodiments, the first proximal regions 112, the second proximal regions 113, the first connection regions 114, and the second connection regions 115 may be formed respectively as separate members. The first proximal regions 112, the second proximal regions 113, the first connection regions 114, and the second connection regions 115 may respectively include first dummy conductor pattern groups 109 that are mutually independent.

In the second to fifth preferred embodiments, the withstand voltage enhancement structures 102 may be formed in a layer differing from that of the upper coils 21A and 21B.

In the second to fifth preferred embodiments, the first withstand voltage enhancement structures 103 and the second withstand voltage enhancement structures 104 may be formed in respectively different layers.

For example, the second withstand voltage enhancement structures 104 may be formed in a layer lower than the upper coils 21A and 21B while the first withstand voltage enhancement structures 103 are formed in a layer higher than the upper coils 21A and 21B.

Oppositely, the second withstand voltage enhancement structures 104 may be formed in a layer higher than the upper coils 21A and 21B while the first withstand voltage enhancement structures 103 are formed in a layer lower than the upper coils 21A and 21B.

In the second to fifth preferred embodiments, each first withstand voltage enhancement structure 103 may include a single wide shield layer in place of the plurality of first dummy conductor patterns 108. The shield layer may have the protrusion amount Z1. Even with such a structure, the same effects as the effects described with the respective preferred embodiments can be exhibited.

In the second to fifth preferred embodiments, the plurality of first dummy conductor patterns 108 may be formed in mutually different layers. For example, any three of the first dummy conductor patterns 108 may be formed in the same layer as the upper coils 21A and 21B and the other three first dummy conductor patterns 108 may be formed in a layer one below.

Also, for example, any two of the first dummy conductor patterns 108 may be formed in the same layer as the upper coils 21A and 21B, two other first dummy conductor patterns 108 may be formed in a layer one below the upper coils 21A and 21B, and the yet other two first dummy conductor patterns 108 may be formed in a layer one above the upper coils 21A and 21B.

In the second to fifth preferred embodiments, each second withstand voltage enhancement structure 104 may include a single wide shield layer in place of the plurality of second dummy conductor patterns 121. The shield layer may have the protrusion amount Z2. Even with such a structure, the same effects as the effects described with the respective preferred embodiments can be exhibited.

In the second to fifth preferred embodiments, the plurality of second dummy conductor patterns 121 may be formed in mutually different layers. For example, any one of the second dummy conductor patterns 121 may be formed in the same layer as the upper coils 21A and 21B and the other two second dummy conductor patterns 121 may be formed in a layer one below.

Also, for example, any one of the second dummy conductor patterns 121 may be formed in the same layer as the upper coils 21A and 21B, another second dummy conductor pattern 121 may be formed in a layer one below the upper coils 21A and 21B, and the yet other dummy conductor pattern 121 may be formed in a layer one above the upper coils 21A and 21B.

In the second to fifth preferred embodiments, each second dummy conductor pattern group 122 may include a second dummy conductor pattern 121 that extends along the second direction B to an opposite side from the upper coils 21A and 21B.

In the sixth and seventh preferred embodiments, a thickness of the low voltage side capacitor conductor films 162 may be not less than a thickness of the high voltage side capacitor conductor films 163. The thickness of the low voltage side capacitor conductor films 162 may be not more than the thickness of the high voltage side capacitor conductor films 163.

In the sixth and seventh preferred embodiments, the low voltage side capacitor conductor films 162 may include at least one substance among gold, silver, copper, aluminum, titanium, titanium nitride, and tungsten.

The high voltage side capacitor conductor films 163 may include at least one substance among gold, silver, copper, aluminum, titanium, titanium nitride, and tungsten. From a perspective of cost and mass productivity, the low voltage side capacitor conductor films 162 and the high voltage side capacitor conductor films 163 preferably include copper or aluminum.

In the sixth and seventh preferred embodiments, the first withstand voltage enhancement structure 103 at the first capacitance 164 side and the first withstand voltage enhancement structure 103 at the second capacitance 165 side may be formed integrally.

In this case, the high voltage side capacitor conductor film 163 at the first capacitance 164 side and the high voltage side capacitor conductor film 163 at the second capacitance 165 side may be surrounded by the first withstand voltage enhancement structure 103 altogether.

In the sixth and seventh preferred embodiments, the second withstand voltage enhancement structure 104 at the first capacitance 164 side and the second withstand voltage enhancement structure 104 at the second capacitance 165 side may be formed integrally.

In this case, the second withstand voltage enhancement structure 104 may be formed such as to extend continuously along the low voltage pads 13 (low voltage wirings 53) at the first capacitance 164 side and the low voltage pads 13 (low voltage wirings 53) at the second capacitance 165 side.

In the sixth and seventh preferred embodiments, the withstand voltage enhancement structures 102 may be formed in a layer differing from that of the high voltage side capacitor conductor films 163.

In the sixth and seventh preferred embodiments, the first withstand voltage enhancement structures 103 and the second withstand voltage enhancement structures 104 may be formed in respectively different layers. For example, the second withstand voltage enhancement structures 104 may be formed in a layer lower than the high voltage side capacitor conductor films 163 while the first withstand voltage enhancement structures 103 are formed in a layer higher than the high voltage side capacitor conductor films 163.

Oppositely, the second withstand voltage enhancement structures 104 may be formed in a layer higher than the high voltage side capacitor conductor films 163 while the first withstand voltage enhancement structures 103 are formed in a layer lower than the high voltage side capacitor conductor films 163.

If in the seventh preferred embodiment, a plurality (for example, six) of the first dummy conductor patterns 108 are formed, the plurality of first dummy conductor patterns 108 may be formed in mutually different layers.

For example, any three of the first dummy conductor patterns 108 may be formed in the same layer as the high voltage side capacitor conductor films 163 and the other three first dummy conductor patterns 108 may be formed in a layer one below.

Also, for example, any two of the first dummy conductor patterns 108 may be formed in the same layer as the high voltage side capacitor conductor films 163, two other first dummy conductor patterns 108 may be formed in a layer one below the high voltage side capacitor conductor films 163, and the yet other two first dummy conductor patterns 108 may be formed in a layer one above the high voltage side capacitor conductor films 163.

If in the sixth and seventh preferred embodiments, a plurality (for example, three) of the second dummy conductor patterns 121 are formed, the plurality of second dummy conductor patterns 121 may be formed in mutually different layers.

For example, any one of the second dummy conductor patterns 121 may be formed in the same layer as the high voltage side capacitor conductor films 163 and the other two second dummy conductor patterns 121 may be formed in a layer one below.

Also, for example, any one of the second dummy conductor patterns 121 may be formed in the same layer as the high voltage side capacitor conductor films 163, another second dummy conductor pattern 121 may be formed in a layer one below the high voltage side capacitor conductor films 163, and the yet other dummy conductor pattern 121 may be formed in a layer one above the high voltage side capacitor conductor films 163.

In the sixth and seventh preferred embodiments, each second dummy conductor pattern group 122 may include a second dummy conductor pattern 121 that extends along the second direction B to an opposite side from the high voltage side capacitor conductor films 163.

In the second to seventh preferred embodiments, the second dummy conductor pattern group 122 may be formed such as to surround one or a plurality of the low voltage pads 13 in plan view. In this case, the second dummy conductor patterns 121 included in the second dummy conductor pattern group 122 may be formed to shapes with ends having the open portions 110 as the first dummy conductor patterns 108 are.

Figure 38:
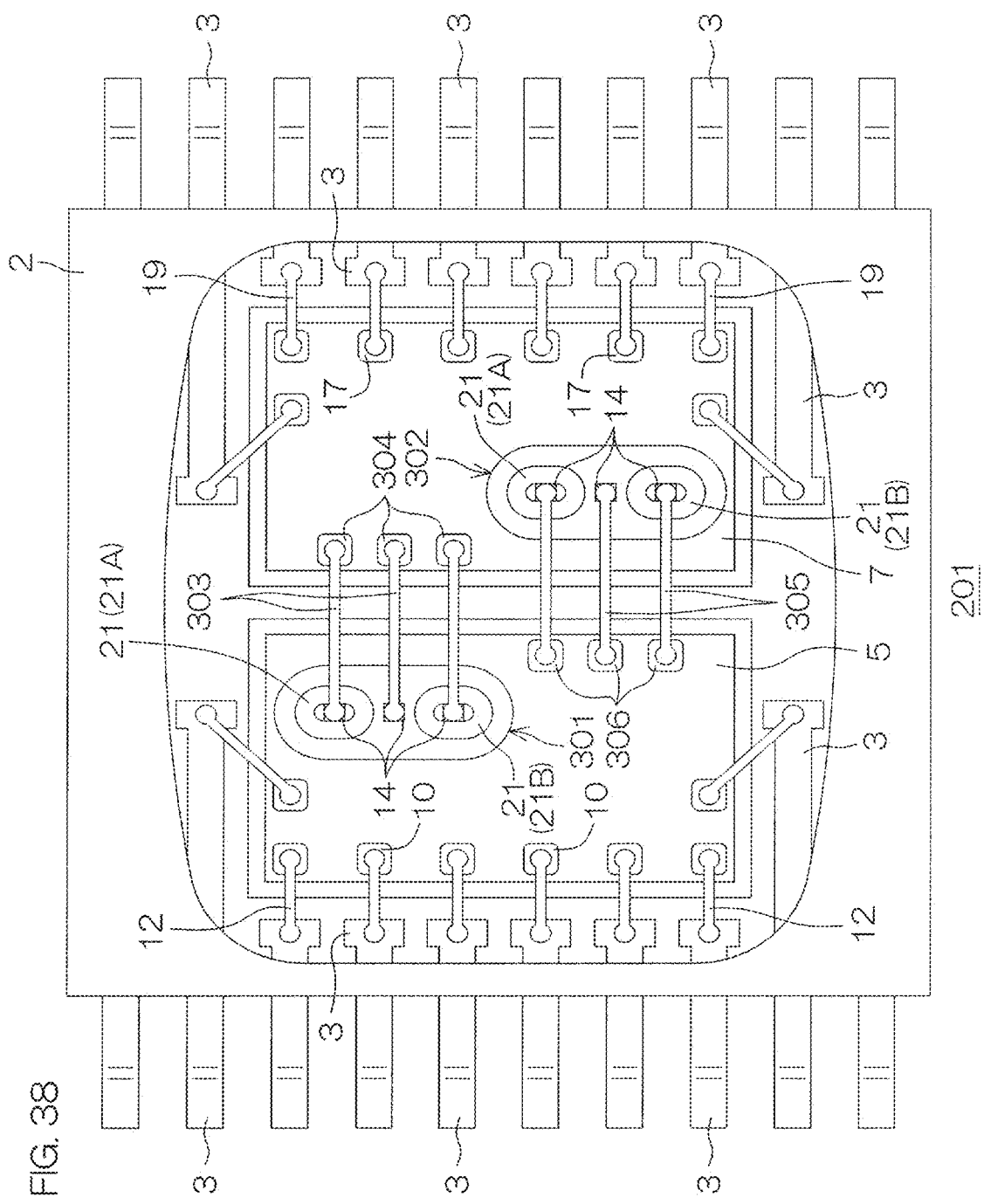
FIG. 38 is a plan view of an electronic component module according to a modification example.

FIG. 38 is a plan view of an electronic component module 201 according to a modification example. With the present modification example, structures corresponding to structures of the electronic component module 1 are provided with the same reference symbols and description thereof is omitted.

With the electronic component module 1 according to the first preferred embodiment, the controller chip 5, the electronic component 6, and the driver chip 7 are respectively formed as separate chips.

On the other hand, with the electronic component module 201 according to the present modification example, portions of functions of an electronic component 101 are incorporated in the controller chip 5 and the driver chip 7, respectively.

More specifically, a first transformer 301 of the electronic component 101 are incorporated in the controller chip 5 and a second transformer 302 of the electronic component 101 are incorporated in the driver chip 7. The controller chip and the driver chip 7 are thereby also formed respectively as electronic components.

Three high voltage pads 14 pertaining to the first transformer 301 of the controller chip 5 are respectively connected via high voltage wires 303 to three high voltage pads 304 provided at the driver chip 7. The first transformer 301 of the controller chip 5 is also electrically connected to an arbitrary low voltage lead 3 (an arbitrary low voltage pad 10) used as a ground terminal.

Three high voltage pads 14 pertaining to the second transformer 302 of the driver chip 7 are respectively connected via high voltage wires 305 to three high voltage pads 306 provided at the controller chip 5. The second transformer 302 of the driver chip 7 is also electrically connected to an arbitrary low voltage lead 3 (an arbitrary low voltage pad 17) used as the ground terminal.

When the first transformer 301 of the electronic component 101 is incorporated in the controller chip 5, the first transformer 301 is built in using a wiring material of the controller chip 5. Therefore, the lower coils 20, the upper coils 21, wiring members connecting the lower coils 20 and the upper coils 21, etc., included in the first transformer 301 become the same in material as the wiring material of the controller chip 5.

For example, if the wiring material of the controller chip 5 is copper, the lower coils 20, the upper coils 21, the wiring members connecting the lower coils 20 and the upper coils 21, etc., are formed of copper. If the wiring material of the electronic component 101 includes copper and aluminum, the lower coils 20, the upper coils 21, the wiring members connecting the lower coils 20 and the upper coils 21, etc., are formed of copper and/or aluminum.

The upper coils 21 may be formed of copper while the lower coils 20 are formed of aluminum. The upper coils 21 may be formed of aluminum while the lower coils 20 are formed of copper.

When the second transformer 302 of the electronic component 101 is incorporated in the driver chip 7, the second transformer 302 is built in using a wiring material of the driver chip 7. Therefore, the lower coils 20, the upper coils 21, wiring members connecting the lower coils 20 and the upper coils 21, etc., included in the second transformer 302 become the same in material as the wiring material of the driver chip 7.

For example, if the wiring material of the driver chip 7 is copper, the lower coils 20, the upper coils 21, the wiring members connecting the lower coils 20 and the upper coils 21, etc., are formed of copper. If the wiring material of the electronic component 101 includes copper and aluminum, the lower coils 20, the upper coils 21, the wiring members connecting the lower coils 20 and the upper coils 21, etc., are formed of copper and/or aluminum.

The upper coils 21 may be formed of copper while the lower coils 20 are formed of aluminum. The upper coils 21 may be formed of aluminum while the lower coils 20 are formed of copper.

With the present modification example, an example where the first transformer 301 according to the first preferred embodiment is incorporated in the controller chip 5. However, the first transformer 301 that includes the withstand voltage enhancement structure 102 according to the second to fourth preferred embodiments may be incorporated in the controller chip 5 instead.

If the first transformer 301 that includes the withstand voltage enhancement structure 102 according to the third preferred embodiment is incorporated in the controller chip 5, substantially an entirety of an device formation surface in which the controller IC is built may be covered by the resin film 77 in the controller chip 5.

With the present modification example, an example where the second transformer 302 according to the first preferred embodiment is incorporated in the driver chip 7. However, the first transformer 301 that includes the withstand voltage enhancement structure 102 according to the second to fourth preferred embodiments may be incorporated in the driver chip 7 instead.

If the second transformer 302 that includes the withstand voltage enhancement structure 102 according to the third preferred embodiment is incorporated in the driver chip 7, substantially an entirety of an device formation surface in which the driver IC is built may be covered by the resin film 77 in the driver chip 7.

Examples of features extracted from the present description and drawings are indicated below.

[Item 1] An electronic component including an insulating layer, a low voltage coil formed inside the insulating layer, a high voltage coil formed inside the insulating layer such as to face the low voltage coil in an up/down direction, high voltage pads including a first pad that is arranged such as to face a formation region of the high voltage coil in a thickness direction of the insulating layer and a second pad that is arranged such as to avoid the formation region of the high voltage coil in the thickness direction and being electrically connected, on the insulating layer, to the high voltage coil, a low voltage pad being connected, on the insulating layer, to the low voltage coil, and a resin film selectively formed on the insulating layer such as to cover a periphery of the first pad and a periphery of the second pad.

According to this arrangement, a withstand voltage between the high voltage pads and the low voltage pad can be improved because the peripheries of both the first pad and the second pad of the high voltage pads are covered by the resin film.

[Item 2] The electronic component according to Item 1, where, on the insulating layer, a first space and a second space are formed with the high voltage pads in between, the low voltage pad is selectively formed in the first space, and the resin film covers at least a periphery of the second pad at the first space side and the first pad.

[Item 3] The electronic component according to Item 2, where the resin film covers a periphery of the second pad at the second space side and the first pad.

[Item 4] The electronic component according to Item 3, where the resin film covers the periphery of the first pad and the periphery of the second pad across the entire peripheries.

[Item 5] The electronic component according to any one of Items 1 to 4, where the resin film covers the periphery of the first pad and the periphery of the second pad integrally.

[Item 6] The electronic component according to any one of Items 1 to 5, including a high voltage conducting layer formed on the insulating layer, a low voltage conducting layer formed on the insulating layer at an interval from the high voltage conducting layer, a front surface insulating film formed on the insulating layer such as to cover the high voltage conducting layer and the low voltage conducting layer integrally and having high voltage side pad openings exposing portions of the high voltage conducting layer as the high voltage pads and a low voltage side pad opening exposing a portion of the low voltage conducting layer as the low voltage pad, and where the resin film is formed on the front surface insulating film.

[Item 7] The electronic component according to Item 6, where the resin film overlaps with the high voltage conducting layer at a periphery of the high voltage pad openings to demarcate the first pad and overlaps with the high voltage conducting layer at a periphery of the high voltage pad openings to demarcate the second pad.

[Item 8] The electronic component according to any one of Items 1 to 7, where the formation region of the high voltage coil includes a coil inner region surrounded by the high voltage coil, the first pad faces the coil inner region in the thickness direction, and the second pad faces, in the thickness direction, a coil outer region outside the high voltage coil.

[Item 9] The electronic component according to any one of Items 1 to 8, where the resin film includes a polyimide.

[Item 10] The electronic component according to any one of Items 1 to 9, where the resin film has a thickness of not less than 3000 nm and not more than 5000 nm.

[Item 11] The electronic component according to any one of Items 1 to 10, where a lateral direction distance L1 between the high voltage pad and the low voltage pad is greater than a vertical direction distance L2 between the high voltage coil and the low voltage coil.

[Item 12] The electronic component according to Item 11, where the lateral direction distance L1 is not less than 100 μm and not more than 450 μm and the vertical direction distance L2 is not less than 12.0 μm and not more than 16.8 μm.

[Item 13] The electronic component according to any one of Items 1 to 12, further including a withstand voltage enhancement structure of conductive property formed inside the insulating layer and along the high voltage coil such as to protrude further outside than the low voltage coil in plan view.

[Item 14] The electronic component according to Item 13, where the withstand voltage enhancement structure includes a dummy pattern extending along the high voltage coil in a pattern that is discontinuous to a spiral pattern of the high voltage coil.

[Item 15] The electronic component according to Item 14, where the dummy pattern has a shape with ends.

[Item 16] The electronic component according to Item 14 or 15, where the high voltage coil includes an inner terminal end and an outer terminal end and the dummy pattern is fixed to be equipotential to the outer terminal end of the high voltage coil.

[Item 17] The electronic component according to Item 16, where the inner terminal end of the high voltage coil is positioned in a region at an inner side of the low voltage coil in plan view, the outer terminal end of the high voltage coil is positioned in a region outside the low voltage coil in plan view, and the dummy pattern is led out from the outer terminal end of the high voltage coil.

[Item 18] The electronic component according to any one of Items 1 to 12, further including a pad side withstand voltage enhancement structure of conductive property formed inside the insulating layer such as to be oriented along a peripheral edge of the second pad of the high voltage pads in plan view.

[Item 19] The electronic component according to Item 18, where the pad side withstand voltage enhancement structure includes a pad side dummy pattern extending along the peripheral edge of the second pad in a pattern discontinuous to the spiral pattern of the high voltage coil in plan view.

[Item 20] The electronic component according to Item 19, where the pad side withstand voltage enhancement structure includes a plurality of the pad side dummy patterns formed at intervals along a direction away from the second pad.

[Item 21] The electronic component according to Item 19, where a distance between the pad side dummy pattern most proximal to the second pad and the second pad is not more than a vertical direction distance between the high voltage coil and the low voltage coil.

[Item 22] The electronic component according to any one of Items 18 to 21, further including a coil side withstand voltage enhancement structure of conductive property formed inside the insulating layer and along the high voltage coil and protruding further outside than the low voltage coil in plan view.

[Item 23] The electronic component according to Item 22, where the coil side withstand voltage enhancement structure is fixed to be equipotential to the pad side withstand voltage enhancement structure.

[Item 24] The electronic component according to any one of Items 1 to 12, including a low voltage wiring formed inside the insulating layer at an interval from the high voltage coil in a direction along a front surface of the insulating layer, electrically connected to the low voltage coil, and forming, with the high voltage coil, an electric field having a first value not more than a dielectric breakdown strength of the insulating layer, an electric field enhancement structure interposed in a region inside the insulating layer between the high voltage coil and the low voltage wiring and forming, with the low voltage wiring, an electric field having a second value not more than the dielectric breakdown strength of the insulating layer and not less than the first value, and a second insulating layer formed on the insulating layer such as to cover the high voltage pads and the low voltage pad and having a dielectric breakdown strength not more than the dielectric breakdown strength of the insulating layer.

[Item 25] The electronic component according to Item 24, where the electric field enhancement structure includes a high voltage side dummy pattern of conductive property fixed to be equipotential to the high voltage coil and formed along the high voltage coil.

[Item 26] The electronic component according to Item 24 or 25, where the electric field enhancement structure includes a low voltage side dummy pattern of conductive property fixed to be equipotential to the low voltage wiring and formed along the low voltage wiring.

[Item 27] The electronic component according to any one of Items 24 to 26, where the dielectric breakdown strength of the insulating layer is not less than 5.0 MV/cm and the dielectric breakdown strength of the second insulating layer is not less than 1.0 MV/cm.

[Item 28] The electronic component according to any one of Items 24 to 27, where the second insulating layer is constituted of a resin layer.

[Item 29] The electronic component according to Item 28, where the resin layer includes a molded resin.

[Item 30] An electronic component module including the electronic component according to any one of Items 1 to 29 and a resin package sealing the electronic component.

[Item 31] The electronic component module according to Item 30, further including a low voltage device electrically connected to the low voltage coil of the electronic component and a high voltage device electrically connected to the high voltage coil of the electronic component, and where the resin package seals the electronic component, the low voltage device, and the high voltage device altogether.

The present application claims priority based on Japanese Patent Application No. 2017-199877 filed in the Japan Patent Office on Oct. 13, 2017 and the entire disclosure of this application is incorporated herein by reference.

While preferred embodiments of the present invention have been described in detail, these are merely specific examples used to clarify the technical contents of the present invention and the present invention should not be interpreted as being limited to these specific examples and the scope of the present invention is to be limited only by the appended claims.

DESCRIPTION OF SYMBOLS 1 electronic component module
2 resin pattern
5 controller chip
6 electronic component
7 driver chip
13 low voltage pad
14 high voltage pad
20 lower coil (low voltage conductor pattern)
21 upper coil (high voltage conductor pattern)
27 insulating layer laminated structure
28 insulating layer (first insulating layer)
32 inner region (of upper coil)
33 first pad
34 second pad
39 first region
40 second region
44 overlapping portion
45 overlapping portion
50 inter-coil region
75 protective film
76 passivation film
77 resin film
78 pad opening
79 pad opening
88 high voltage pad layer
89 low voltage pad layer
99 coil periphery region
101 electronic component
102 withstand voltage enhancement structure
103 first withstand voltage enhancement structure
104 second withstand voltage enhancement structure
108 first dummy conductor pattern
116 first coil side withstand voltage enhancement structure
117 second coil side withstand voltage enhancement structure
118 first pad side withstand voltage enhancement structure
119 second pad side withstand voltage enhancement structure
131 electronic component
141 electronic component
142 first spiral pattern
143 second spiral pattern
151 electronic component
152 second insulating layer
161 electronic component
162 low voltage side capacitor conductor film (low voltage conductor pattern)
163 high voltage side capacitor conductor film (high voltage conductor pattern)
164 first capacitance
165 second capacitance
171 electronic component
201 electronic component module

The invention claimed is:

1. An electronic component comprising:
an insulating layer;
a low voltage conductor pattern formed inside the insulating layer;
a high voltage conductor pattern formed inside the insulating layer such as to face the low voltage conductor pattern in an up/down direction;
a low voltage pad formed on the insulating layer and electrically connected to the low voltage conductor pattern;
a high voltage pad formed on the insulating layer at an interval from the low voltage pad in plan view and electrically connected to the high voltage conductor pattern; and
a conductor pattern formed inside the insulating layer and arranged along the low voltage pad between the low voltage pad and the high voltage pad in plan view.

2. The electronic component according to claim 1, wherein;
the low voltage conductor pattern includes a low voltage coil having a spiral shape,
the high voltage conductor pattern includes a high voltage coil having a spiral shape, and
a transformer is formed by the low voltage coil and the high voltage coil.

3. The electronic component according to claim 1, wherein the conductor pattern is arranged closer to the low voltage pad than the high voltage pad in plan view.

4. The electronic component according to claim 1, further comprising a resin film formed on the insulating layer along a peripheral edge of the high voltage pad in sectional view.

5. The electronic component according to claim 3, wherein the conductor pattern has a line shaped pattern extending along a first direction in plan view.

6. The electronic component according to claim 5, wherein the first direction intersects a second direction which is a direction between the low voltage pad to the high voltage pad in plan view.

7. The electronic component according to claim 5, wherein the conductor pattern includes a dummy conductor pattern that is discontinuous with respect to the high voltage conductor pattern.

8. The electronic component according to claim 7, wherein the dummy conductor pattern has a shape having ends.

9. The electronic component according to claim 4, further comprising:
a passivation film formed between the insulating layer and the resin film,
wherein the passivation film overlaps a part of the high voltage pad in the up/down direction.

10. The electronic component according to claim 9, further comprising:
a protective film formed between the insulating layer and the passivation film,
wherein the protective film overlaps a part of the high voltage pad in the up/down direction.

* * * * *